(12) United States Patent
Parham et al.

(10) Patent No.: US 8,710,284 B2
(45) Date of Patent: Apr. 29, 2014

(54) MATERIALS FOR ORGANIC ELECTROLUMINESCENT DEVICES CONTAINING SUBSTITUTED 10-BENZO[C]PHENANTHRENES

(75) Inventors: Amir Hossain Parham, Frankfurt (DE); Arne Buesing, Frankfurt (DE); Holger Heil, Frankfurt am Main (DE); Philipp Stoessel, Frankfurt (DE)

(73) Assignee: Merck Patent GmbH, Darmstadt (DE)

( * ) Notice: Subject to any disclaimer, the term of this patent is extended or adjusted under 35 U.S.C. 154(b) by 48 days.

(21) Appl. No.: 13/145,951

(22) PCT Filed: Dec. 22, 2009

(86) PCT No.: PCT/EP2009/009217
§ 371 (c)(1), (2), (4) Date: Jul. 22, 2011

(87) PCT Pub. No.: WO2010/083869
PCT Pub. Date: Jul. 29, 2010

(65) Prior Publication Data
US 2011/0288292 A1 Nov. 24, 2011

(30) Foreign Application Priority Data
Jan. 23, 2009 (DE) .................. 10 2009 005 746

(51) Int. Cl.
*C07C 13/465* (2006.01)
(52) U.S. Cl.
USPC ........................................................ 585/26
(58) Field of Classification Search
USPC ........................................................ 585/26
See application file for complete search history.

(56) References Cited

U.S. PATENT DOCUMENTS

| | | | |
|---|---|---|---|
| 4,539,507 | A | 9/1985 | VanSlyke et al. |
| 4,780,536 | A | 10/1988 | Czarnik et al. |
| 5,061,569 | A | 10/1991 | VanSlyke et al. |
| 5,151,629 | A | 9/1992 | VanSlyke et al. |
| 5,621,131 | A | 4/1997 | Kreuder et al. |
| 5,639,914 | A | 6/1997 | Tomiyama et al. |
| 5,837,166 | A | 11/1998 | Kawamura et al. |
| 5,840,217 | A | 11/1998 | Lupo et al. |
| 5,935,721 | A | 8/1999 | Shi et al. |
| 6,169,163 | B1 | 1/2001 | Woo et al. |
| 6,344,283 | B1 | 2/2002 | Inoue et al. |
| 6,458,909 | B1 | 10/2002 | Spreitzer et al. |
| 6,534,199 | B1 | 3/2003 | Hosokawa et al. |
| 6,653,438 | B1 | 11/2003 | Spreitzer et al. |
| 8,026,664 | B2 | 9/2011 | Saitoh et al. |
| 8,330,350 | B2 | 12/2012 | Nishimura et al. |
| 2002/0048688 | A1 | 4/2002 | Fukuoka et al. |
| 2003/0165715 | A1 | 9/2003 | Yoon et al. |
| 2004/0247937 | A1 | 12/2004 | Chen et al. |
| 2004/0260090 | A1 | 12/2004 | Treacher et al. |
| 2005/0040390 | A1 | 2/2005 | Pfeiffer et al. |
| 2005/0064233 | A1 | 3/2005 | Matsuura et al. |
| 2005/0121667 | A1 | 6/2005 | Kuehl et al. |
| 2005/0181232 | A1 | 8/2005 | Ricks et al. |

(Continued)

FOREIGN PATENT DOCUMENTS

| | | |
|---|---|---|
| CN | 1362464 | 8/2002 |
| CN | 102203975 A | 9/2011 |

(Continued)

OTHER PUBLICATIONS

Laali, et al. Journal of Organic Chemistry, 66(3), 2001, 780-788.*

(Continued)

*Primary Examiner* — Douglas M Willis
(74) *Attorney, Agent, or Firm* — Novak Druce Connolly Bove + Quigg LLP

(57) ABSTRACT

The present invention relates to substituted benzo[c]phenanthrene derivatives and to the production and to the use thereof in electronic devices, and to the electronic devices themselves. The present invention relates in particular to benzo[c]phenanthrene derivatives of, e.g., formula (I) or (XV)

formula (I)

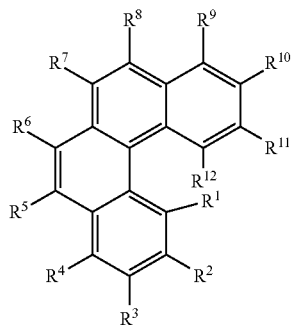

formula (XV)

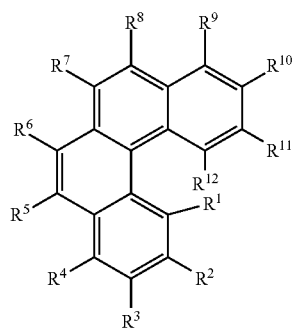

substituted with at least one aromatic unit or at least one diarylamino unit.

9 Claims, No Drawings

(56) References Cited

U.S. PATENT DOCUMENTS

| | | |
|---|---|---|
| 2005/0211958 A1 | 9/2005 | Conley et al. |
| 2005/0260442 A1 | 11/2005 | Yu et al. |
| 2006/0035109 A1 | 2/2006 | Arakane et al. |
| 2006/0058494 A1 | 3/2006 | Busing et al. |
| 2006/0063027 A1 | 3/2006 | Vestweber et al. |
| 2006/0134456 A1 | 6/2006 | Ikeda et al. |
| 2006/0175958 A1 | 8/2006 | Gerhard et al. |
| 2006/0202190 A1 | 9/2006 | Funahashi |
| 2006/0210830 A1 | 9/2006 | Funahashi et al. |
| 2006/0284140 A1 | 12/2006 | Breuning et al. |
| 2007/0060736 A1 | 3/2007 | Becker et al. |
| 2007/0154732 A1 | 7/2007 | Kitano et al. |
| 2007/0170419 A1 | 7/2007 | Gerhard et al. |
| 2007/0205714 A1 | 9/2007 | Busing et al. |
| 2007/0281182 A1 | 12/2007 | Schulte et al. |
| 2008/0125609 A1 | 5/2008 | Vestweber et al. |
| 2008/0145698 A1 | 6/2008 | Heil et al. |
| 2008/0220285 A1 | 9/2008 | Vestweber et al. |
| 2008/0272693 A1 | 11/2008 | Heil et al. |
| 2008/0303417 A1 | 12/2008 | Yabunouchi et al. |
| 2008/0303423 A1 | 12/2008 | Heil et al. |
| 2009/0005505 A1 | 1/2009 | Buesing et al. |
| 2009/0009067 A1 | 1/2009 | Nishimura et al. |
| 2009/0058289 A1 | 3/2009 | Stoessel et al. |
| 2009/0066225 A1 | 3/2009 | Kimura et al. |
| 2009/0072712 A1 | 3/2009 | Stoessel et al. |
| 2009/0134384 A1 | 5/2009 | Stoessel et al. |
| 2009/0159874 A1 | 6/2009 | Vestweber et al. |
| 2009/0184313 A1 | 7/2009 | Buesing et al. |
| 2009/0226759 A1 | 9/2009 | Heun et al. |
| 2009/0261717 A1 | 10/2009 | Buesing et al. |
| 2009/0321729 A1 | 12/2009 | Ido et al. |
| 2010/0102305 A1 | 4/2010 | Heun et al. |
| 2010/0127251 A1 | 5/2010 | Burn et al. |
| 2010/0141129 A1 | 6/2010 | Fukuoka et al. |
| 2010/0187505 A1 | 7/2010 | Stoessel et al. |
| 2010/0187517 A1 | 7/2010 | Nishimura et al. |
| 2010/0193773 A1 | 8/2010 | Yamamoto et al. |
| 2010/0227978 A1 | 9/2010 | Stoessel et al. |
| 2010/0288974 A1 | 11/2010 | Buesing et al. |
| 2010/0320452 A1 | 12/2010 | Kawamura |
| 2011/0034744 A1 | 2/2011 | Ikeda et al. |
| 2011/0049482 A1 | 3/2011 | Ikeda et al. |
| 2011/0068304 A1 | 3/2011 | Parham et al. |
| 2011/0248250 A1 | 10/2011 | D'Andrade et al. |

FOREIGN PATENT DOCUMENTS

| | | |
|---|---|---|
| DE | 102007024850 A1 | 12/2008 |
| EP | 650955 A1 | 5/1995 |
| EP | 0 676 461 A2 | 10/1995 |
| EP | 0681019 A2 | 11/1995 |
| EP | 0 707 020 A2 | 4/1996 |
| EP | 0 842 208 | 5/1998 |
| EP | 0891121 A1 | 1/1999 |
| EP | 0 894 107 | 2/1999 |
| EP | 1 028 136 A2 | 8/2000 |
| EP | 14768812 | 11/2004 |
| EP | 1596445 A1 | 11/2005 |
| EP | 1661888 A1 | 5/2006 |
| JP | 06/001973 | 1/1994 |
| JP | 2000/053957 | 2/2000 |
| JP | 2000/273056 | 10/2000 |
| JP | 2001/226331 | 8/2001 |
| JP | 2006151844 A | 6/2006 |
| JP | 2006/253445 | 9/2006 |
| WO | WO-92/18552 | 10/1992 |
| WO | WO-95/09147 A1 | 4/1995 |
| WO | WO-98/27136 A1 | 6/1998 |
| WO | WO-98/30071 A1 | 7/1998 |
| WO | WO-00/22026 A1 | 4/2000 |
| WO | WO-01/21729 A1 | 3/2001 |
| WO | WO-01/49806 A1 | 7/2001 |
| WO | WO-01/76323 A1 | 10/2001 |
| WO | WO-02/067343 A1 | 8/2002 |
| WO | WO-03/048225 A2 | 6/2003 |
| WO | WO-03/609562 A2 | 7/2003 |
| WO | WO-03/087023 A1 | 10/2003 |
| WO | WO-03/095445 A1 | 11/2003 |
| WO | WO-2004/013073 A1 | 2/2004 |
| WO | WO-2004/016575 A1 | 2/2004 |
| WO | WO-2004/018587 A1 | 3/2004 |
| WO | WO-2004/018588 A1 | 3/2004 |
| WO | WO-2004/028217 A1 | 4/2004 |
| WO | WO-2004/041901 A1 | 5/2004 |
| WO | WO-2004/378872 A2 | 5/2004 |
| WO | WO-2004/047499 A1 | 6/2004 |
| WO | WO-2004/589112 A2 | 7/2004 |
| WO | WO-2004/707722 A2 | 8/2004 |
| WO | WO-2004/080975 A1 | 9/2004 |
| WO | WO-2004/081017 A1 | 9/2004 |
| WO | WO-2004/092111 A1 | 10/2004 |
| WO | WO-2004/113412 A2 | 12/2004 |
| WO | WO-2004/113468 A1 | 12/2004 |
| WO | WO-2005/011013 A1 | 2/2005 |
| WO | WO-2005/014689 A2 | 2/2005 |
| WO | WO-2005/026144 A1 | 3/2005 |
| WO | WO-2005/040302 A1 | 5/2005 |
| WO | WO-2005/084081 A1 | 9/2005 |
| WO | WO-2005/084082 A1 | 9/2005 |
| WO | WO-2005/104264 A1 | 11/2005 |
| WO | WO-2006/000388 A1 | 1/2006 |
| WO | WO-2006/000389 A1 | 1/2006 |
| WO | WO-2006/003000 A1 | 1/2006 |
| WO | WO-2006/048268 A1 | 5/2006 |
| WO | WO-2006/058737 A1 | 6/2006 |
| WO | WO-2006/061181 A1 | 6/2006 |
| WO | WO-2006/073054 A1 | 7/2006 |
| WO | WO-2006/098080 A1 | 9/2006 |
| WO | WO-2006/100896 A1 | 9/2006 |
| WO | WO-2006/117052 A1 | 11/2006 |
| WO | WO-2006/122630 A1 | 11/2006 |
| WO | WO-2007/006383 A2 | 1/2007 |
| WO | WO-2007/017066 A1 | 2/2007 |
| WO | WO-2007/065549 A1 | 6/2007 |
| WO | WO-2007/065678 A1 | 6/2007 |
| WO | WO-2007/068325 A1 | 6/2007 |
| WO | WO-2007115610 A1 | 10/2007 |
| WO | WO-2007/123256 A1 | 11/2007 |
| WO | WO-2007/140847 A1 | 12/2007 |
| WO | WO-2008/006449 A1 | 1/2008 |
| WO | WO-2008/145239 A2 | 12/2008 |
| WO | WO-2008145239 A2 | 12/2008 |
| WO | WO-2009/008216 A1 | 1/2009 |
| WO | WO-2009/008344 A1 | 1/2009 |
| WO | WO-2009/069566 A1 | 6/2009 |
| WO | WO-2009/083421 A1 | 7/2009 |

OTHER PUBLICATIONS

Peng et al., "Interconversions of Aryl Radicals by 1,4-Shifts of Hydrogen Atoms. A Synthesis of Benzo[a]corannulene", *J. Am. Chem. Soc.*, vol. 127, pp. 16518-16521 (2005).

* cited by examiner

MATERIALS FOR ORGANIC ELECTROLUMINESCENT DEVICES CONTAINING SUBSTITUTED 10-BENZO[C]PHENANTHRENES

RELATED APPLICATIONS

This application is a national stage application (under 35 U.S.C. §371) of PCT/EP2009/009217, filed Dec. 22, 2009, which claims the benefit of German Application No. 10 2009 005 746.3, filed Jan. 23, 2009.

The present invention relates to organic semiconductors and to the preparation and use thereof in organic electronic devices.

BACKGROUND OF THE INVENTION

Organic semiconductors are being developed for a number of electronic applications of different types. The structure of organic electroluminescent devices (OLEDs), in which these organic semiconductors are employed as functional materials, is described, for example, in U.S. Pat. Nos. 4,539,507, 5,151,629, EP 0676461 and WO 98/27136. However, further improvements are still desirable for use of these devices for high-quality and long-lived displays. Thus, in particular, the lifetime and efficiency of blue-emitting organic electroluminescent devices currently still represent a problem, for which there is still a need for improvement. It is furthermore necessary for the compounds to have high thermal stability and a high glass transition temperature and to be sublimable without decomposition. A high glass transition temperature is essential for achieving long lifetimes, in particular for applications at elevated temperature.

For fluorescent OLEDs, use is made in accordance with the prior art of, in particular, condensed aromatic compounds, in particular anthracene derivatives, as host materials, especially for blue-emitting electroluminescent devices, for example 9,10-bis(2-naphthyl)anthracene (U.S. Pat. No. 5,935,721). WO 03/095445 and CN 1362464 disclose 9,10-bis(1-naphthyl)anthracene derivatives for use in OLEDs. Further anthracene derivatives are disclosed in WO 01/076323, WO 01/021729, WO 04/013073, WO 04/018588, WO 03/087023 or WO 04/018587. Host materials based on aryl-substituted pyrenes and chrysenes are disclosed in WO 04/016575. Host materials based on benzanthracene derivatives are disclosed in WO 08/145239. For high-quality applications, it is desirable to have improved host materials available.

Prior art which can be mentioned in the case of blue-emitting compounds is the use of arylvinylamines (for example WO 04/013073, WO 04/016575, WO 04/018587). However, these compounds are often unstable under thermal load and cannot be evaporated without decomposition, which requires high technical complexity for OLED production and thus represents an industrial disadvantage. For high-quality applications, it is therefore desirable to have improved emitters available, particularly with respect to device and sublimation stability and emission colour.

Thus, there continues to be a demand for improved materials, in particular host materials for fluorescent emitters, especially for blue- and green-fluorescent emitters, and fluorescent materials which are thermally stable, which result in good efficiencies and at the same time in long lifetimes in organic electronic devices, which result in reproducible results during production and operation of the device and which are readily accessible synthetically. Further improvements are also necessary in the case of hole- and electron-transport materials.

BRIEF SUMMARY OF THE INVENTION

Accordingly, it is an object according to the invention to provide compounds which are particularly suitable for use in organic electroluminescent devices. In particular, it was an object to provide compounds with which an increase in the efficiency and especially the lifetime of the organic electronic device, in particular of a blue-fluorescent device, is possible compared with materials in accordance with the prior art. In addition, it was a further object of the present invention to provide compounds which have high thermal stability.

Benzo[c]phenanthrene derivatives which are substituted by aromatic substituents have already occasionally been described in the literature (for example L. Peng et al., *Journal of the American Chemical Society* 2005, 127(47), 16518-16521, etc.). However, only the synthesis and reactivity of these compounds have been investigated. The use of these compounds in electronic devices has not been proposed.

DETAILED DESCRIPTION OF THE INVENTION

For clarity, the structure and numbering of benzo[c]phenanthrene are shown below:

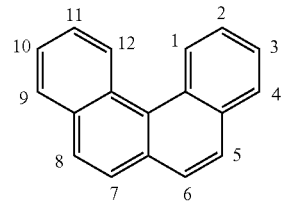 [SMILES: c1ccc2c(c1)ccc1ccc3ccccc3c12]

The object according to the invention is achieved by the provision of the compound of the following formula (I):

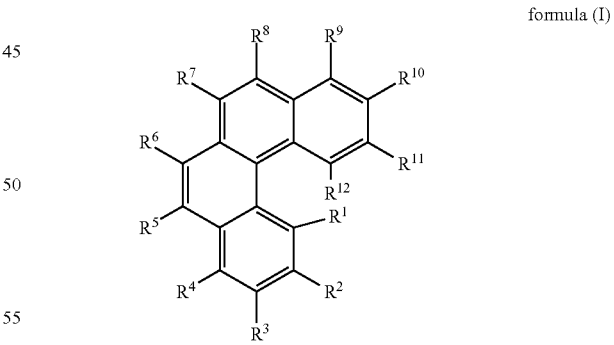

formula (I)

where the symbols used have the following meanings:
$R^2$ to $R^{11}$ are selected, independently of one another, from the group consisting of Ar, $N(Ar)_2$, H, D, F, Cl, Br, I, CHO, $N(R^{13})_2$, $C(=O)Ar$, $P(=O)(Ar)_2$, $S(=O)Ar$, $S(=O)_2Ar$, $CR^{13}=CR^{13}Ar$, CN, $NO_2$, $Si(R^{13})_3$, $B(OR^{13})_2$, $OSO_2R^{13}$, straight-chain alkyl, alkenyl, alkoxy and thioalkoxy groups having 1 to 40 C atoms and branched, mono- or polycyclic alkyl, alkenyl, alkoxy and thioalkoxy groups having 3 to 40 C atoms, each of which may be substituted by one or more radicals $R^{13}$, where one or more non-adjacent $CH_2$ groups may be replaced by $R^{13}C=CR^{13}$, $C\equiv C$, $Si(R^{13})_2$, $Ge(R^{13})_2$, $Sn(R^{13})_2$, $C=O$, $C=S$, $C=Se$, $C=NR^{13}$, $P(=O)(R^{13})$, $SO$, $SO_2$, $NR^{13}$, O, S or $CONR^{13}$ and where one or more H atoms may be replaced by D, F, Cl, Br, I, CN or $NO_2$, and aromatic or heteroaromatic ring systems having 5 to 40 aromatic ring atoms, which may in each case be substituted by one or more radicals $R^{13}$, and aryloxy or heteroaryloxy groups having 5 to 40 aromatic ring atoms, which may be substituted by one or more radicals $R^{13}$, and a combination of these systems, where two or more adjacent substituents $R^2$ to $R^{11}$ may also form a mono- or polycyclic, aliphatic or aromatic ring system with one another;

with the proviso that at least one radical selected from the radicals $R^2$ to $R^{11}$ represents Ar, $N(Ar)_2$, $P(Ar)_2$, $P(=O)Ar_2$ or $C(=O)Ar$;

Ar is on each occurrence, identically or differently, an aromatic or heteroaromatic ring system having 5 to 40 aromatic ring atoms, which may be substituted by one or more radical(s) $R^{13}$; where, in the case where two Ar are bonded to the same N or P atom, the two Ar may be linked to one another by a single covalent bond or a divalent group selected from the group consisting of $BR^{13}$, $C(R^{13})_2$, $Si(R^{13})_2$, $C=O$, $C=NR^{13}$, $C=C(R^{13})_2$, O, S, $S=O$, $SO_2$, $NR^{13}$, $PR^{13}$ and $P(=O)R^{13}$;

with the proviso that Ar, if it is bonded directly to the aromatic skeleton of the formula (I), is different from triarylamine;

$R^1$ and $R^{12}$ are H or D atoms or together form a divalent group selected from the group consisting of $BR^{13}$, $O(R^{13})_2$, $Si(R^{13})_2$, $C=O$, $C=NR^{13}$, $C=O(R^{13})_2$, O, S, $S=O$, $SO_2$, $NR^{13}$, $PR^{13}$ and $P(=O)R^{13}$;

$R^{13}$ is identical or different on each occurrence and is selected from the group consisting of H, D, F, Cl, Br, I, CHO, $N(R^{14})_2$), CN, $NO_2$, $Si(R^{14})_3$, $B(OR^{14})_2$, $OSO_2R^{14}$, straight-chain alkyl, alkenyl, alkoxy and thioalkoxy groups having 1 to 40 C atoms and branched, mono- or polycyclic alkyl, alkenyl, alkoxy and thioalkoxy groups having 3 to 40 C atoms, each of which may be substituted by one or more radicals $R^{14}$, where one or more non-adjacent $CH_2$ groups may be replaced by $R^{14}C=CR^{14}$, $C\equiv C$, $Si(R^{14})_2$, $Ge(R^{14})_2$, $Sn(R^{14})_2$, $C=O$, $C=S$, $C=Se$, $C=NR^{14}$, $P(=O)(R^{14})$, $SO$, $SO_2$, $NR^{14}$, O, S or $CONR^{14}$ and where one or more H atoms may be replaced by D, F, Cl, Br, I, CN or $NO_2$, and aromatic or heteroaromatic ring systems having 5 to 40 aromatic ring atoms, which may in each case be substituted by one or more radicals $R^{14}$, and aryloxy or heteroaryloxy groups having 5 to 40 aromatic ring atoms, which may be substituted by one or more radicals $R^{14}$, and a combination of these systems, where two or more adjacent substituents $R^{13}$ may also form a mono- or polycyclic, aliphatic or aromatic ring system with one another;

$R^{14}$ is on each occurrence identical or different and is selected from the group consisting of H and an aliphatic hydrocarbon radical having 1 to 20 carbon atoms, where one or more H atoms of the aliphatic hydrocarbon radical may be replaced by F; where, in the case where two or more substituents $R^{14}$ are adjacent, these may also form a mono- or polycyclic aliphatic ring system;

with the proviso that the following compounds are excepted from the compounds of the formula (I):

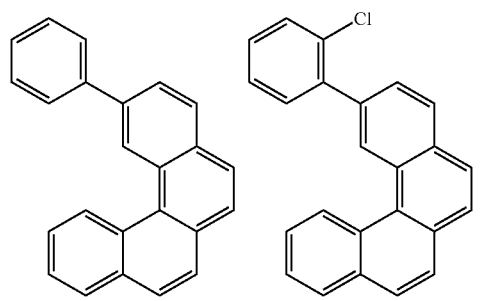

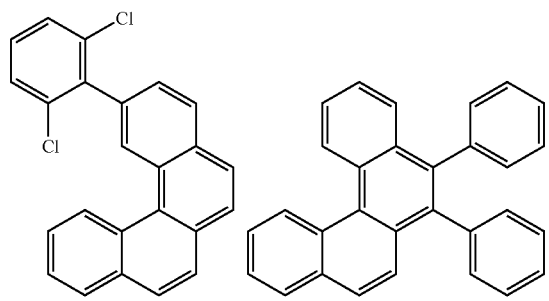

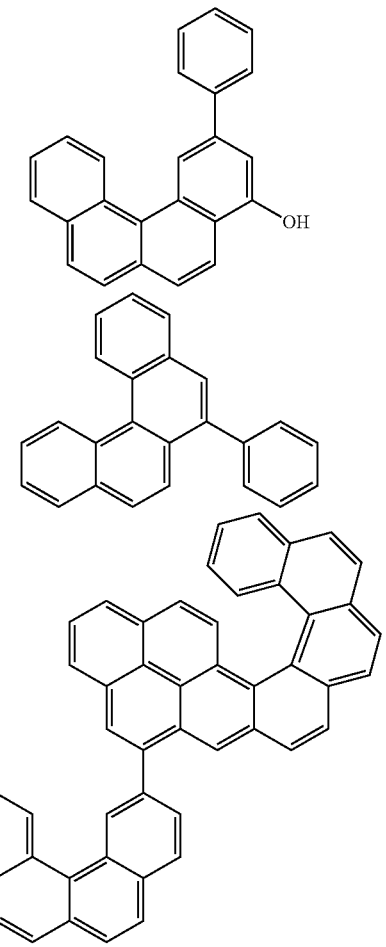

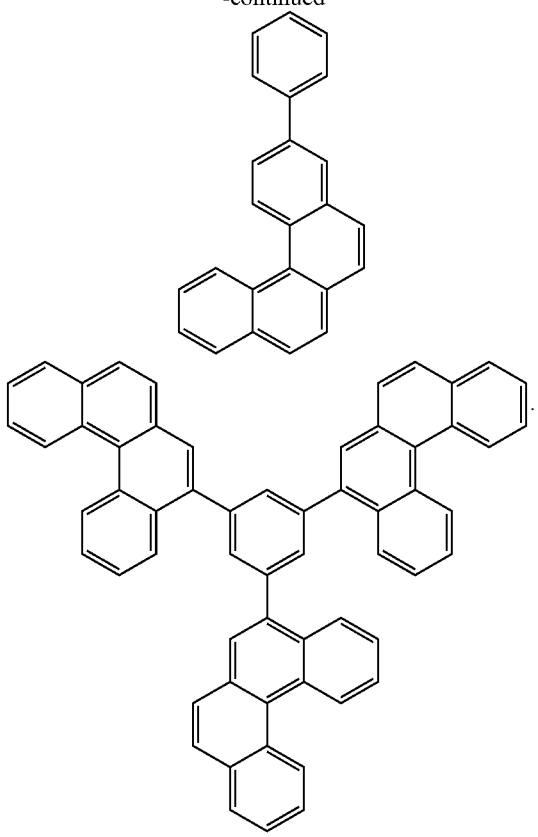

The compounds of the formula (I) preferably have a glass transition temperature $T_g$ of greater than 70° C., particularly preferably greater than 100° C., very particularly preferably greater than 130° C.

The term "aliphatic hydrocarbon radical having 1 to 20 carbon atoms or 1 to 9 carbon atoms" in this invention is taken to mean a saturated or unsaturated, non-aromatic hydrocarbon radical, which may be linear, branched or cyclic. One or more carbon atoms may be replaced by O, N or S. In addition, one or more hydrogen atoms may be replaced by fluorine.

For the purposes of the present invention, a $C_1$- to $C_{40}$-alkyl group or $C_3$- to $C_{40}$-alkyl group, in which, in addition, individual H atoms or $CH_2$ groups may be substituted by the above-mentioned groups, is taken to mean a linear, branched or cyclic alkyl group having 1 to 40 carbon atoms or 3 to 40 carbon atoms respectively. Examples of such groups include the following: methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl and 2,2,2-trifluoroethyl. For the purposes of this invention, an alkenyl group is taken to mean, for example, ethenyl, propenyl, butenyl, pentenyl, cyclopentenyl, hexenyl, cyclohexenyl, heptenyl, cycloheptenyl, octenyl or cyclooctenyl. For the purposes of this invention, an alkynyl group is taken to mean, for example, ethynyl, propynyl, butynyl, pentynyl, hexynyl, heptynyl or octynyl. The alkyl groups methyl, ethyl, i-propyl and tert-butyl are particularly preferred here.

A $C_1$- to $C_{40}$-alkoxy group or $C_3$- to $C_{40}$-alkoxy group is taken to mean a linear, branched or cyclic alkoxy group having 1 to 40 carbon atoms or 3 to 40 carbon atoms respectively. Examples of such compounds include methoxy, trifluoromethoxy, ethoxy, n-propoxy, i-propoxy, n-butoxy, butoxy, s-butoxy, t-butoxy or 2-methylbutoxy, where methoxy, ethoxy, i-propoxy and i-butoxy are preferred.

A $C_1$- to $C_{40}$-thioalkoxy group or $C_3$- to $C_{40}$-thioalkoxy group is taken to mean a linear, branched or cyclic thioalkoxy group having 1 to 40 carbon atoms or 3 to 40 carbon atoms respectively. Examples of such compounds include thiomethoxy, trifluorothiomethoxy, thioethoxy, n-thiopropoxy, i-thiopropoxy, n-thiobutoxy, i-thiobutoxy, s-thiobutoxy, t-thiobutoxy or 2-methyl-thiobutoxy, where thiomethoxy, thioethoxy, i-thiopropoxy and i-thiobutoxy are preferred.

A "$C_{6-20}$-aryl group" is taken to mean an aromatic group having 6 to 20 aromatic carbon atoms. Correspondingly, a "$C_{6-10}$-aryl group" is taken to mean an aromatic group having 6 to 10 aromatic carbon atoms. These aromatic compounds can be monocyclic or polycyclic, i.e. they can have one ring (for example phenyl) or two or more rings, which may also be condensed (for example naphthyl) or covalently linked (for example biphenyl), or contain a combination of condensed and linked rings. Preference is given to fully conjugated aromatic compounds. Preferred aromatic compounds are, for example, phenyl, biphenyl, triphenyl, [1,1':3',1"]terphenyl-2'-yl, naphthyl, anthracene, binaphthyl, phenanthrene, dihydrophenanthrene, pyrene, dihydropyrene, chrysene, perylene, tetracene, pentacene, benzopyrene, fluorene, indene, indenofluorene, benzanthracene and spirobifluorene.

For the purposes of the present invention, the term "5- to 25-membered heteroaryl group" is taken to mean an aromatic ring system having 5 to 25 atoms, where one or more of these atoms is a heteroatom. Correspondingly, a "5- to 14-membered heteroaryl group" is taken to mean an aromatic ring system having 5 to 14 atoms. The heteroaryl groups can be monocyclic or polycyclic, i.e. they can have one ring or two or more rings, which may also be condensed or covalently linked (for example pyridyl-phenyl), or contain a combination of condensed and linked rings. Fully conjugated heteroaryl groups are preferred.

For the purposes of this invention, the term "aromatic or heteroaromatic ring system having 5 to 40 or 5 to 32 aromatic ring atoms" includes aromatic ring systems having 6 to 40 or 6 to 32 aromatic C atoms respectively and heteroaromatic ring systems having 1 to 39 or 1 to 31 C atoms respectively with at least one heteroatom in the ring system. For the heteroaromatic ring systems, the proviso applies that the sum of C atoms and heteroatoms in a ring is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which a plurality of aryl or heteroaryl groups may also be interrupted by a short non-aromatic unit (preferably less than 10% of the atoms other than H), such as, for example, an $sp^3$-hybridised C, N or O atom. Thus, for example, systems such as 9,9'-spirobifluorene, 9,9-diarylfluorene, triarylamine, diaryl ether, stilbene, benzophenone, etc., are also intended to be taken to be aromatic ring systems for the purposes of this invention. However, the aromatic ring system is preferably different from triarylamine. An aromatic or heteroaromatic ring system is likewise taken to mean systems in which a plurality of aryl or heteroaryl groups are linked to one another by single bonds, for example biphenyl, terphenyl or bipyridine.

The aromatic or heteroaromatic ring system having 5 to 40 aromatic ring atoms or 5 to 32 aromatic ring atoms may be substituted by one or more radicals $R^{13}$ or $R^{14}$ in any desired positions. The link to the benzo[c]phenanthrene can be in any desired position on the aromatic or heteroaromatic ring system. Examples of such compounds include groups which are derived from benzene, naphthalene, anthracene, phenanthrene, pyrene, chrysene, perylene, fluoranthene, naphthacene, pentacene, benzanthracene, dibenzanthracene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, iso-truxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, iso-quinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, where phenyl, naphthyl, anthracene, phenanthrene, 1,3,5-triazine, benzimidazole, phenothiazine, biphenyl, fluorene, carbazole and spirobifluorene are particularly preferred.

Preferred substituents may also be, for example, solubility-promoting groups, such as alkyl or alkoxy, if the compound is processed from solution or electron-withdrawing groups, such as fluorine, nitro or nitrile, or substituents for increasing the glass transition temperature (Tg), in particular bulky groups, such as, for example, t-butyl or optionally substituted aryl groups.

In a further embodiment according to the invention, the compound of the formula (I) is preferably a compound in which at least one representative from $R^2$ to $R^{11}$ is selected, independently of one another, from the group consisting of Ar and $N(Ar)_2$.

The groups $R^5$ and $R^8$ preferably do not represent a derivative of anthracene or an aromatic or heteroaromatic ring system which includes anthracene.

The radicals $R^2$ to $R^{11}$ particularly preferably do not represent a derivative of anthracene or an aromatic or heteroaromatic ring system which includes anthracene.

Ar particularly preferably does not represent a derivative of anthracene or an aromatic or heteroaromatic ring system which includes anthracene.

In a still further embodiment of the present invention, the compound of the formula (I) is preferably a compound in which at least one representative from $R^2$ to $R^{11}$ is selected, independently of one another, from the group consisting of Ar and $N(Ar)_2$ and the other representatives from $R^2$ to $R^{11}$ are selected, independently of one another, from the group consisting of H, D and a straight-chain $C_{1-9}$-alkyl group, particularly preferably H, D, methyl or tert-butyl.

The present invention also encompasses an embodiment in which at least one representative from $R^2$, $R^5$, $R^8$ and $R^{11}$ of the compound of the formula (I) is selected from the group consisting of Ar and $N(Ar)_2$. The present invention thus also encompasses embodiments in which the compound of the formula (I) is preferably a compound of the following formulae (II), (III), (IV), (V) and (VI):

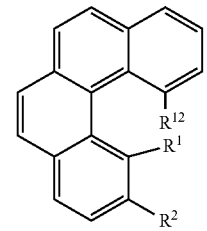

formula (II)

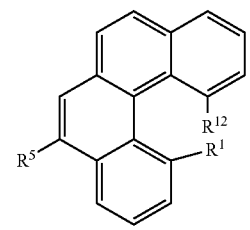

formula (III)

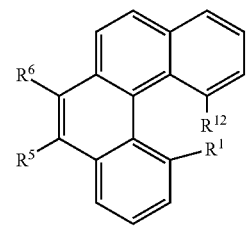

formula (IV)

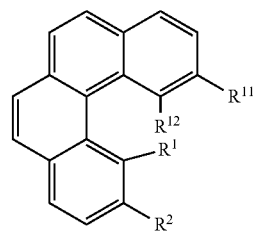

formula (V)

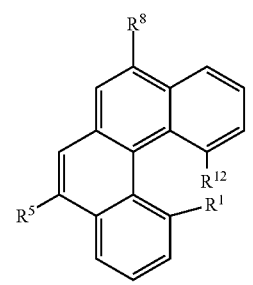

formula (VI)

where the symbols have the following meanings:
$R^1$ and $R^{12}$ have the same meanings as in the embodiments mentioned above;
$R^2$, $R^5$, $R^8$ and $R^{11}$ are selected, independently of one another, from the group consisting of Ar and $N(Ar)_2$;
$R^6$ is a straight-chain alkyl group having 1 to 10 C atoms or a branched or cyclic alkyl group having 3 to 10 C atoms, preferably methyl, ethyl, n-propyl, isopropyl and tert-butyl, in particular methyl.

In a further embodiment of the present invention, Ar in the compound of the formula (I) is preferably on each occurrence, identically or differently, an aromatic or heteroaromatic ring system having 5 to 32 aromatic ring atoms, which may be substituted by one or more radical(s) $R^{13}$; where, in the case where two Ar are bonded to the same N atom, the two Ar may be linked to one another by a single covalent bond or a divalent group selected from the group consisting of $C(R^{13})_2$, C=O, O, S, $NR^{13}$ and $PR^{13}$.

A further embodiment of the present invention is characterised in that Ar in the compounds of the formulae (I), (II), (III), (IV), (V) and (VI) includes one or more units selected from the group consisting of phenyl, naphthyl, anthracene, phenanthrene, 1,3,5-triazine, benzimidazole, phenothiazine, biphenyl, fluorene, carbazole and spirobifluorene, and combinations of these systems, where these groups may each be substituted by one or more radicals $R^{13}$.

Particularly preferred groups Ar are selected from the groups of the following formulae (VII) to (XII) and particularly preferred groups $N(Ar)_2$ are selected from the groups of the following formulae (XIII) and (XIV),

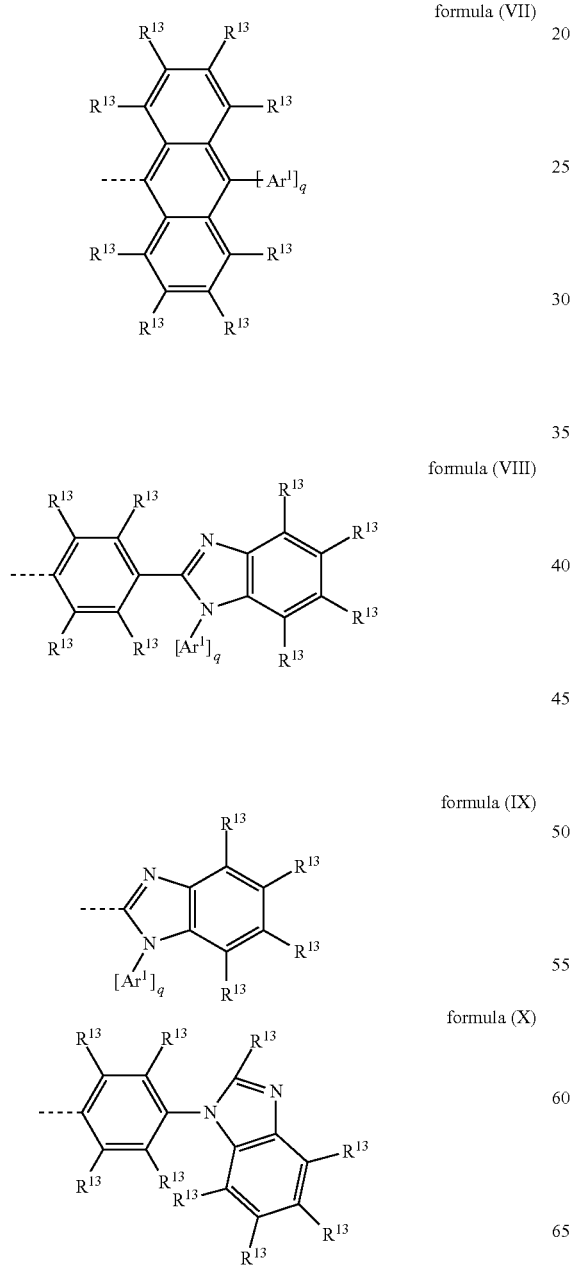

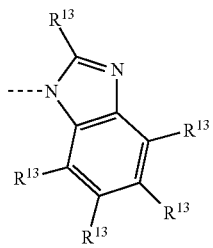

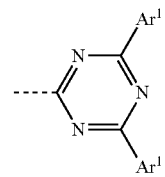

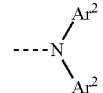

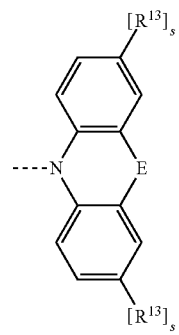

where the dashed bond indicates the link to the benzo[c] phenanthrene unit and where $R^{13}$ has the meaning indicated above and furthermore:

$Ar^1$ is an aryl or heteroaryl group having 5 to 16 aromatic ring atoms, preferably phenyl, 1-naphthyl, 2-naphthyl, 9-anthryl, chrysenyl, 1-pyrenyl, 2-pyrenyl, 2-phenanthrenyl, 3-phenanthrenyl, 9-phenanthrenyl, 2-benzimidazolyl, benzanthracenyl or fluoranthenyl, each of which may be substituted by one or more radicals $R^{13}$;

$Ar^2$ is, identically or differently on each occurrence, an aryl or heteroaryl group having 5 to 20 aromatic ring atoms or a triarylamine group having 15 to 30 aromatic ring atoms, each of which may be substituted by one or more radicals $R^{13}$, preferably an aryl or heteroaryl group having 6 to 14 aromatic ring atoms or a triarylamine group having 18 to 30 aromatic ring atoms, preferably having 18 to 22 aromatic ring atoms, each of which may be substituted by one or more radicals $R^{13}$;

E stands for a single bond, O, S, $N(R^{13})$ or $C(R^{13})_2$, where the two radicals $R^{13}$ may also form a Spiro system through ring formation;

q is 1, 2 or 3;

s is on each occurrence, identically or differently, 0 or 1.

Ar is very particularly preferably selected from the groups shown in the formulae (VIII) to (XII).

The present invention also encompasses a preferred embodiment in which $R^{13}$ of the compound of the formula (I) is identical or different on each occurrence and is preferably selected from the group consisting of H, an aliphatic hydrocarbon radical having 1 to 9 carbon atoms, a $C_{6-10}$-aryl group and a 5- to 14-membered heteroaryl group, where one or more H atoms of the aliphatic hydrocarbon radical, the aryl group and the heteroaryl group may be replaced by F; where, in the case where two or more substituents $R^{13}$ are adjacent, these may also form a mono- or polycyclic aliphatic or aromatic ring system.

In a further embodiment of the present invention, $R^{14}$ in the compound of the formula (I) is identical or different on each occurrence and is preferably selected from the group consisting of H and an aliphatic hydrocarbon radical having 1 to 9 carbon atoms, where one or more H atoms of the aliphatic hydrocarbon radical may be replaced by F, where, in the case where two or more substituents $R^{14}$ are adjacent, these may also form a mono- or polycyclic aliphatic ring system.

In a still further embodiment of the present invention, the compound of the formula (I) is preferably a compound in which $R^1$ and $R^{12}$ are H atoms or together form a divalent group selected from the group consisting of $C(R^{13})_2$, $C=O$ and $C(=C(R^{13})_2)$.

It is a subject-matter of the present invention that the features of the embodiments mentioned can, if possible, be combined with one another as desired.

Examples of preferred compounds of the formula (I) are structures (1) to (144) depicted below.

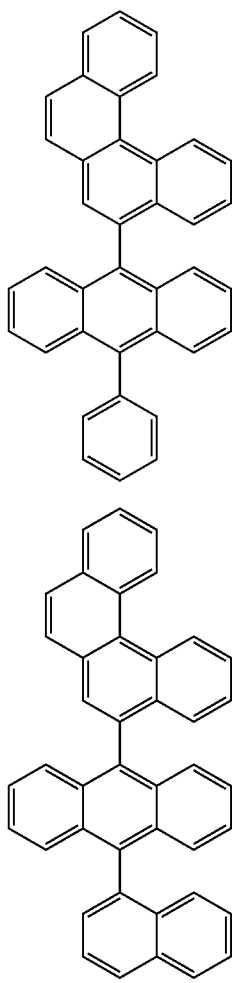

(1)

(2)

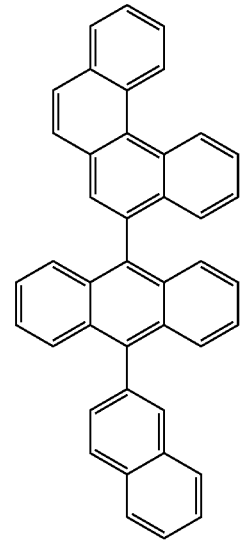

(3)

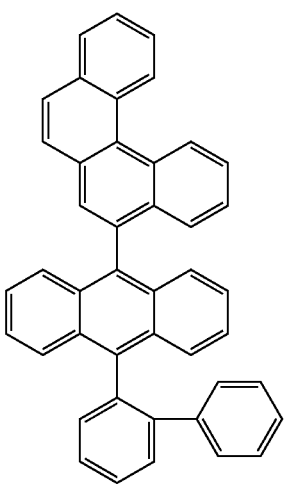

(4)

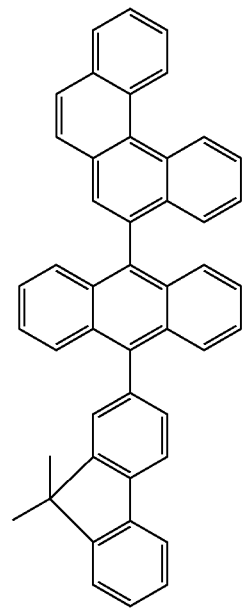

(5)

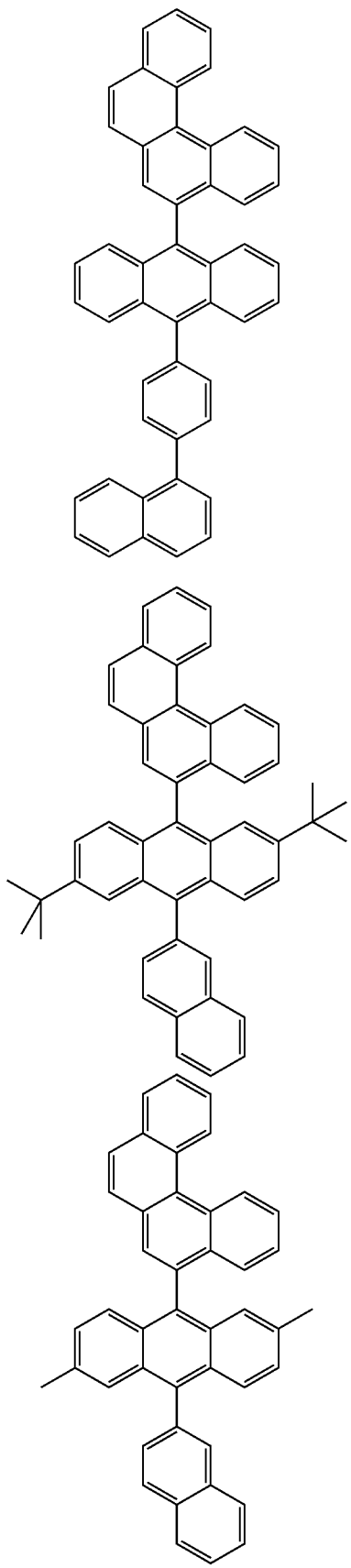
(6)
(7)
(8)
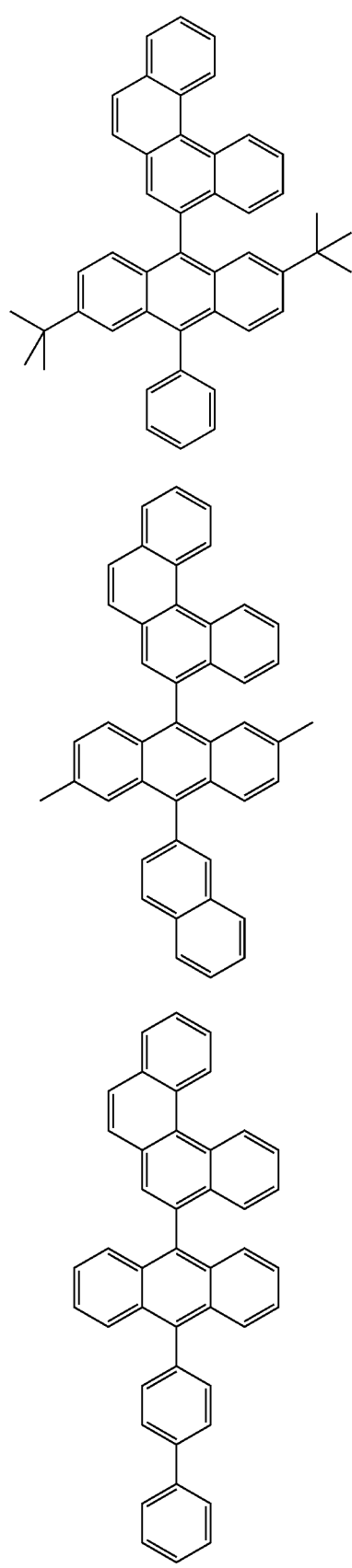
(9)
(10)
(11)

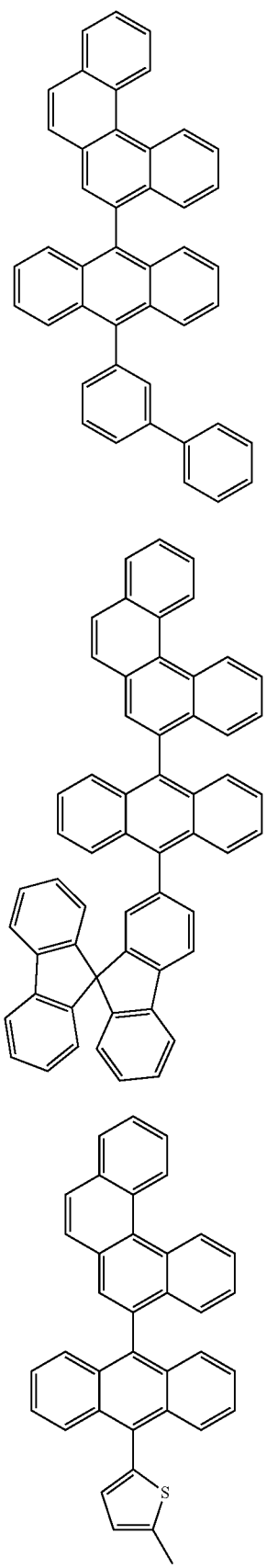
(12)
(13)
(14)
(15)
(16)

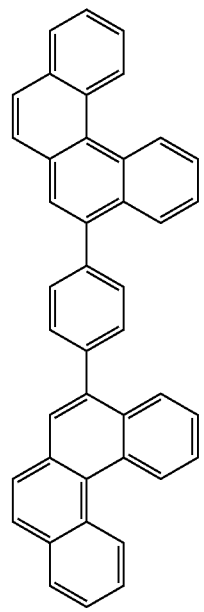
(17)
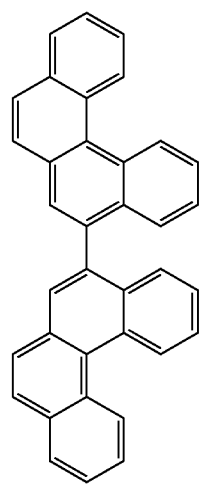
(18)
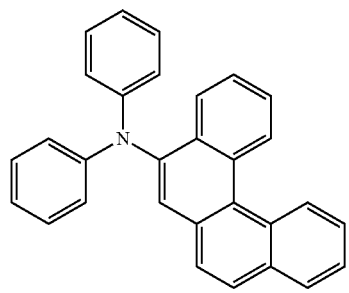
(19)
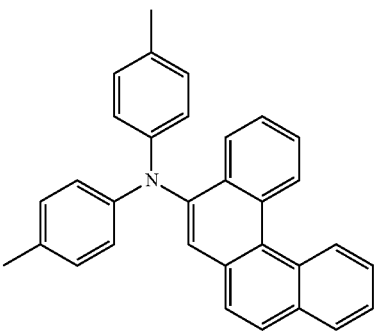
(20)
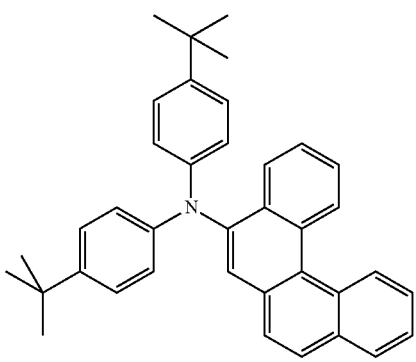
(21)
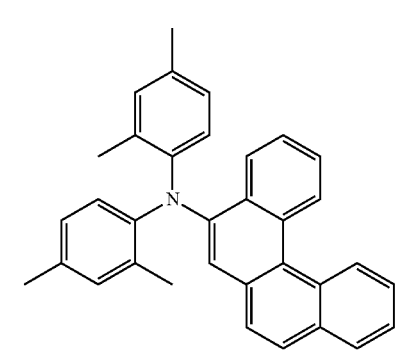
(22)
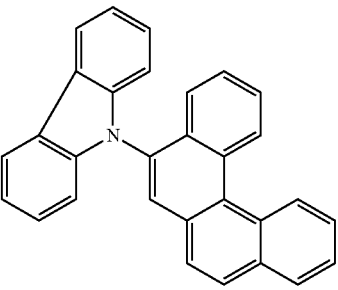
(23)

(24)
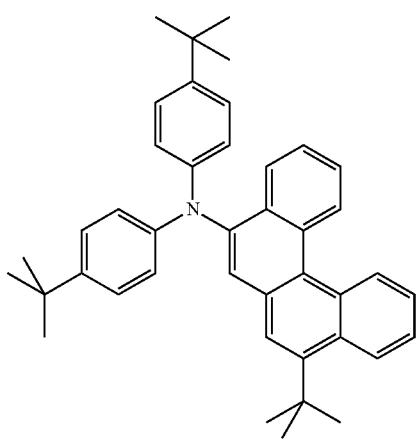
(25)
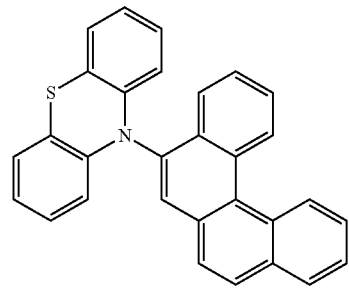
(26)
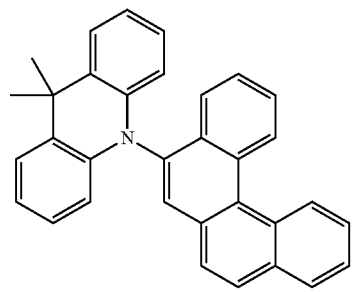
(27)
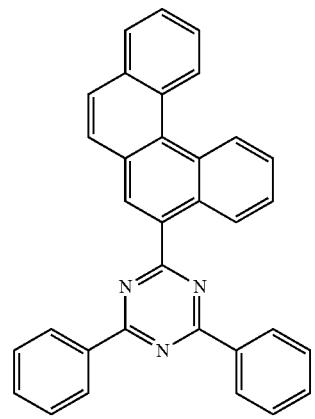
(28)
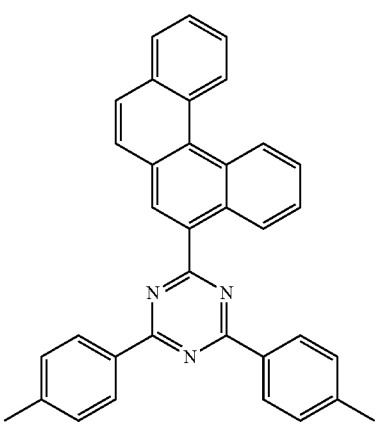
(29)
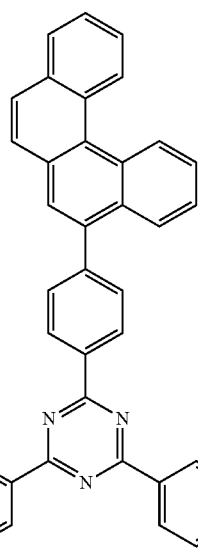
(30)
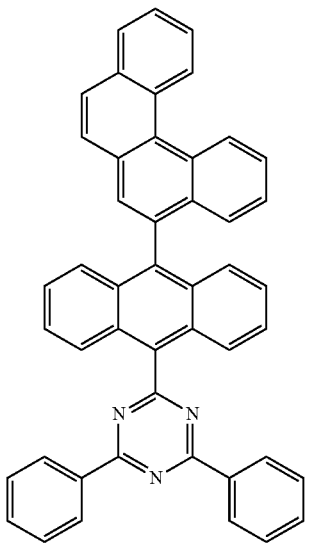

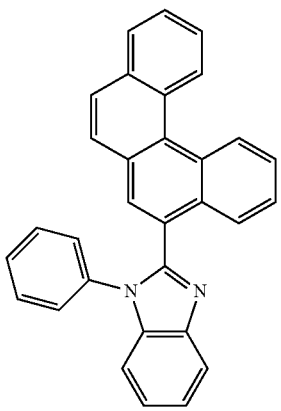
(31)
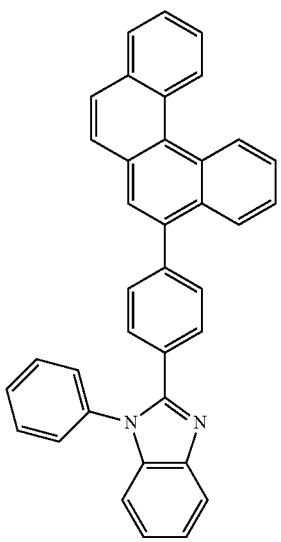
(32)
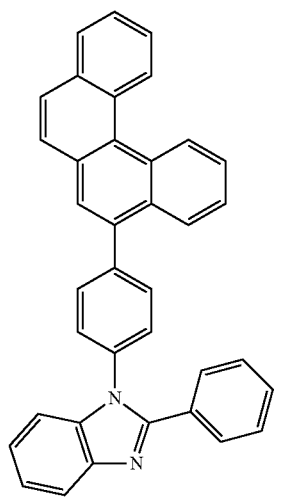
(33)
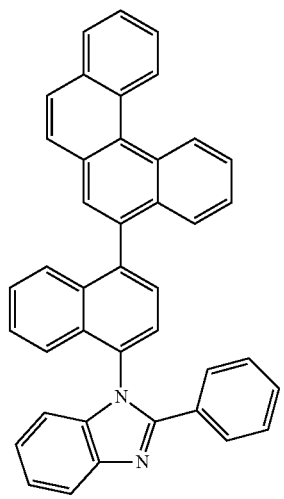
(34)
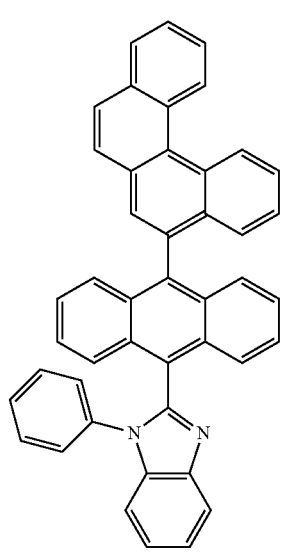
(35)
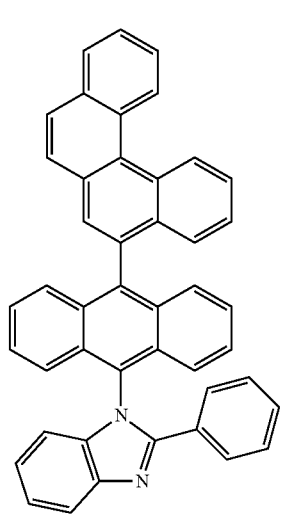
(36)

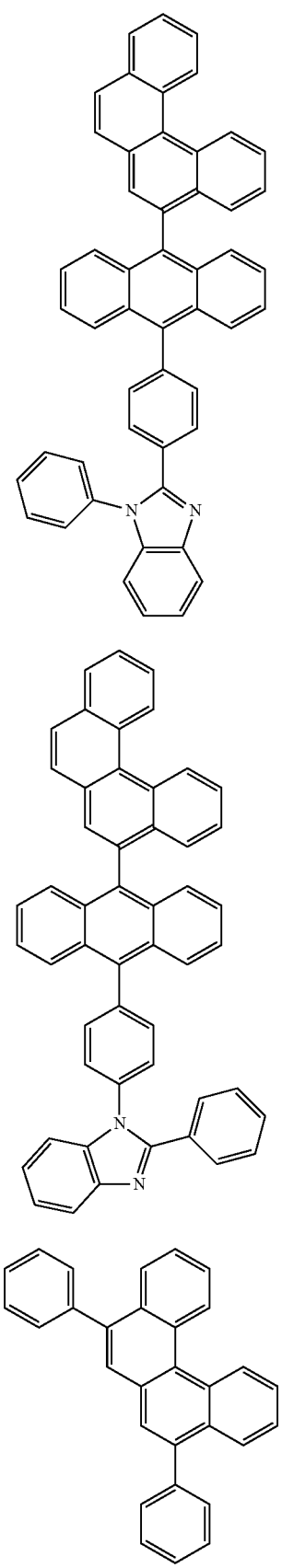
(37)
(38)
(39)
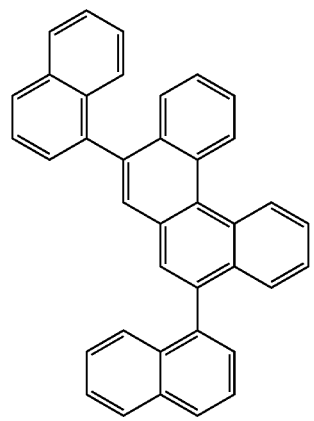
(40)
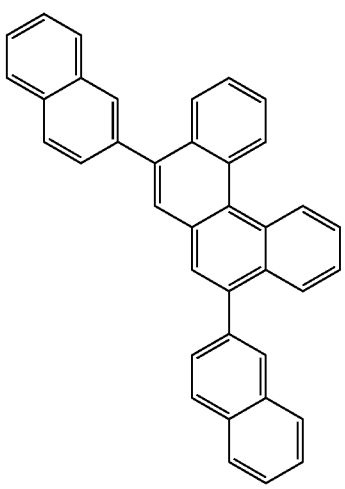
(41)
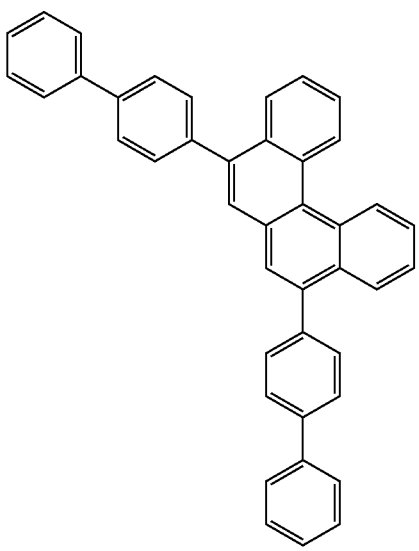
(42)

-continued
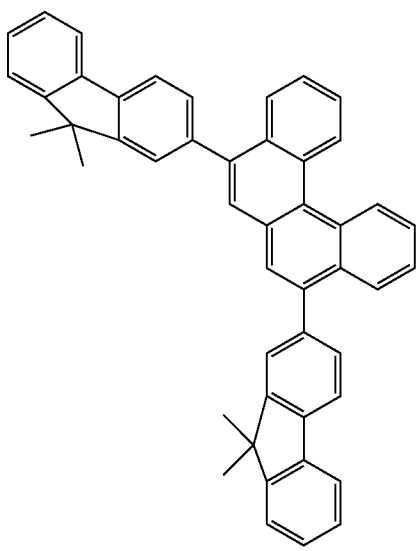
(43)
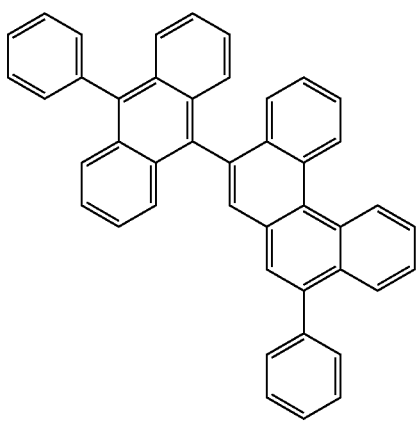
(44)
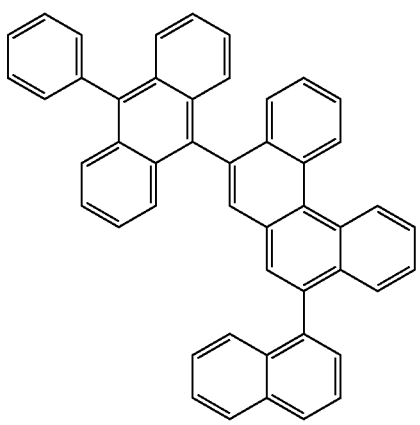
(45)
-continued
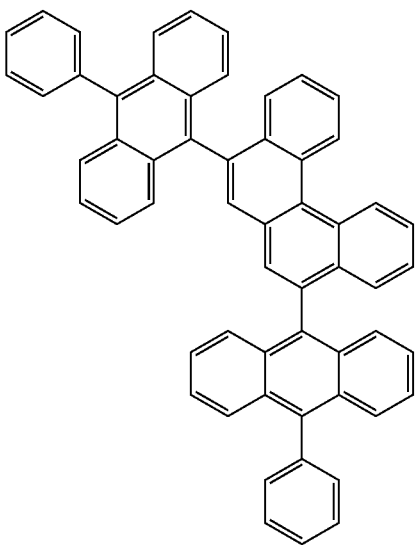
(46)
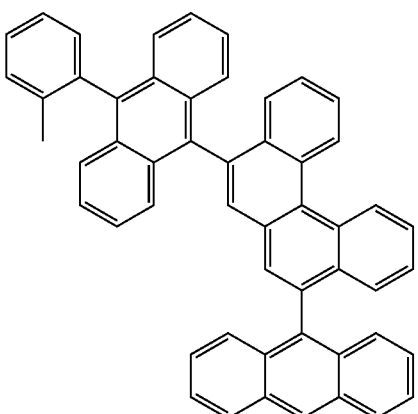
(47)
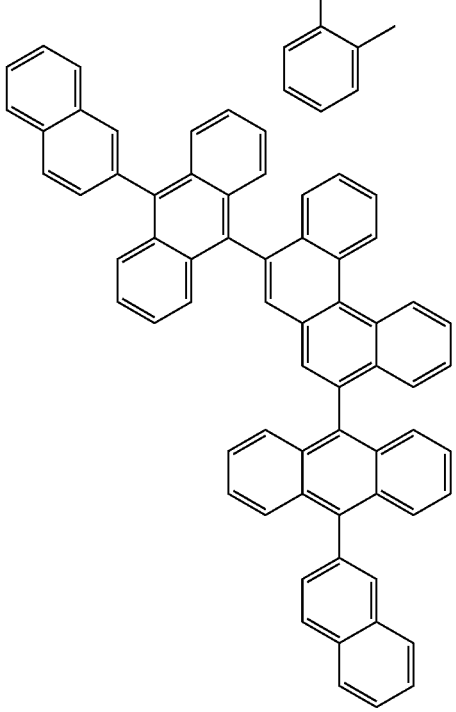
(48)

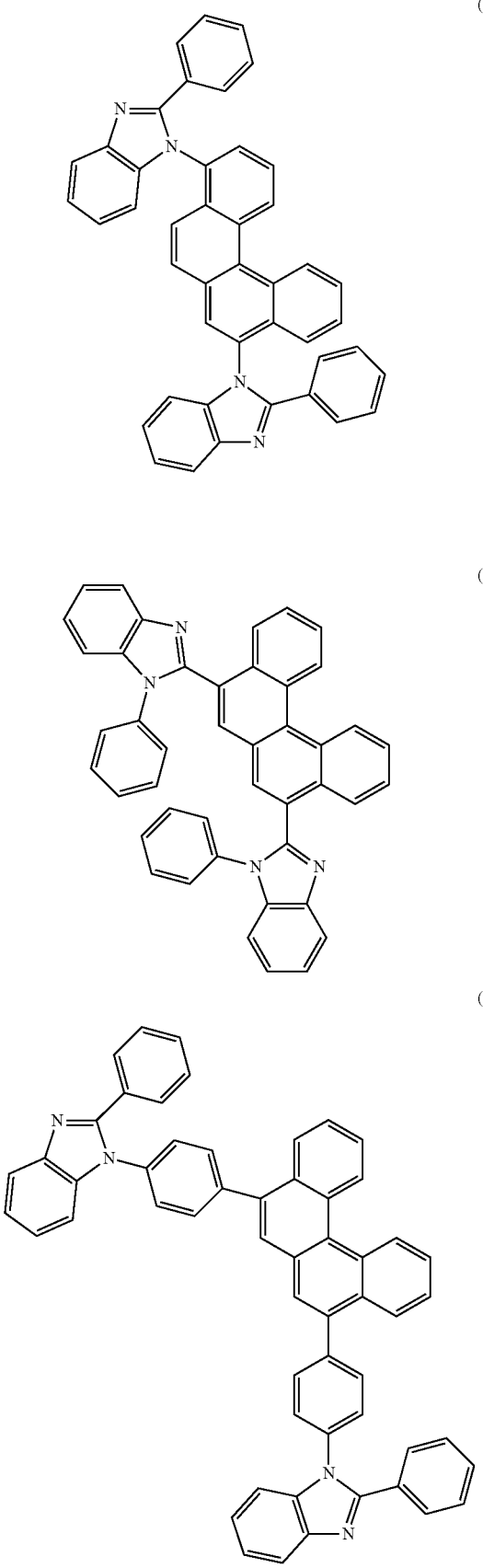
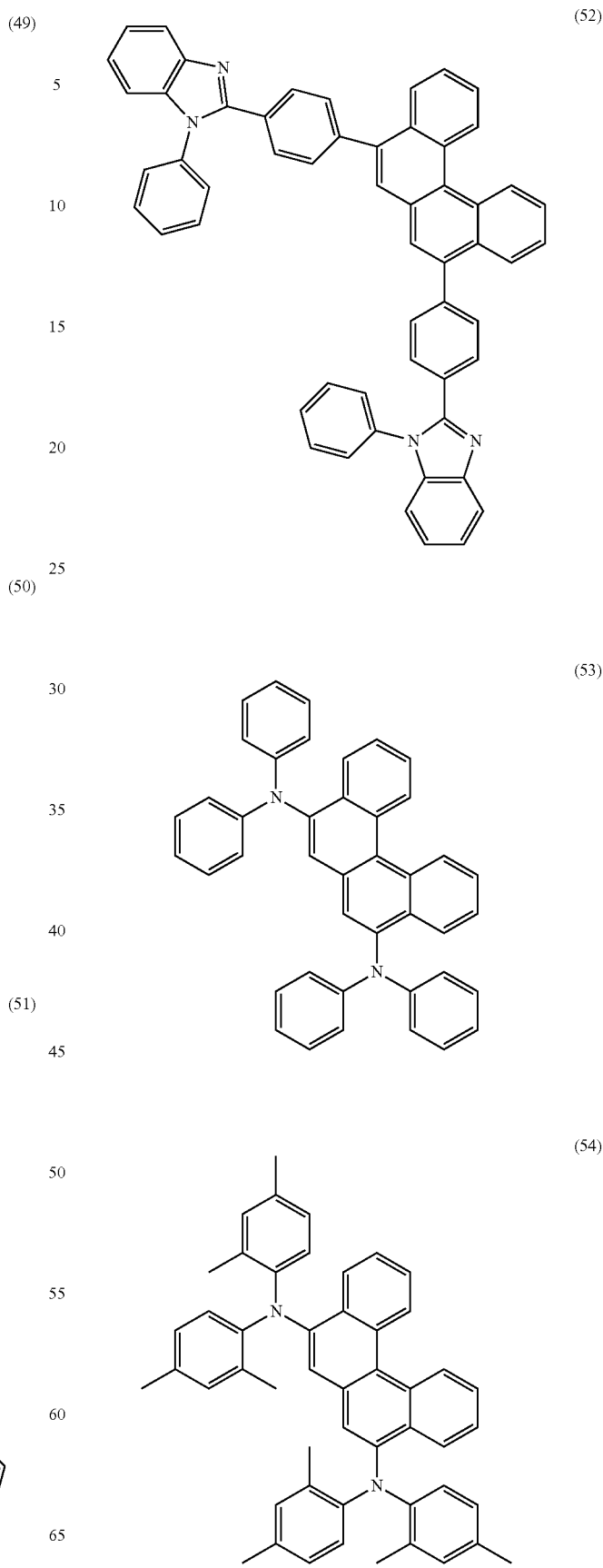

(55)
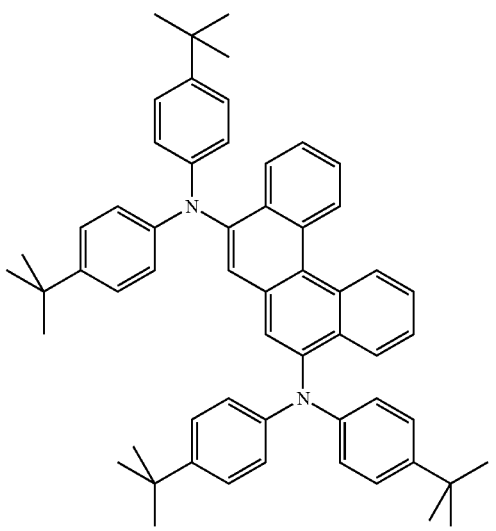
(58)
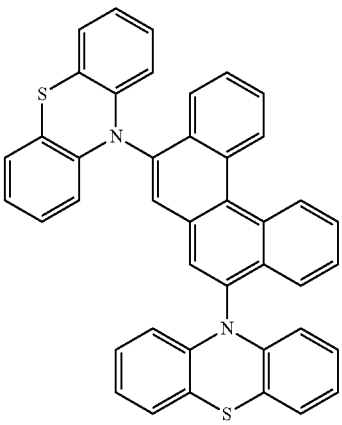
(56)
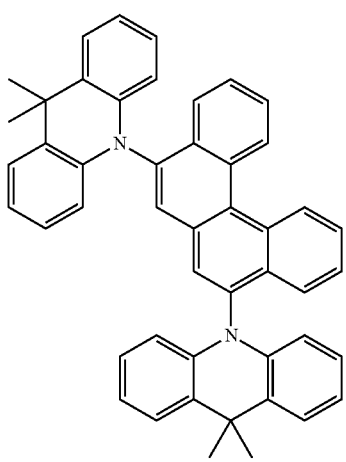
(59)
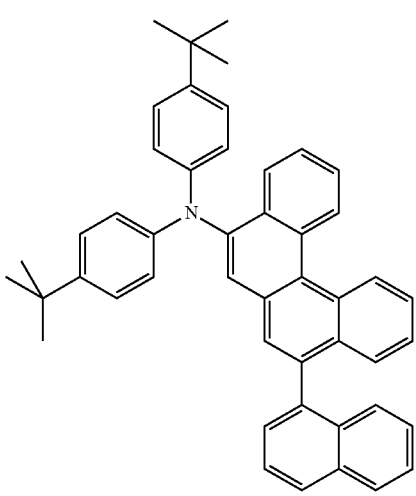
(57)
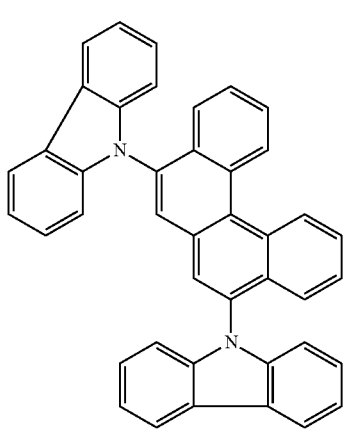
(60)
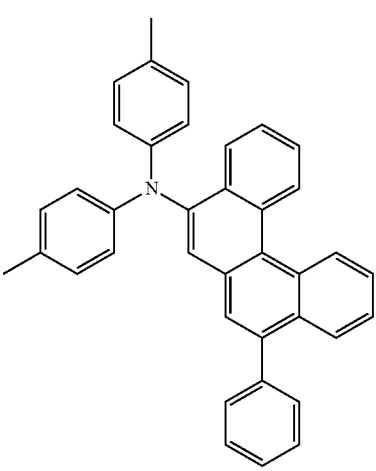

-continued
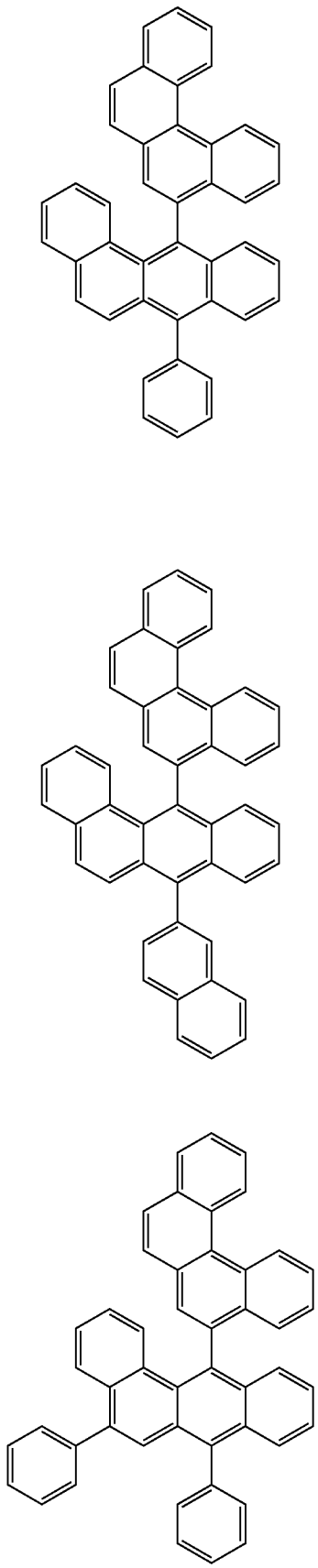
(61)
(62)
(63)
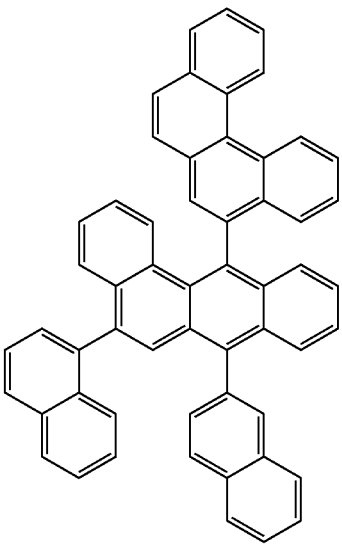
(64)
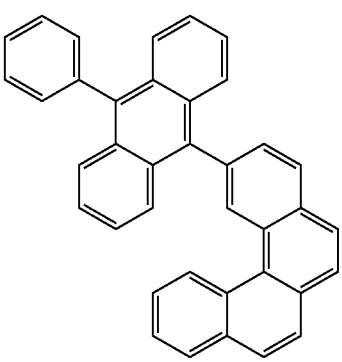
(65)
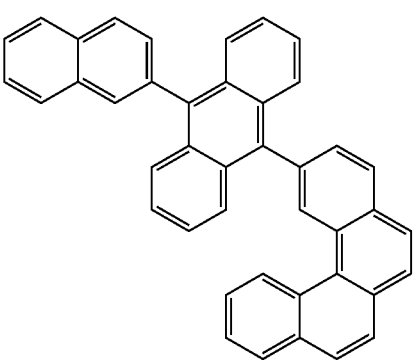
(66)
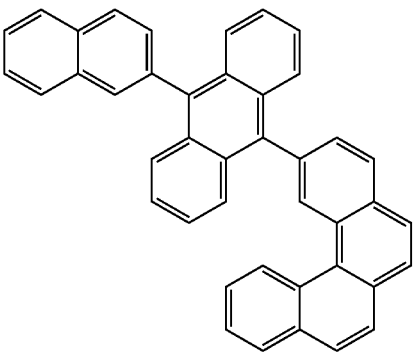
(67)

(68)
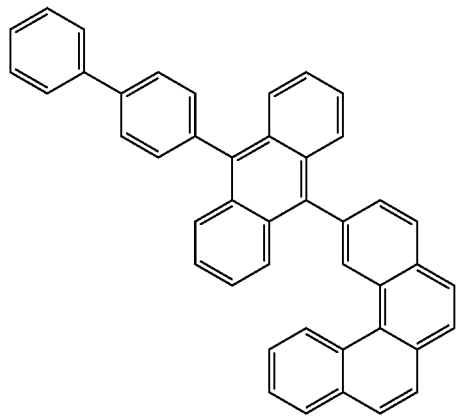
(69)
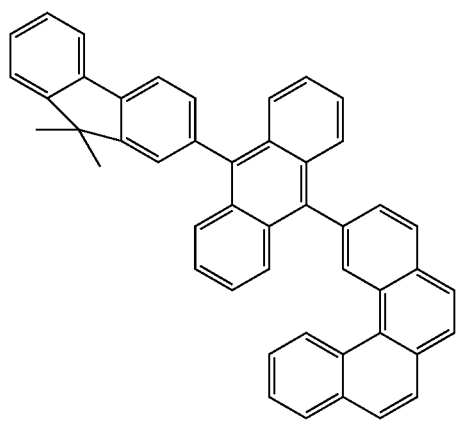
(70)
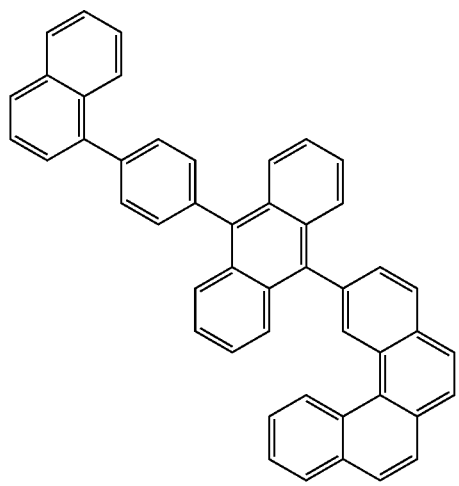
(71)
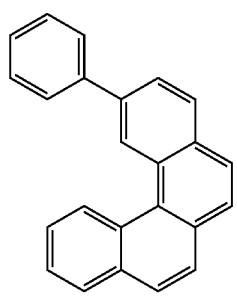
(72)
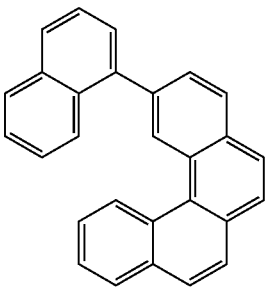
(73)
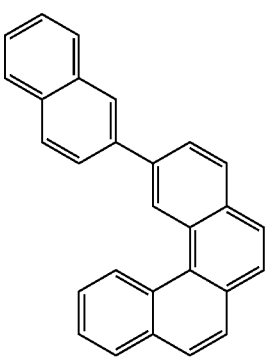
(74)
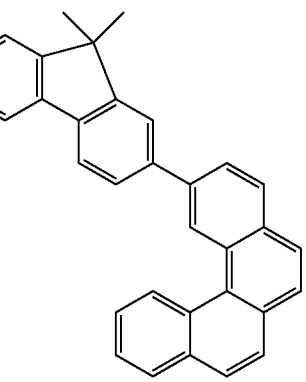
(75)
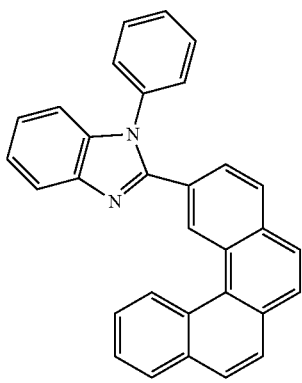

(76)
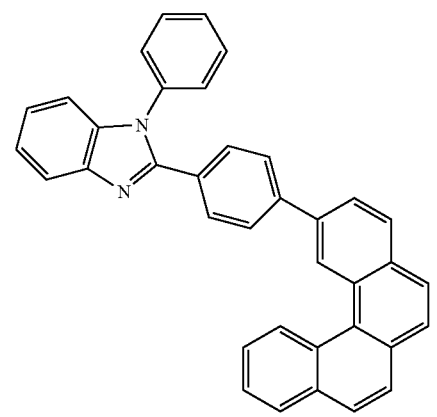
(77)
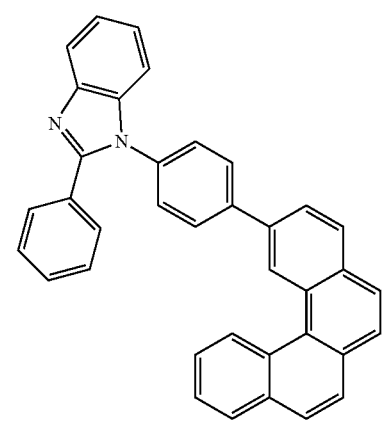
(78)
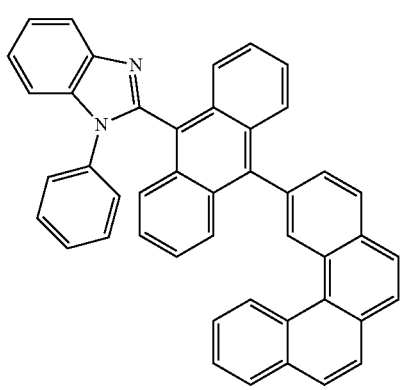
(79)
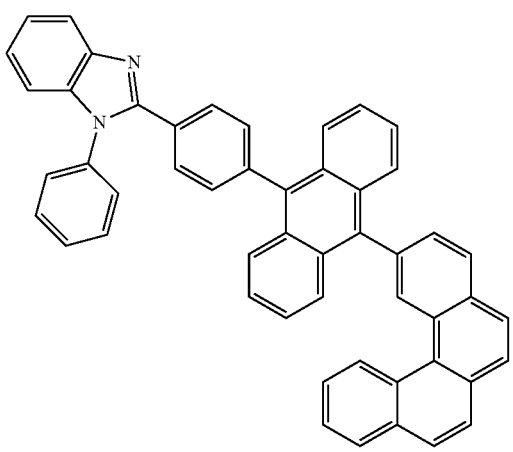
(80)
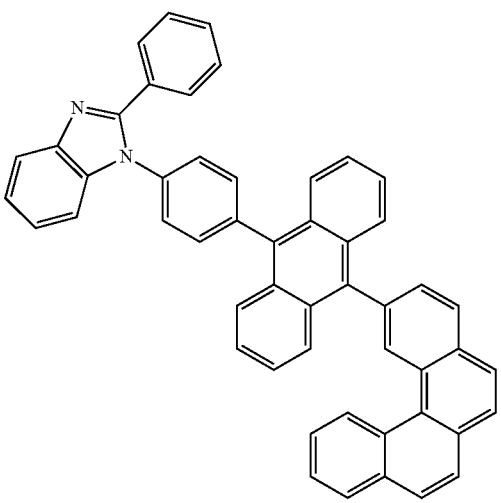
(81)
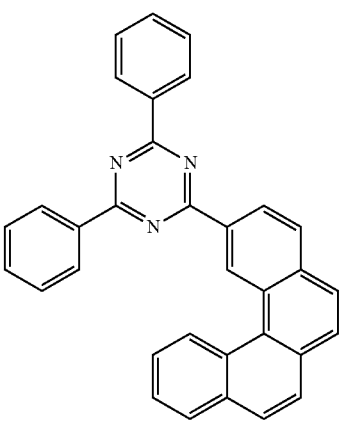
(82)
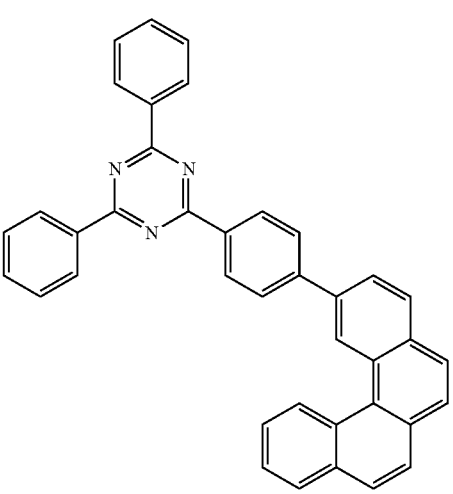

-continued
(83)
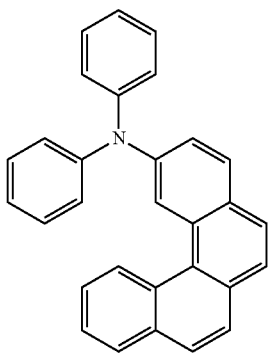
(84)
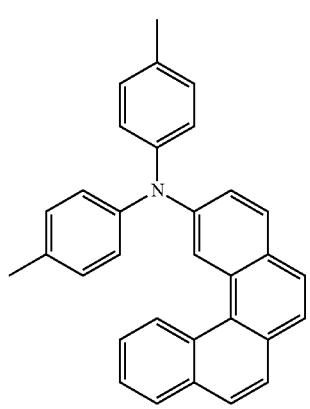
(85)
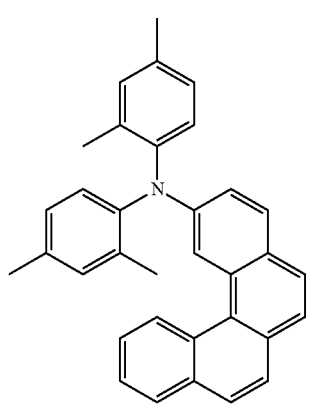
(86)
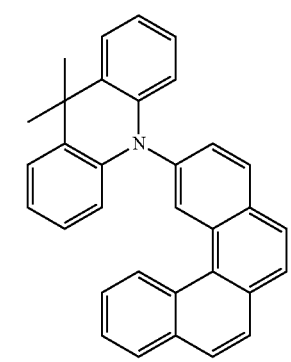
-continued
(87)
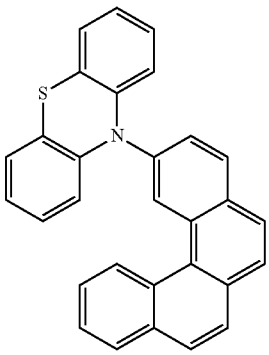
(88)
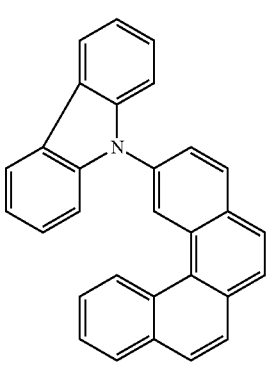
(89)
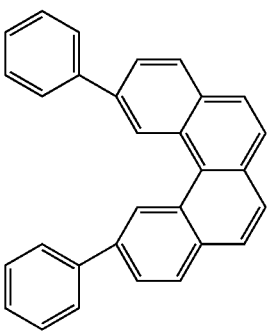
(90)
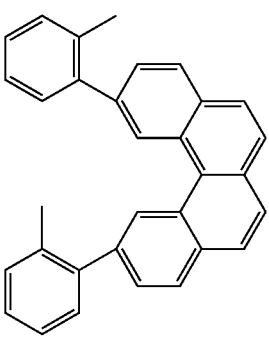

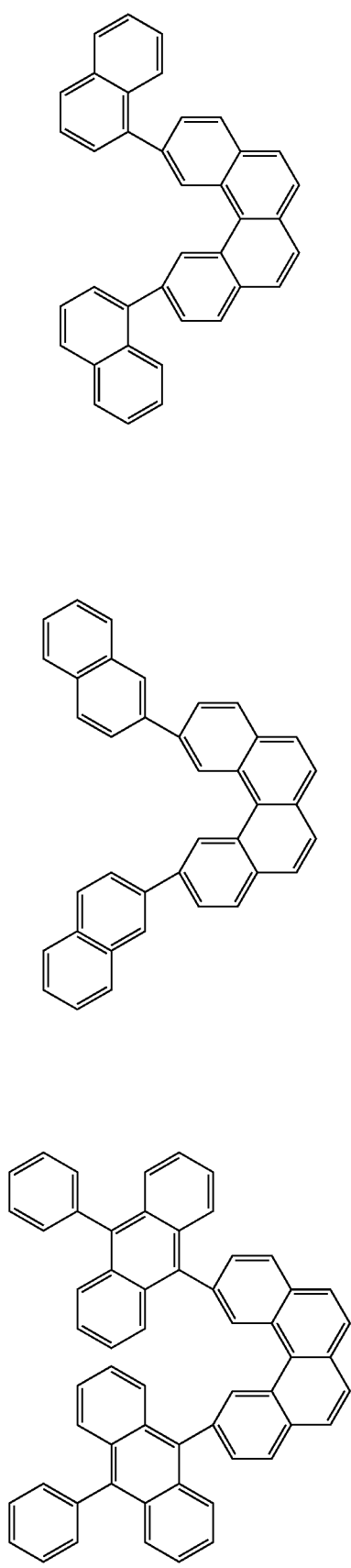
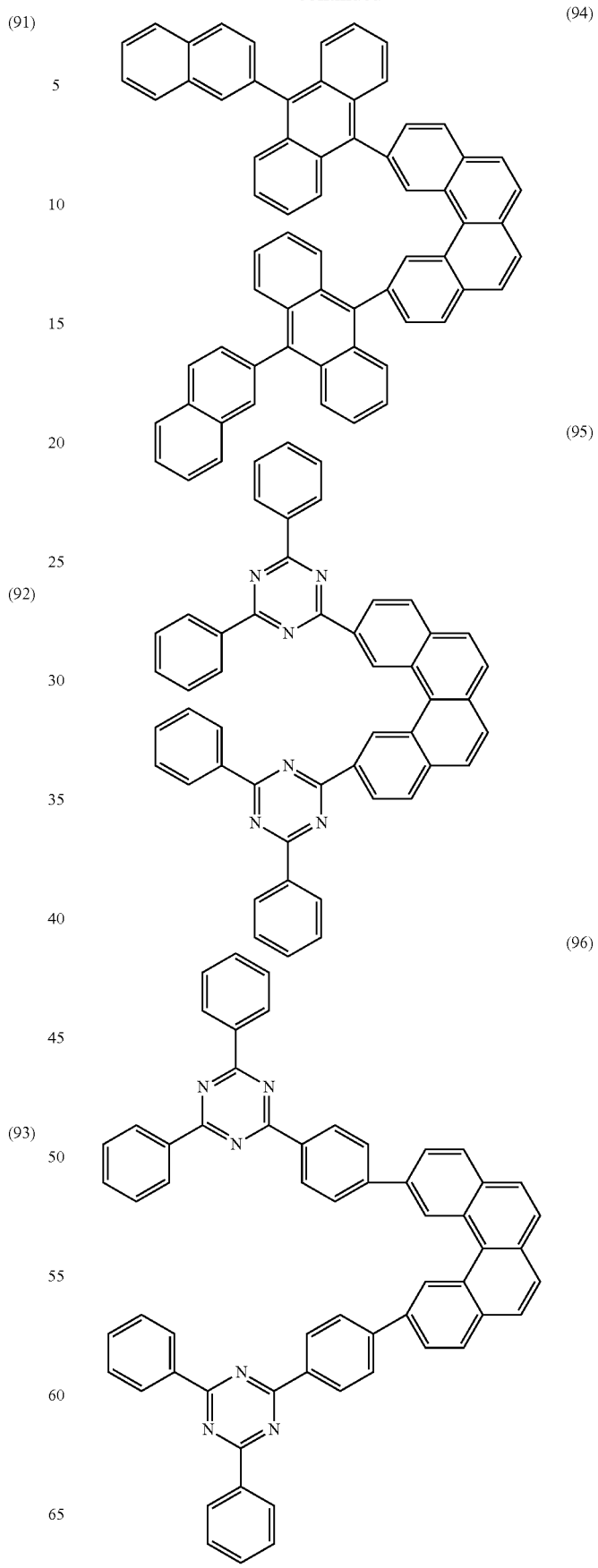

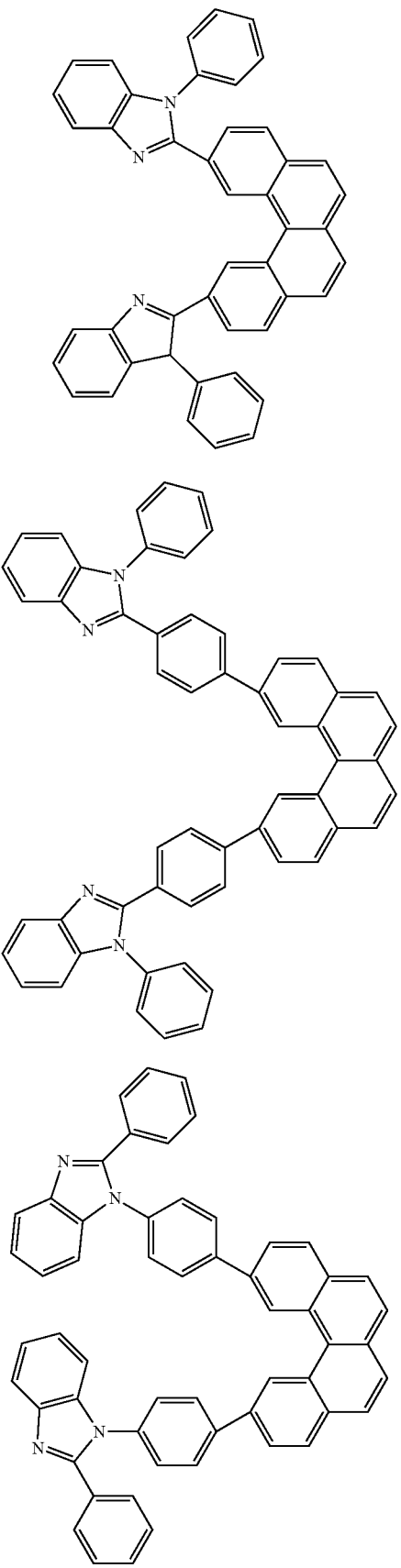
(97)
(98)
(99)
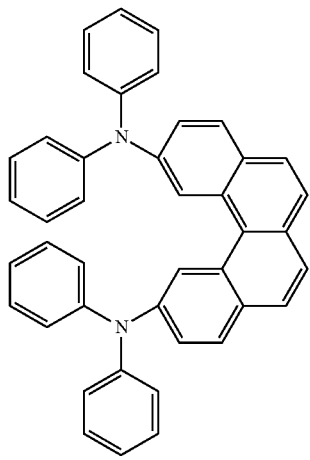
(100)
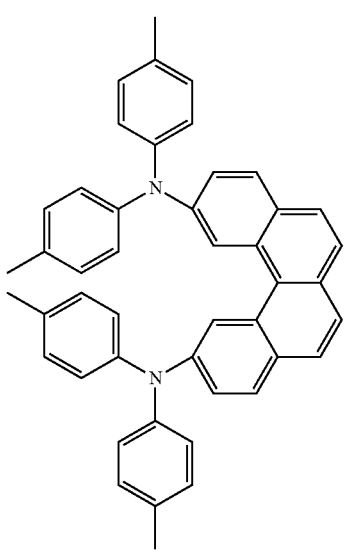
(101)
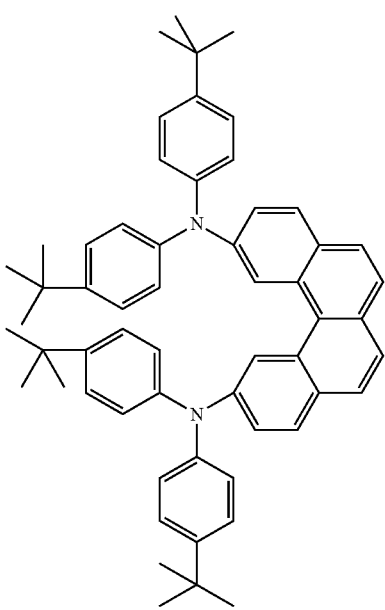
(102)

(103)
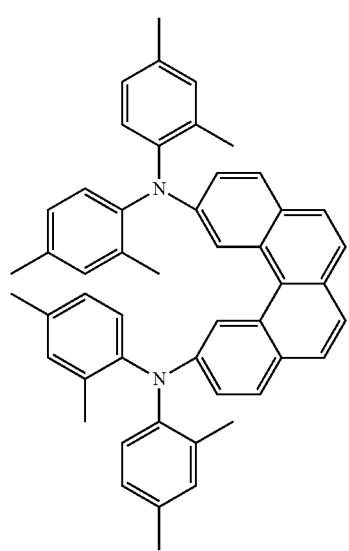
(104)
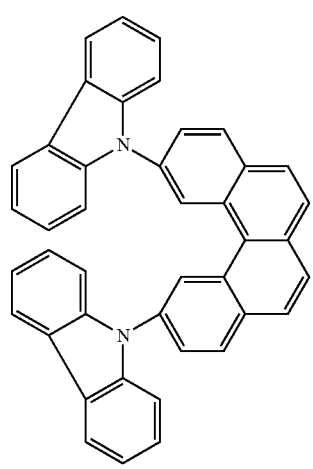
(105)
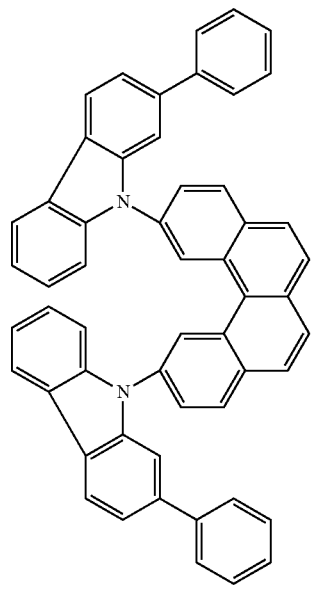
(106)
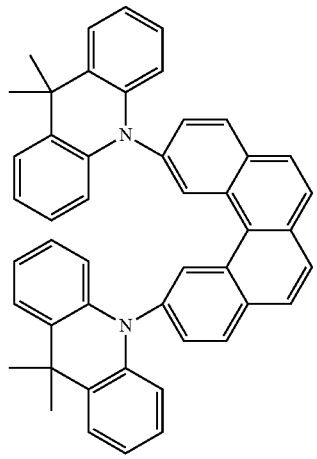
(107)
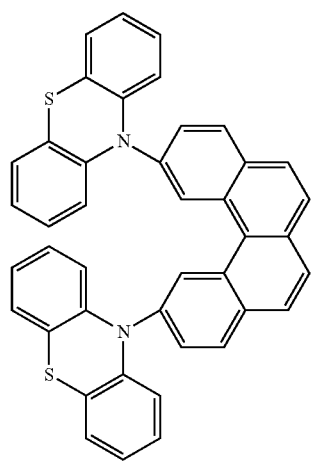
(108)
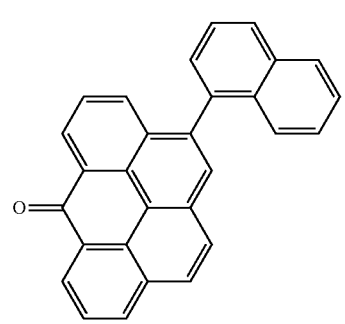
(109)
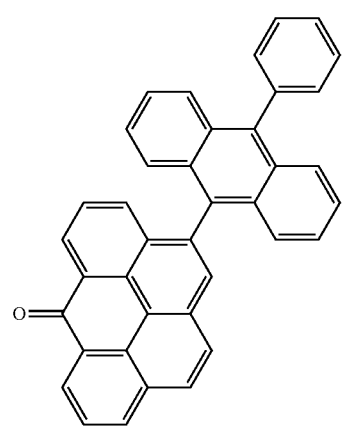

(110)
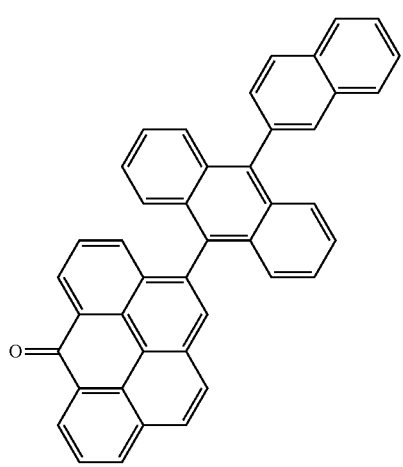
(111)
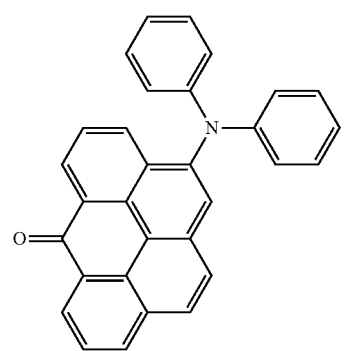
(112)
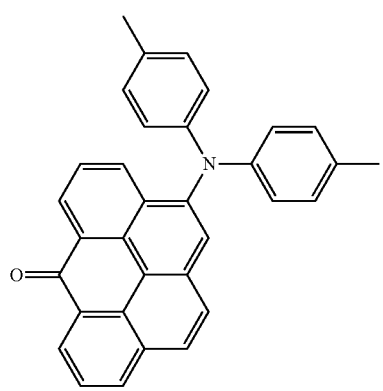
(113)
(114)
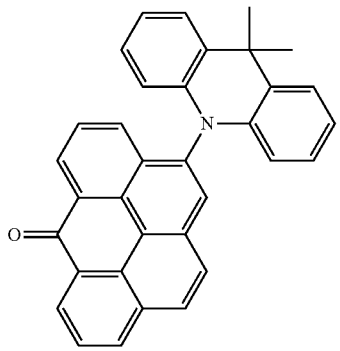
(115)
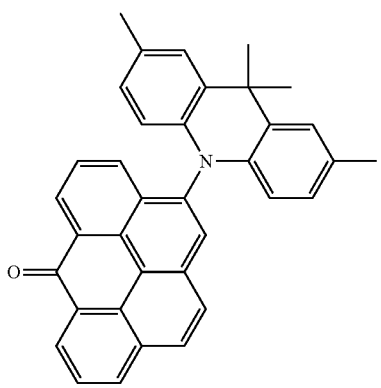
(116)
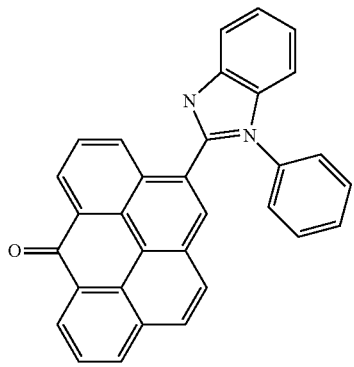
(117)
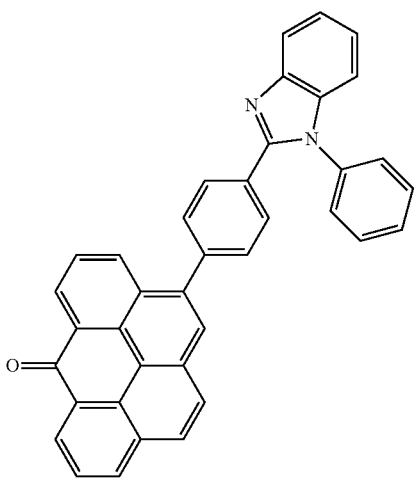

(118)
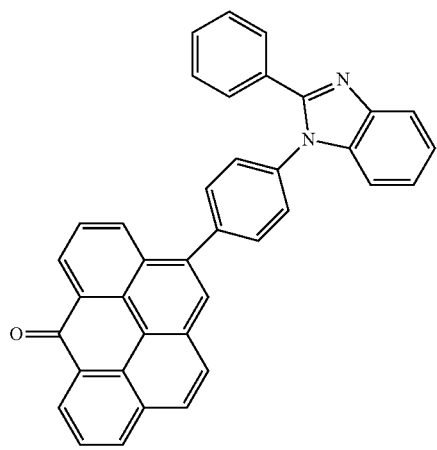
(119)
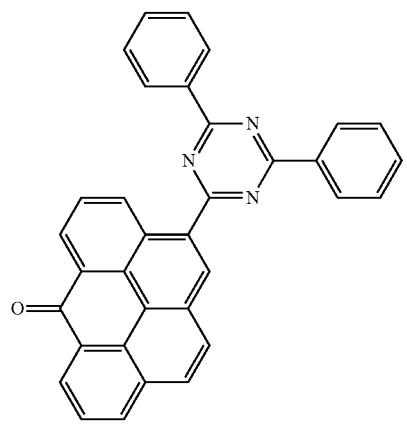
(120)
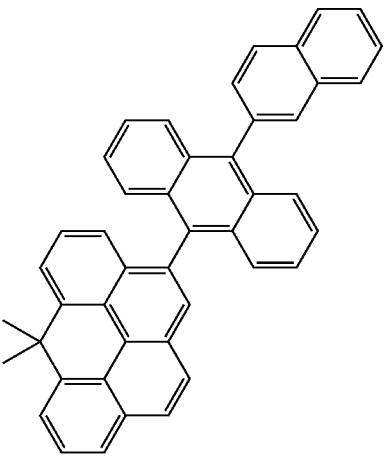
(121)
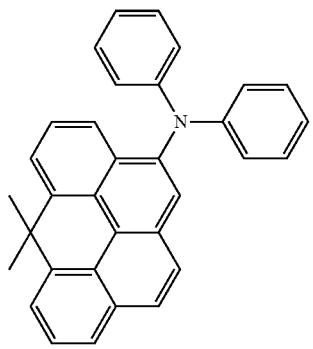
(122)
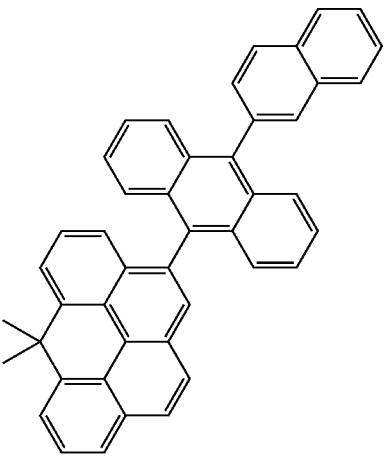
(123)
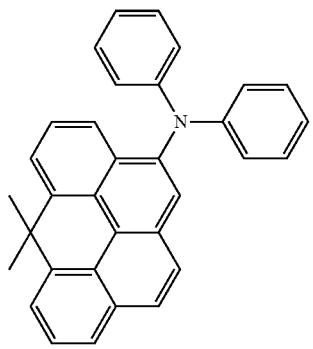
(124)
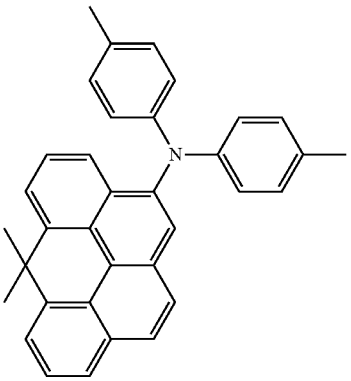
(125)
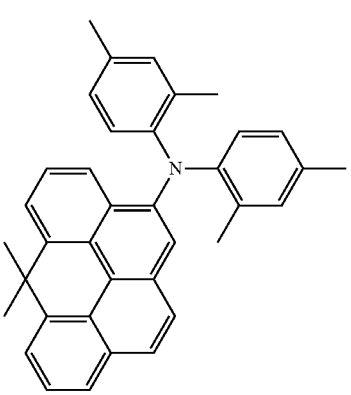

(126) 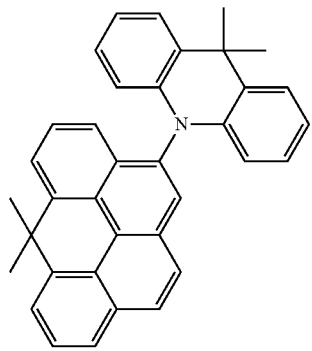
(127) 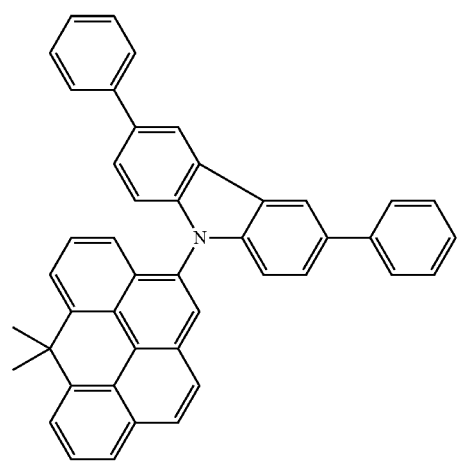
(128) 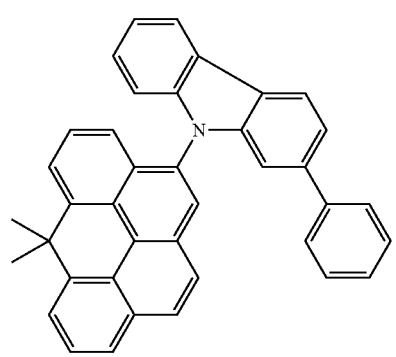
(129) 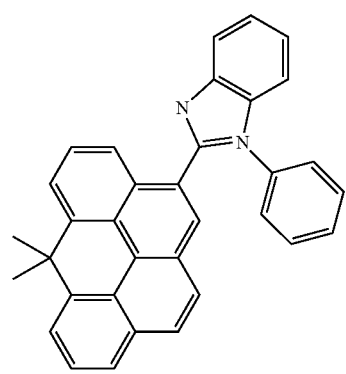
(130) 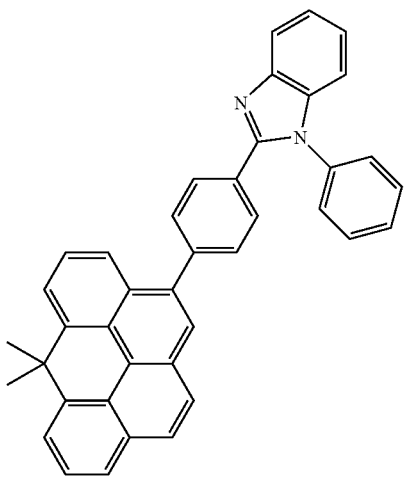
(131) 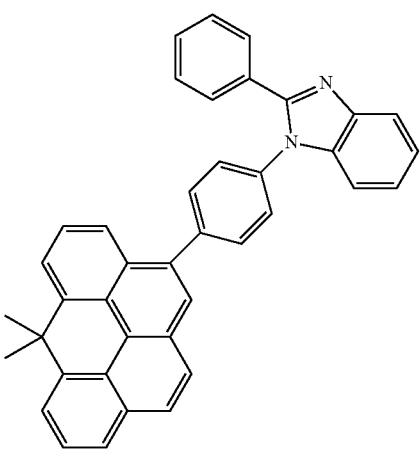
(132) 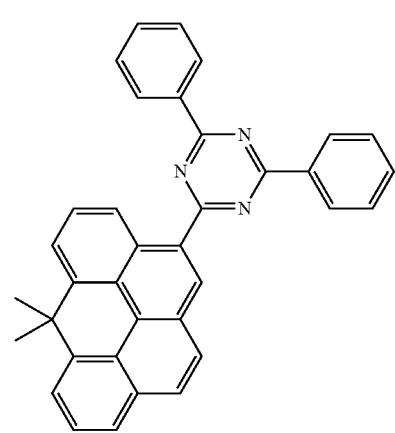

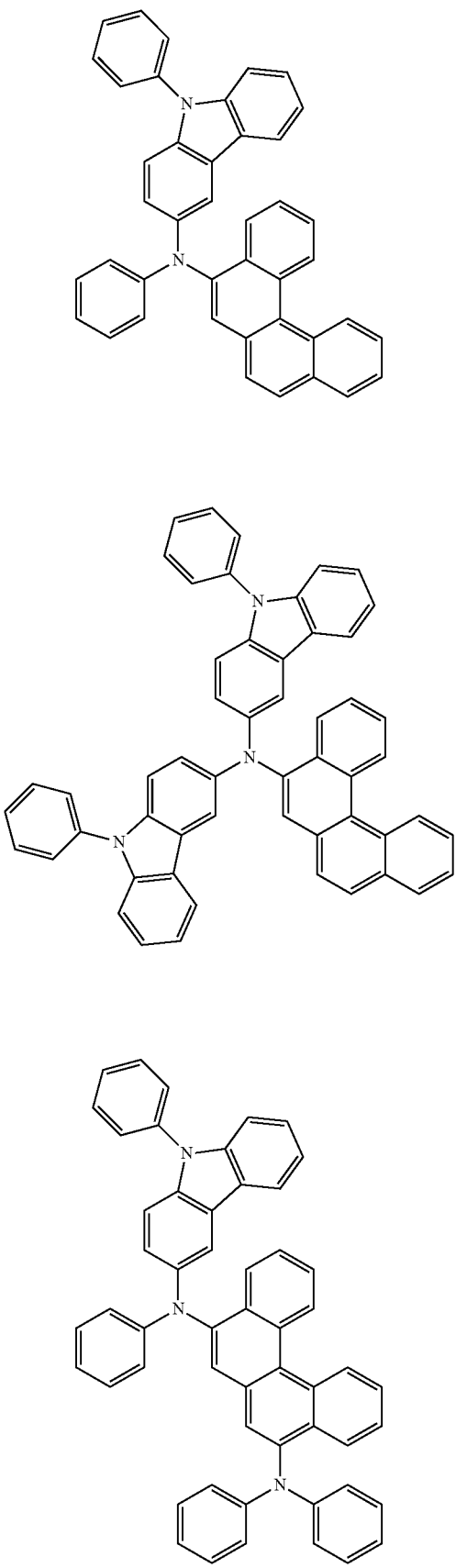
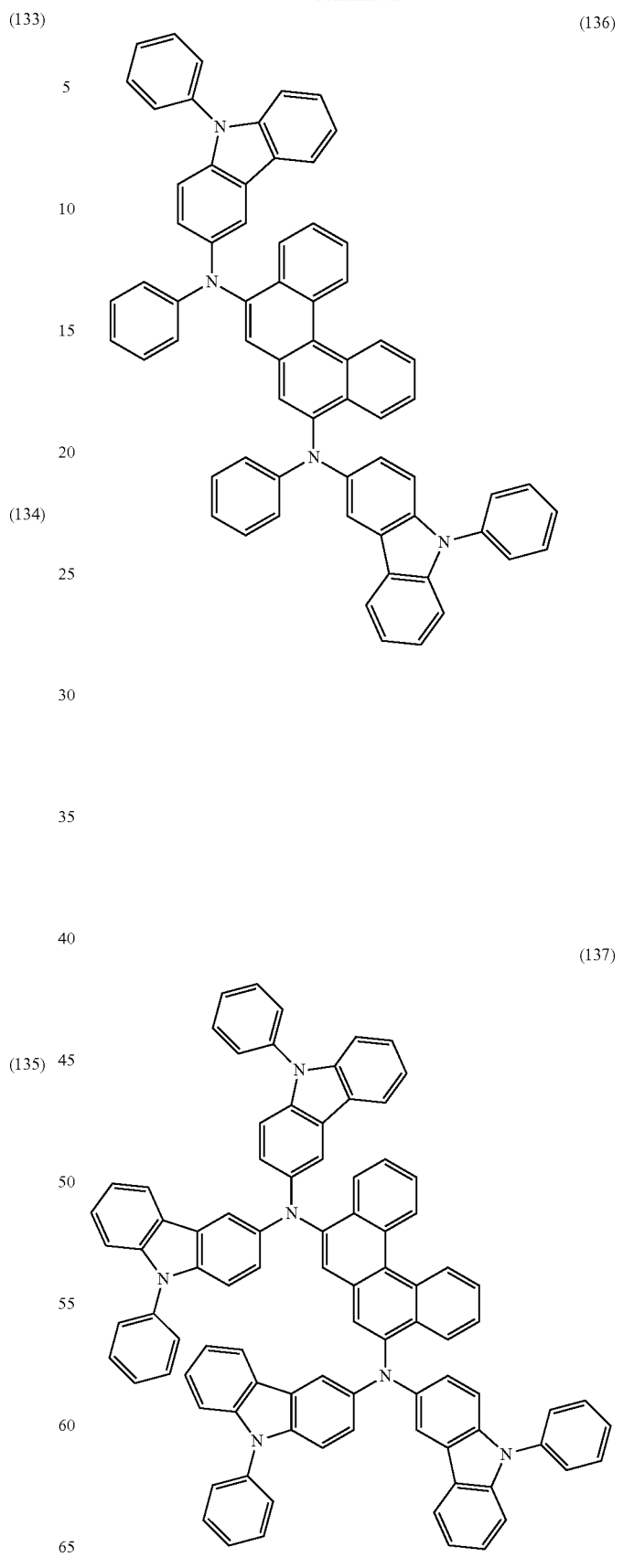

(138)
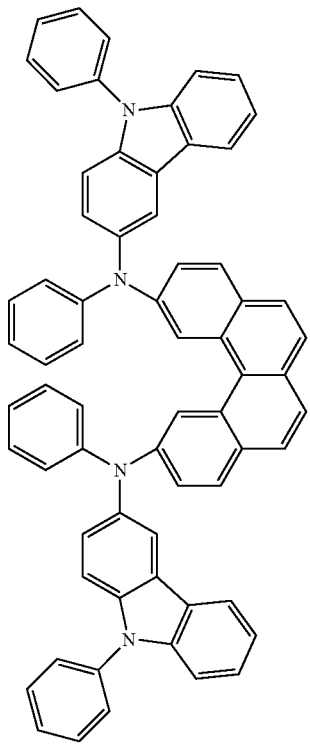
(139)
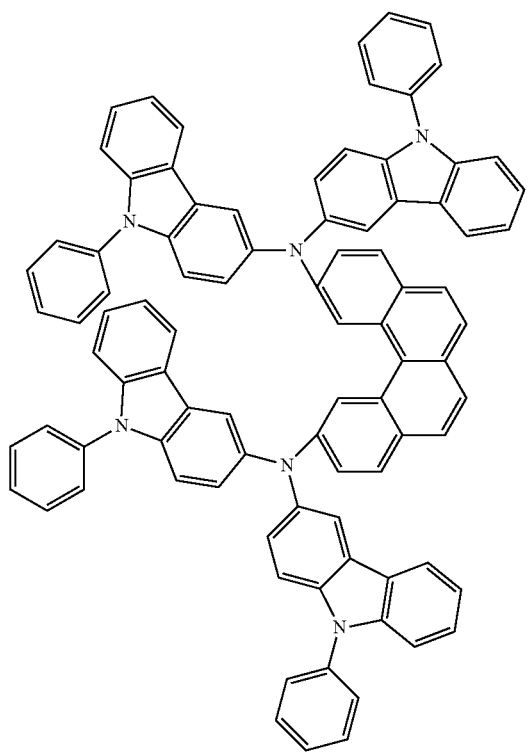
(140)
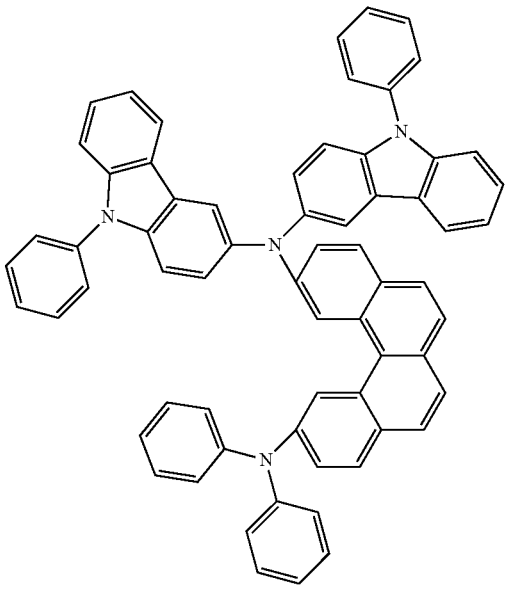
(141)
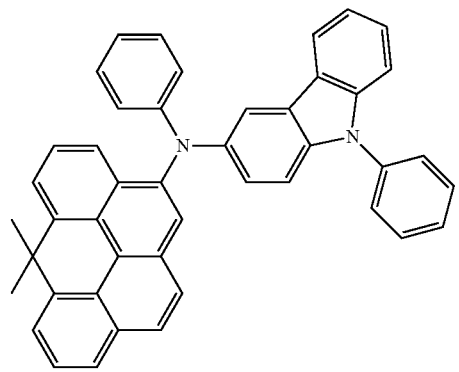

(142)

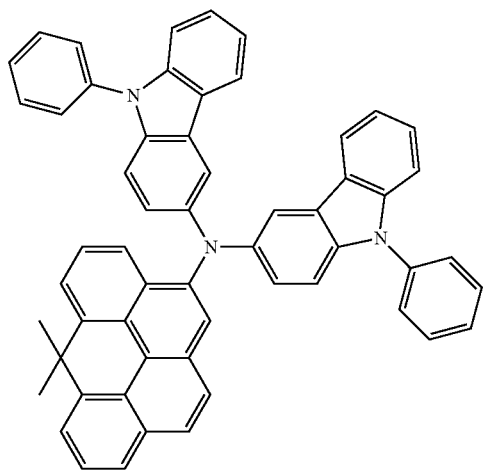

(144)

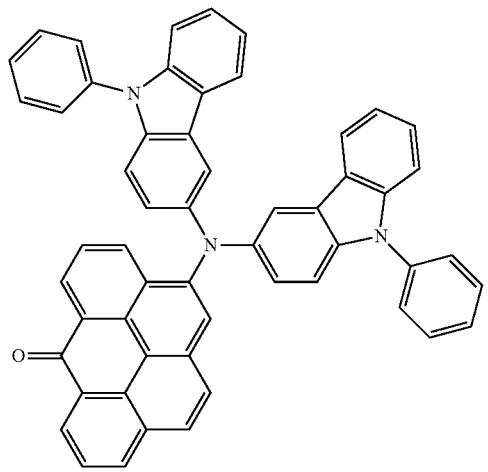

(143)

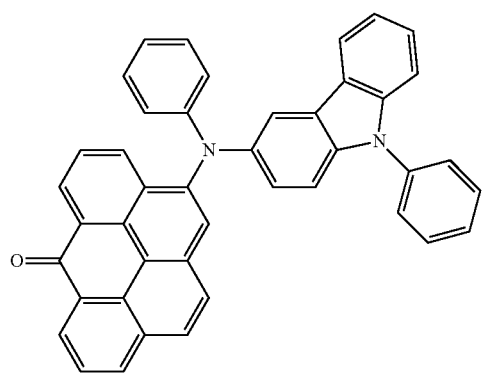

The compounds of the formula (I) according to the invention can be prepared by synthetic steps which are generally known to the person skilled in the art. The starting compound used can be, for example, the corresponding bromobenzo[c]phenanthrenes. Likewise, the benzo[c]phenanthrenes which are substituted by corresponding leaving groups, such as chlorine, iodine, triflate or tosylate, may serve as starting compounds. Scheme 1 shows the preparation of 5-bromobenzo[c]phenanthrene and 5,8-dibromo-benzo[c]phenanthrene. To this end, a naphthalene-1-boronic acid derivative is coupled to a 2-acetylene-substituted halobenzene in a Suzuki coupling, followed by the ring closure reaction to give the unsubstituted benzo-[c]phenanthrene. Reaction with Br$_2$ gives 5,8-dibromobenzo[c]phenanthrene, while reaction with N-bromoacetamide (NBA) leads selectively to 5-bromobenzo[c]phenanthrene.

Scheme 1: Synthesis of 5-bromobenzo[c]phenanthrene or 5,8-dibromobenzo[c]phenanthrene

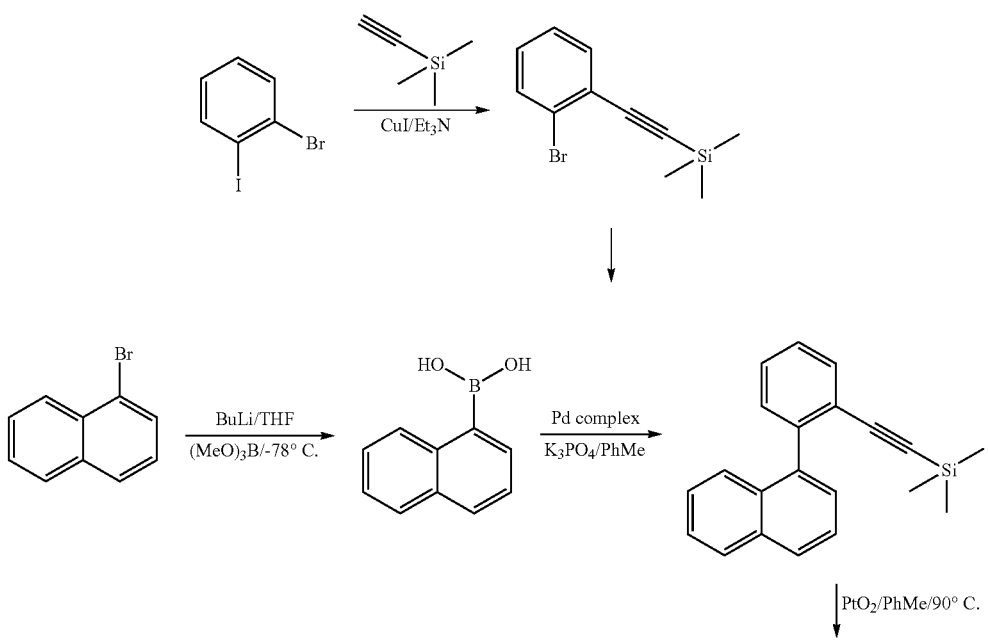

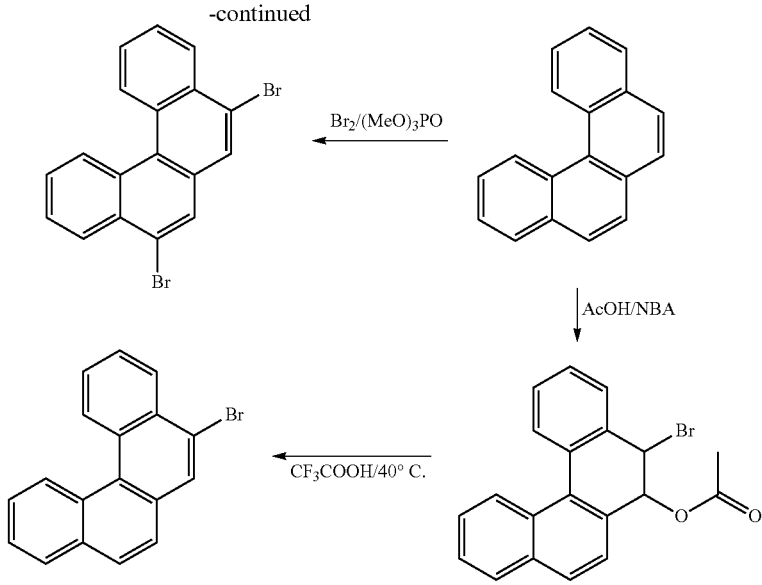

Scheme 2 shows the preparation of 2,11-dibromobenzo[c] phenanthrene. To this end, para-bromobenzaldehyde is reacted with acetone in an aldol reaction. The double bonds in the resultant product are hydrogenated. The ketone is converted into the corresponding epoxide, which is converted into the tetrahydro precursor of benzo[c]phenanthrene under the action of TiCl$_4$. The aromatisation can be carried out under the action of DDQ.

Scheme 2: Synthesis of 2,11-dibromobenzo[c]phenanthrene

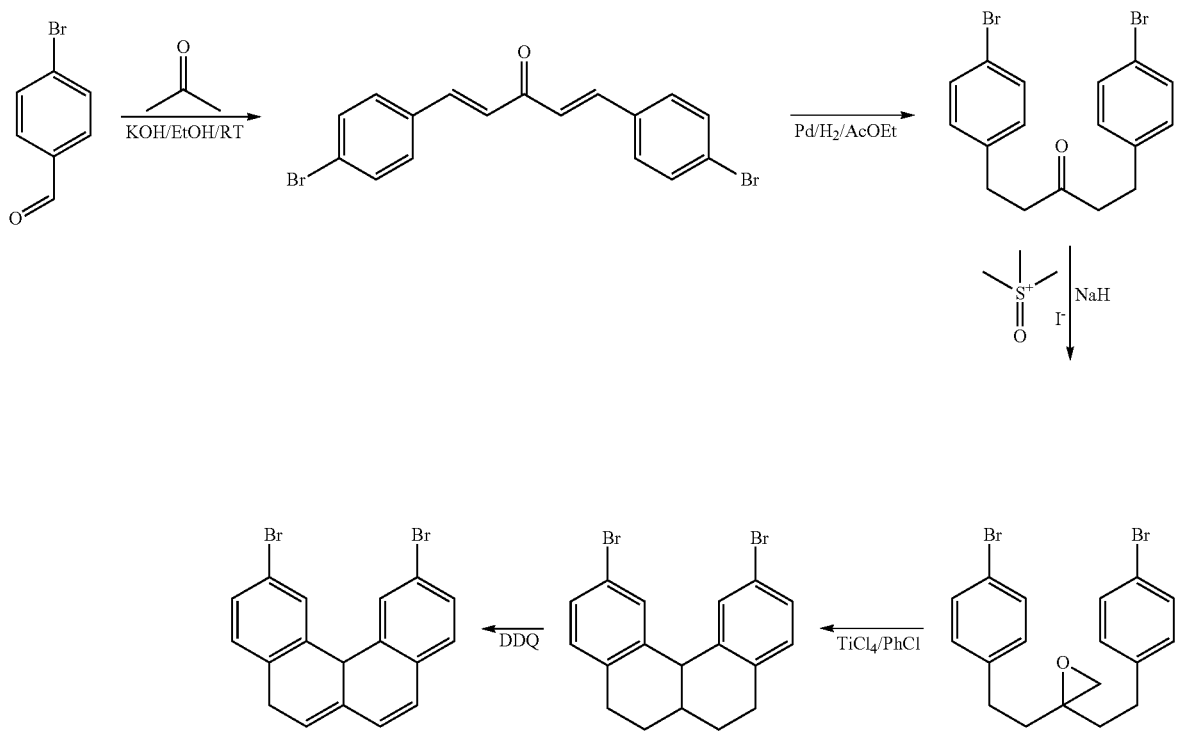

Scheme 3 shows the preparation of 2-bromobenzo[c]phenanthrene. This synthesis proceeds analogously to Scheme 2 using a bromine-substituted and an unsubstituted starting material.
Scheme 3: Synthesis of 2-bromobenzo[c]phenanthrene
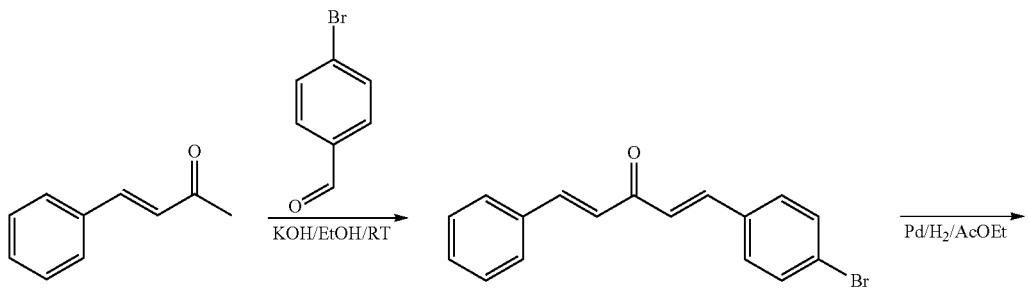
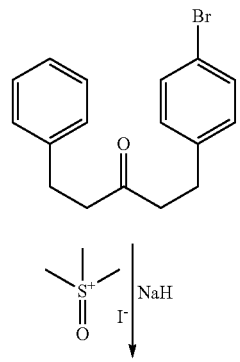
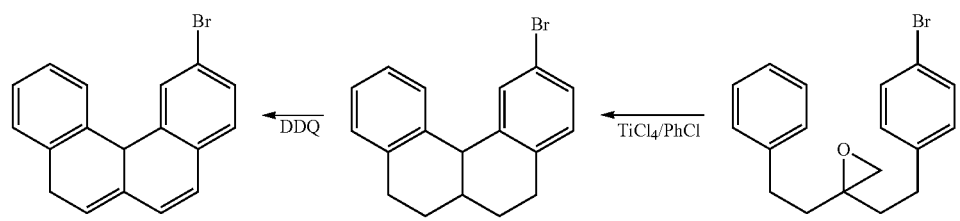

The boronic acids or boronic acid derivatives derived from the bromo- or dibromobenzo[c]phenanthrenes shown in Schemes 1 to 3 can be obtained by transmetallation, for example using n-butyllithium in THF at −78° C., and subsequent reaction of the lithiobenzo[c]phenanthrene formed as an intermediate with trimethyl borate, as shown in Scheme 4 a) to d), optionally followed by esterification. Furthermore, the lithiated compounds can be converted into ketones by reaction with electrophiles, such as benzonitrile, and subsequent acidic hydrolysis or into phosphine oxides by reaction with chlorodiarylphosphines and subsequent oxidation. The compounds can likewise be reacted with Mg to give the corresponding Grignard compounds, which are then reacted further. Reaction of the lithiated compound with other electrophiles is also possible.

Scheme 4:

a)

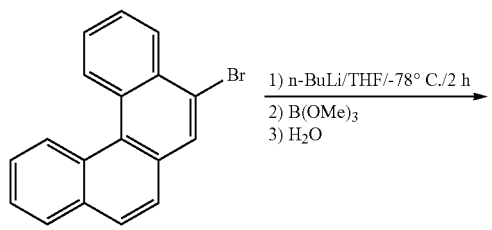

b)

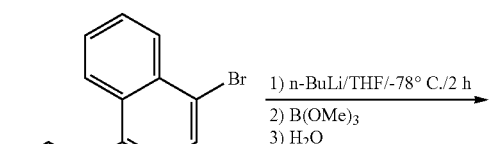

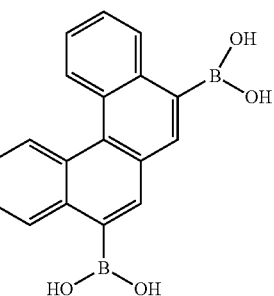

c)

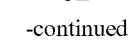
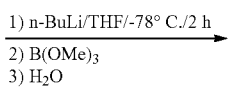

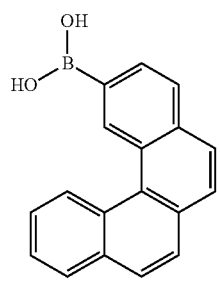

d)

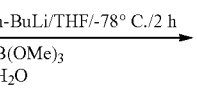

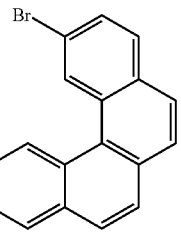

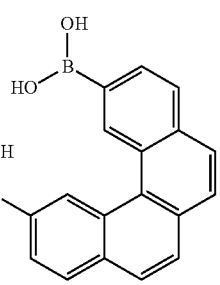

The compounds in Scheme 4 may also be substituted by one or more radicals, where these have the same meaning as described above under formula (I). Suzuki coupling of the boronic acids or boronic acid derivatives to aryl halides, in particular aryl bromides, results in a large class of various aromatic and heteroaromatic compounds. This is shown by way of example in Scheme 5 a) to c), starting from benzo[c]phenanthrene-5-boronic acid, but also applies in the same way to other substitution patterns. In the case of benzo[c]phenanthrenediboronic acids, which are shown in Scheme 4 b) and d), a disubstitution by two aryl bromides takes place analogously. Furthermore, all structures may also be substituted by one or more radicals, where these have the same meaning as described above under formula (I).

Scheme 5:

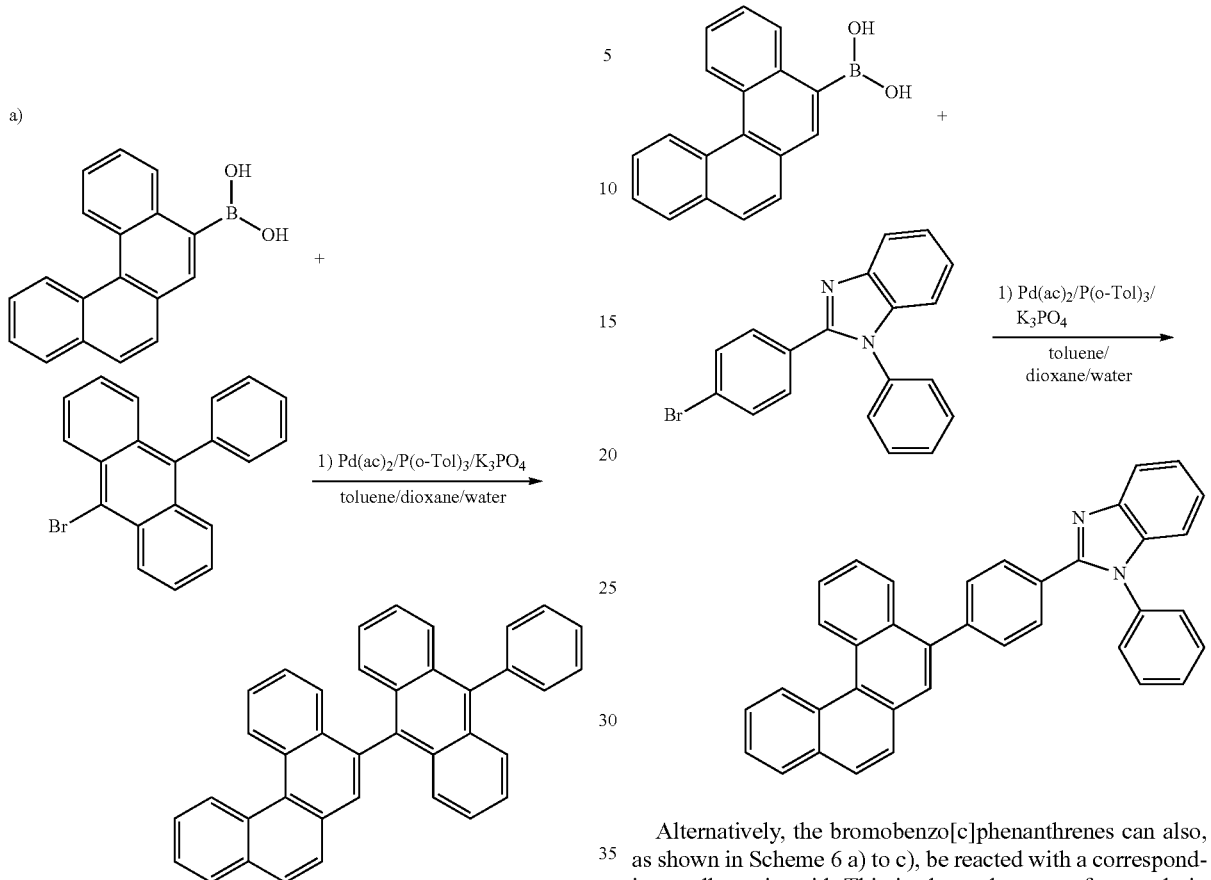

Alternatively, the bromobenzo[c]phenanthrenes can also, as shown in Scheme 6 a) to c), be reacted with a corresponding arylboronic acid. This is shown by way of example in Scheme 6 a) to c), starting from 5-bromo-benzo[c]phenanthrene, but also applies in the same way to other substitution patterns. In the case of dibromobenzo[c]phenanthrenes, which are shown in Schemes 1 and 3, a disubstitution by two arylboronic acids takes place analogously. The compounds in Scheme 6 may also be substituted by one or more radicals, where these have the same meaning as described above under formula (I).

Scheme 6:

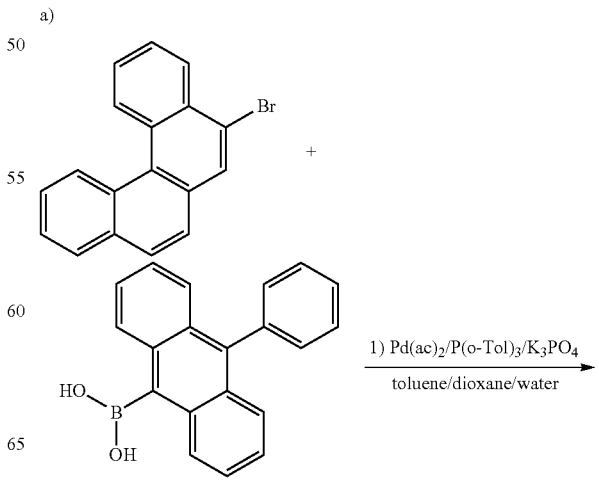

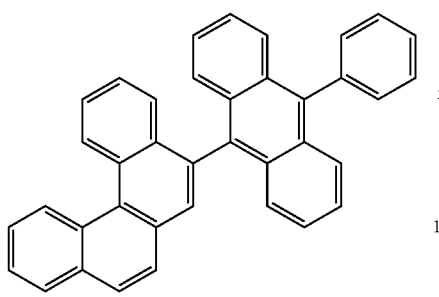

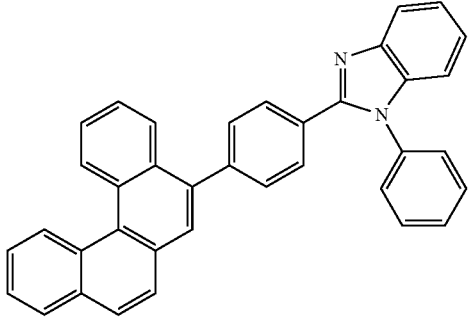

The palladium-catalysed amination of the bromides by the Hartwig-Buchwald method results in the corresponding aminated benzo[c]phenanthrene (Scheme 7). Amination at the other positions of the benzo[c]phenanthrene is accessible correspondingly. A corresponding reaction is possible with other leaving groups, such as chlorine, iodine, triflate, tosylate, etc. In the case of dibromobenzo[c]phenanthrenes, which are shown in Schemes 1 and 3, a disubstitution by two amines takes place analogously. The compounds in Scheme 7 may also be substituted by one or more radicals, where these have the same meaning as described above under formula (I).

Scheme 7:

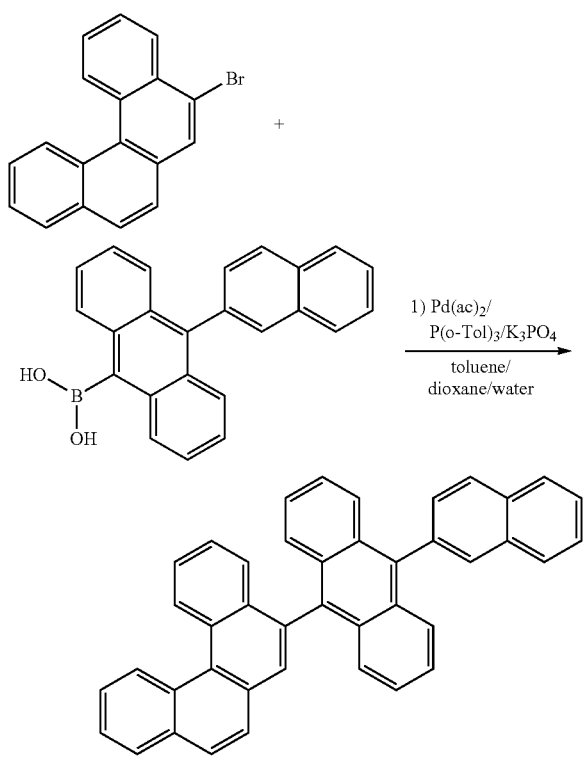

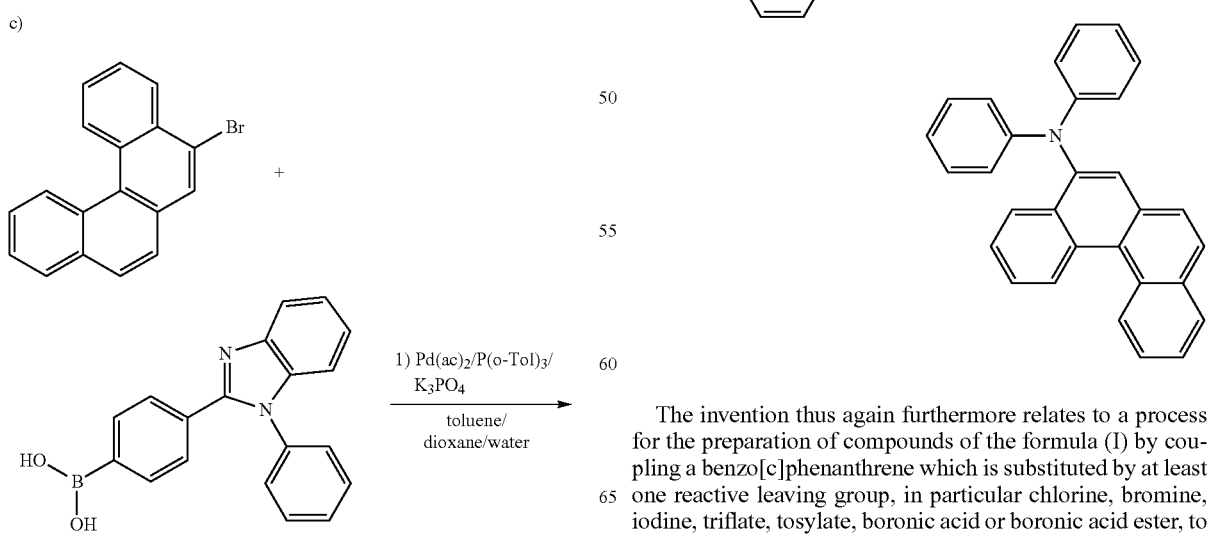

The invention thus again furthermore relates to a process for the preparation of compounds of the formula (I) by coupling a benzo[c]phenanthrene which is substituted by at least one reactive leaving group, in particular chlorine, bromine, iodine, triflate, tosylate, boronic acid or boronic acid ester, to a functionalised aromatic compound or to a mono- or disubstituted amine. The reactive leaving group is preferably bromine. Suitable coupling reactions between the skeleton of the formula (I) and the aryl substituent are, in particular, transition metal-catalysed coupling reactions, in particular Suzuki coupling with palladium catalysis, so that, in particular, the coupling of a boronic acid derivative to a halogen derivative is possible here. A suitable coupling reaction to a mono- or disubstituted amine is, in particular, the palladium-catalysed Hartwig-Buchwald coupling. The reaction conditions for such reactions are generally known to the person skilled in the art of organic synthesis.

A further embodiment of the present invention is a compound of the formula (XV)

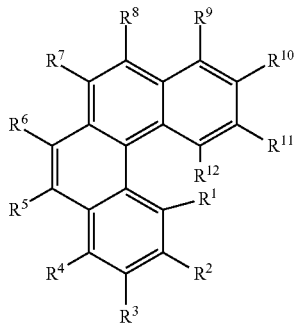

formula (XV)

in which $R^1$, $R^{12}$, $R^{13}$, $R^{14}$ and Ar have the same meanings as described above regarding the compounds of the formula (I), and furthermore:

$R^2$ to $R^{11}$ are selected, independently of one another, from the group consisting of Ar, $N(Ar)_2$, H, D, F, Cl, Br, I, CHO, $N(R^{13})_2$, C(=O)Ar, P(=O)(Ar)$_2$, S(=O)Ar, S(=O)$_2$Ar, $CR^{13}$=$CR^{13}$Ar, CN, $NO_2$, $Si(R^{13})_3$, $B(OR^{13})_2$, $OSO_2R^{13}$, straight-chain alkyl, alkenyl, alkoxy and thioalkoxy groups having 1 to 40 C atoms and branched, mono- or polycyclic alkyl, alkenyl, alkoxy and thioalkoxy groups having 3 to 40 C atoms, each of which may be substituted by one or more radicals $R^{13}$, where one or more non-adjacent $CH_2$ groups may be replaced by $R^{13}C$=$CR^{13}$, C≡C, $Si(R^{13})_2$, $Ge(R^{13})_2$, $Sn(R^{13})_2$, C=O, C=S, C=Se, C=$NR^{13}$, P(=O)($R^{13}$), SO, $SO_2$, $NR^{13}$, O, S or $CONR^{13}$ and where one or more H atoms may be replaced by D, F, Cl, Br, I, CN or $NO_2$, and aromatic or heteroaromatic ring systems having 5 to 40 aromatic ring atoms, which may in each case be substituted by one or more radicals $R^{13}$, and aryloxy or heteroaryloxy groups having 5 to 40 aromatic ring atoms, which may be substituted by one or more radicals $R^{13}$, and a combination of these systems, where two or more adjacent substituents $R^2$ to $R^{11}$ may also form a mono- or polycyclic, aliphatic or aromatic ring system with one another;

with the proviso that at least one of the radicals $R^2$ to $R^{11}$ stands for $B(OR^{13})_2$.

The radical $R^{13}$ in the group $B(OR^{13})_2$ here is preferably identical or different on each occurrence and is selected from the group consisting of H, an aliphatic hydrocarbon radical having 1 to 10 carbon atoms, a $C_{6-20}$-aryl group and a 5- to 25-membered heteroaryl group, where one or more H atoms of the aliphatic hydrocarbon radical, the aryl group and the heteroaryl group may be replaced by F, and where two substituents $R^{13}$ may also form a mono- or polycyclic, aliphatic or aromatic ring system.

This compound is a valuable intermediate in the synthesis of further substituted compounds. It is furthermore also possible to employ the boronic acid derivatives of the formula (XV) directly as active compounds in electronic devices.

The compounds according to the invention described above, in particular compounds which are substituted by reactive leaving groups, such as bromine, iodine, boronic acid or boronic acid ester, can be used as monomers for the preparation of corresponding oligomers, dendrimers or polymers. The oligomerisation or polymerisation here is preferably carried out via the halogen functionality or the boronic acid functionality.

A further subject-matter according to the invention is thus furthermore an oligomer, polymer or dendrimer which contains a compound of the following formula (XVI):

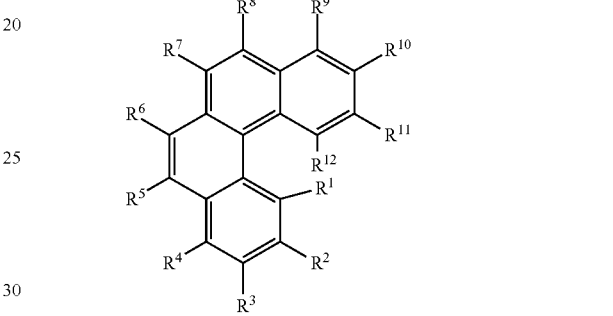

formula (XVI)

where $R^1$ to $R^{12}$ have the same meaning as in formula (I); where one or more of the radicals $R^1$ to $R^{12}$ which are different from Ar, $N(Ar)_2$, $P(Ar)_2$, P(=O)$Ar_2$ or C(=O)Ar are not present and instead represent a bond to the polymer, oligomer or dendrimer or where one of the radicals $R^1$ to $R^{12}$ additionally has a bond to the polymer, oligomer or dendrimer. It is preferred for the benzo[c]phenanthrene unit to have two bonds to the polymer, oligomer or dendrimer, so that the benzo[c]phenanthrene compound itself represents part of the polymer, oligomer or dendrimer backbone. These two bonds can be formed via two of the radicals $R^1$ to $R^{12}$ which are different from Ar, $N(Ar)_2$, $P(Ar)_2$, P(=O)$Ar_2$ or C(=O)Ar or they can also be formed via one or two groups Ar, $N(Ar)_2$, $P(Ar)_2$, P(=O)$Ar_2$ or C(=O)Ar. It is likewise also possible for only one of the radicals $R^1$ to $R^{12}$ which is different from Ar, $N(Ar)_2$, $P(Ar)_2$, P(=O)$Ar_2$ or C(=O)Ar or one of the groups Ar, $N(Ar)_2$, $P(Ar)_2$, P(=O)$Ar_2$ or C(=O)Ar to represent a connection to the polymer. In this case, the benzo[c]phenanthrene compound is located in the side chain or at the limiting end of the polymer, oligomer or dendrimer, i.e. the benzo[c]phenanthrene unit therefore forms a side chain of the oligomer or polymer or is linked in the main chain, depending on the linking of the compound of the formula (XVI).

The polymers, oligomers or dendrimers may be conjugated, partially conjugated or non-conjugated. The oligomers or polymers may be linear, branched or dendritic. In the structures linked in a linear manner, the units of the formula (XVI) can be linked directly to one another or they can be linked to one another via a divalent group, for example via a substituted or unsubstituted alkylene group, via a heteroatom or via a divalent aromatic or heteroaromatic group. In branched and dendritic structures, for example, three or more units of the formula (XVI) can be linked via a trivalent or polyvalent group, for example via a trivalent or polyvalent aromatic or heteroaromatic group, to form a branched or dendritic oligomer or polymer. Preferred linking of the units of the formula (XVI) into the oligomer, dendrimer or polymer takes place via positions 5,8 or 2,11 of the benzo[c]phenanthrene.

The same preferences apply to the recurring units of the formula (XVI) in oligomers, dendrimers and polymers as described above for compounds of the formula (I).

For the preparation of the oligomers or polymers, the monomers according to the invention are homopolymerised or copolymerised with further monomers. Suitable and preferred comonomers are selected from fluorenes (for example in accordance with EP 842208 or WO 00/22026), spirobifluorenes (for example in accordance with EP 707020, EP 894107 or WO 06/061181), para-phenylenes (for example in accordance with WO 92/18552), carbazoles (for example in accordance with WO 04/070772 or WO 04/113468), thiophenes (for example in accordance with EP 1028136), dihydrophenanthrenes (for example in accordance with WO 05/014689 or WO 07/006,383), cis- and trans-indenofluorenes (for example in accordance with WO 04/041901 or WO 04/113412), ketones (for example in accordance with WO 05/040302), phenanthrenes (for example in accordance with WO 05/104264 or WO 07/017,066) or also a plurality of these units. The polymers, oligomers and dendrimers usually also contain further units, for example emitting (fluorescent or phosphorescent) units, such as, for example, vinyltriarylamines (for example in accordance with WO 07/068325) or phosphorescent metal complexes (for example in accordance with WO 06/003000), and/or charge-transport units, in particular those based on triarylamines.

The polymers, oligomers and dendrimers according to the invention have advantageous properties, in particular long lifetimes, high efficiencies and good colour coordinates.

The polymers and oligomers according to the invention are generally prepared by polymerisation of one or more types of monomer, at least one monomer of which results in recurring units of the formula (XVI) in the polymer. Suitable polymerisation reactions are known to the person skilled in the art and are described in the literature. Particularly suitable and preferred polymerisation reactions which result in C—C or C—N linking are the following:
(A) SUZUKI polymerisation;
(B) YAMAMOTO polymerisation;
(C) STILLE polymerisation; and
(D) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225, WO 2004/037887 and WO 2004/037887.

The present invention thus also relates to a process for the preparation of the polymers, oligomers and dendrimers according to the invention, which is characterised in that they are prepared by SUZUKI polymerisation, YAMAMOTO polymerisation, STILLE polymerisation or HARTWIG-BUCHWALD polymerisation. The dendrimers according to the invention can be prepared by processes known to the person skilled in the art or analogously thereto. Suitable processes are described in the literature, such as, for example, in Frechet, Jean M. J.; Hawker, Craig J., "Hyper-branched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6; WO 02/067343 A1 and WO 2005/026144 A1.

The compounds of the formula (I) and the oligomers, dendrimers and polymers according to the invention are suitable for use in electronic devices, in particular in organic electroluminescent devices (OLEDs, PLEDs). Depending on the substitution, the compounds are employed in different functions and layers.

The invention therefore furthermore relates to the use of a compound of the above formula (I) or a compound of the above-mentioned formula (XV) given above or of an oligomer, dendrimer or polymer according to the invention containing a compound of the formula (XVI) in electronic devices, in particular in organic electroluminescent devices.

The invention again furthermore relates to organic electronic devices which comprise at least one compound of the formula (I) or an oligomer, dendrimer or polymer according to the invention, in particular organic electroluminescent devices. These organic electroluminescent devices preferably comprise an anode, a cathode and at least one emitting layer, characterised in that at least one organic layer, which may be an emitting layer or another layer, comprises at least one compound of the formula (I) or at least one oligomer, dendrimer or polymer according to the invention. The preferred compounds of the formulae (II) to (VI) mentioned above are particularly suitable for this purpose.

Apart from the cathode, anode and emitting layer, the organic electroluminescent device may also comprise further layers. These are selected, for example, from in each case one or more hole-injection layers, hole-trans-port layers, electron-blocking layers, electron-transport layers, electron-injection layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. In addition, interlayers may also be present between the individual layers. However, it should be pointed out that each of these layers does not necessarily have to be present.

The person skilled in the art of organic electroluminescence knows which materials he can employ for these further layers. All materials as are used in accordance with the prior art are generally suitable for the further layers, and the person skilled in the art will be able to combine these materials with the materials according to the invention in an organic electroluminescent device without an inventive step.

In a further preferred embodiment of the invention, the organic electroluminescent device comprises a plurality of emitting layers, where at least one organic layer comprises at least one compound of the formula (I) or an oligomer, dendrimer or polymer according to the invention. These emission layers particularly preferably have in total a plurality of emission maxima between 380 nm and 750 nm, resulting overall in white emission, i.e. various emitting compounds which are able to fluoresce or phosphoresce and which emit blue and yellow, orange or red light are used in the emitting layers. The compound of the formula (I) here is preferably used in a blue- and/or green-emitting layer. Particular preference is given to three-layer systems, i.e. systems having three emitting layers, where at least one of these layers comprises at least one compound of the formula (I) and where the three layers exhibit blue, green and orange or red emission (for the basic structure see, for example, WO 05/011013). Emitters which have broad-band emission and thus exhibit white emission are likewise suitable for white emission.

In an embodiment of the invention, the compounds of the formula (I) are employed as host material for fluorescent dopants, in particular for blue- or green-fluorescent dopants.

In this case, one or more groups Ar are preferably selected from simple or condensed aryl or heteroaryl groups, in particular phenylanthryl or 1- or 2-naphthylanthryl. One or more groups Ar are furthermore preferably selected from condensed arylene groups, in particular naphthyl, anthracene and/or benzanthracene substituted.

A host material in a system comprising host and dopant is taken to mean the component which is present in the system in the higher proportion. In a system comprising one host and a plurality of dopants, the host is taken to mean the component whose proportion in the mixture is the highest.

The proportion of the host material of the formula (I) in the emitting layer is between 50.0 and 99.9% by vol., preferably between 80.0 and 99.5% by vol., particularly preferably between 90.0 and 99.0% by vol. Correspondingly, the proportion of the dopant is between 0.01 and 50.0% by vol., preferably between 0.5 and 20.0% by vol. and particularly preferably between 1.0 and 10.0% by vol.

Preferred dopants are selected from the class of the monostyrylamines, the distyrylamines, the tristyrylamines, the tetrastyrylamines, the styryl-phosphines, the styryl ethers and the arylamines. A monostyrylamine is taken to mean a compound which contains one substituted or unsubstituted styryl group and at least one, preferably aromatic, amine. A distyryl-amine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. For the purposes of this invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyrenamines, pyrenediamines, chrysenamines and chrysenediamines are defined analogously thereto, where the diarylamino groups are preferably bonded to the pyrene in the 1-position or in the 1,6-position. Further preferred dopants are selected from indenofluorenamines or indenofluorenediamines, for example in accordance with WO 06/122630, benzoindenofluorenamines or benzo-indenofluorenediamines, for example in accordance with WO 08/006449, and dibenzoindenofluorenamines or dibenzoindenofluorenediamines, for example in accordance with WO 07/140,847. Examples of dopants from the class of the styrylamines are substituted or unsubstituted tristilbenamines or the dopants described in WO 06/000388, WO 06/058737, WO 06/000389, WO 07/065549 and WO 07/115610. Preference is furthermore given to the condensed hydrocarbons disclosed in the unpublished application DE 102008035413.9. Preference is again furthermore given to the dopants according to the invention described below.

Suitable dopants are furthermore the structures depicted in the following table, and the derivatives of these structures disclosed in JP 06/001973, WO 04/047499, WO 06/098080, WO 07/065,678, US 2005/0260442 and WO 04/092111.

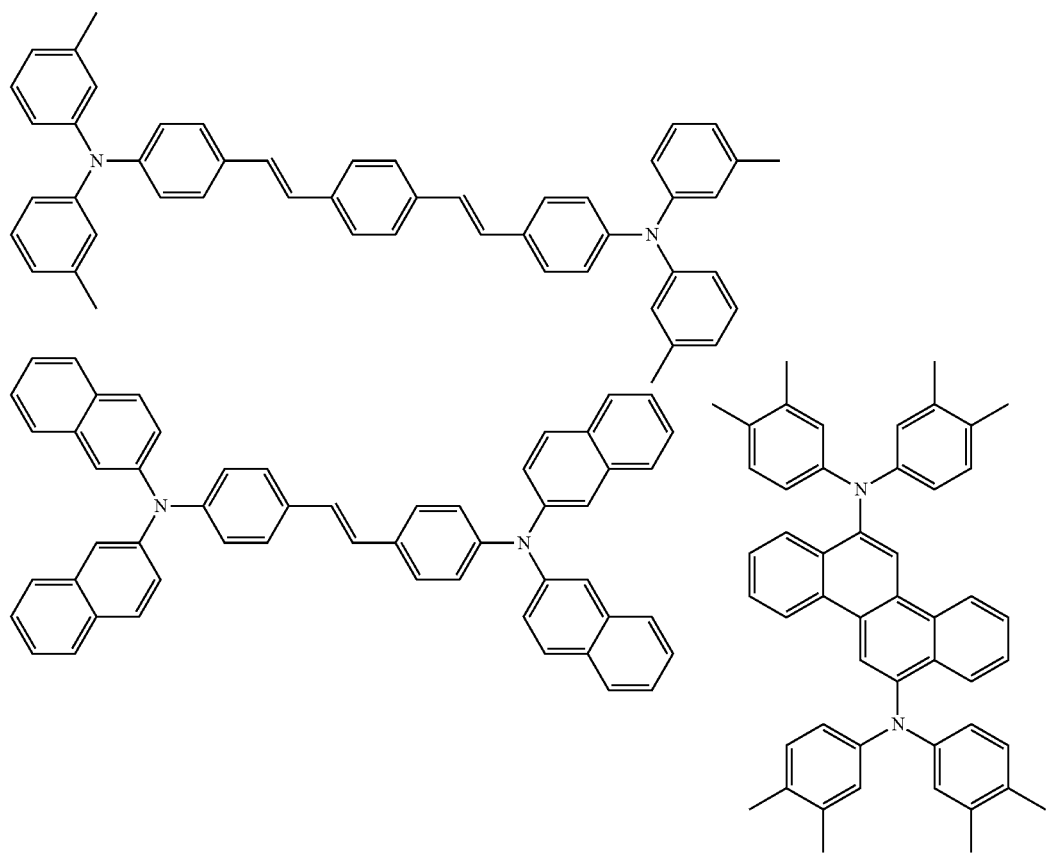

-continued

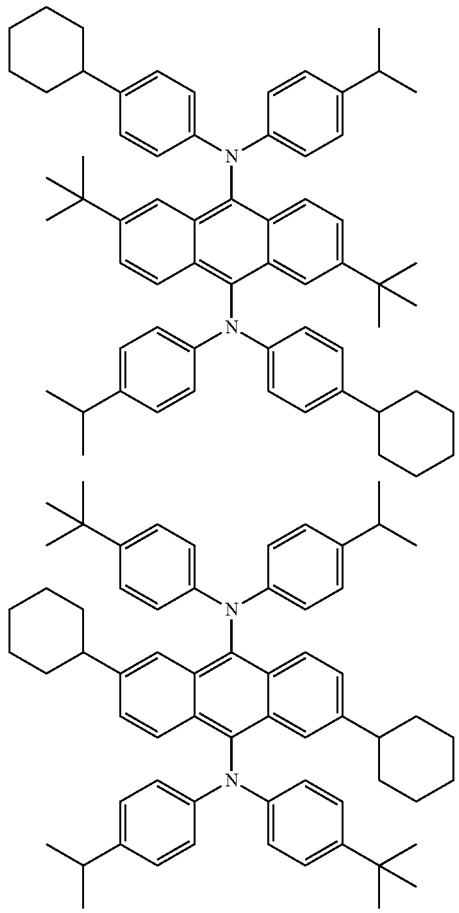
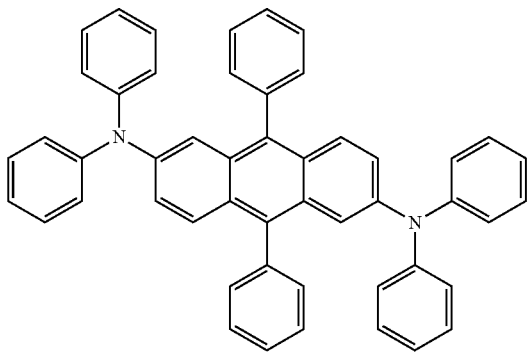

In a further embodiment of the invention, the compounds of the formula (I) are employed as emitting materials. The compounds are particularly suitable as emitting compounds If at least one group Ar contains at least one diarylamino unit.

The proportion of the compound of the formula (I) in the mixture of the emitting layer is between 0.1 and 50.0% by vol., preferably between 0.5 and 20.0% by vol., particularly preferably between 1.0 and 10.0% by vol. Correspondingly, the proportion of the host material is between 50.0 and 99.9% by vol., preferably between 80.0 and 99.5% by vol., particularly preferably between 90.0 and 99.0% by vol.

Suitable host materials for this purpose are materials from various classes of substance. Preferred host materials are selected from the classes of the oligoarylenes (for example 2, 2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052) or the benzanthracenes (for example in accordance with WO 08/145,239). Suitable host materials are furthermore also the benzo[c]phenanthrene compounds according to the invention described above. Apart from the compounds according to the invention, particularly preferred host materials are selected from the classes of the oligoarylenes, containing naphthalene, anthracene, benzanthracene and/or pyrene, or atropisomers of these compounds, the oligoarylenevinylenes, the ketones, the phosphine oxides and the sulfoxides. Apart from the benzo[c]phenanthrene compounds according to the invention, very particularly preferred host materials are selected from the classes of the oligoarylenes, containing anthracene, benzanthracene and/or pyrene, or atropisomers of these compounds. For the purposes of this invention, an oligoarylene is intended to be taken to mean a compound in which at least three aryl or arylene groups are bonded to one another.

Suitable host materials are furthermore, for example, the materials depicted in the following table, and derivatives of these materials, as disclosed in WO 04/018587, WO 08/006, 449, U.S. Pat. No. 5,935,721, US 2005/0181232, JP 2000/273056, EP 681019, US 2004/0247937 and US 2005/0211958.

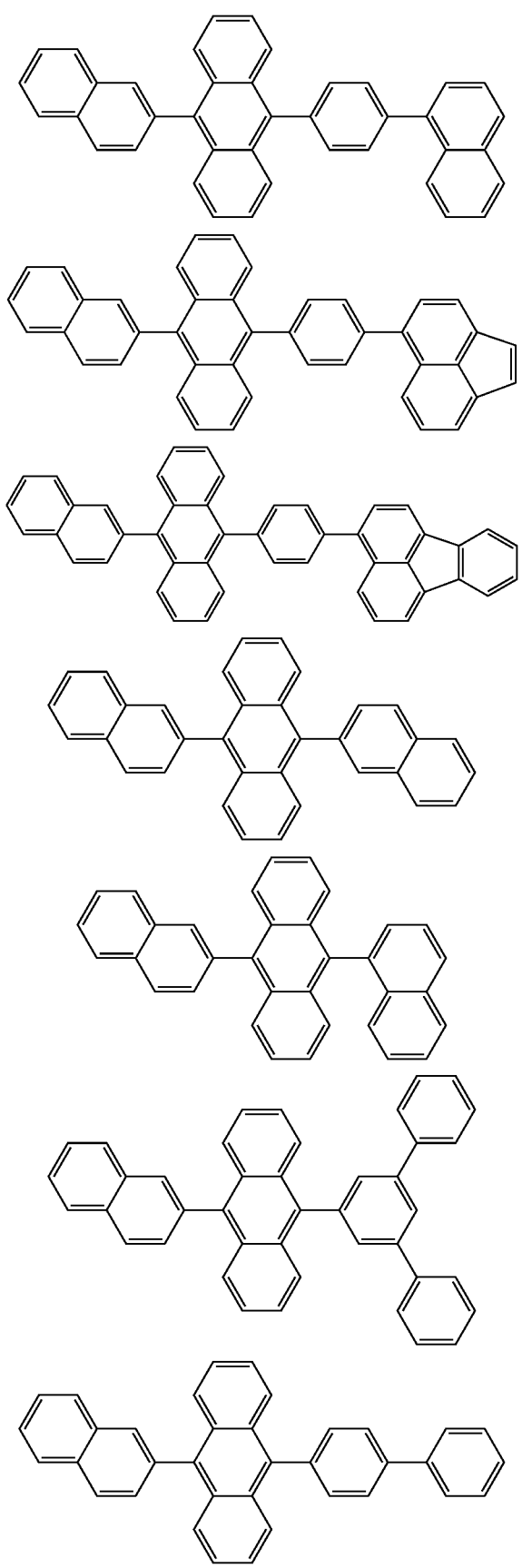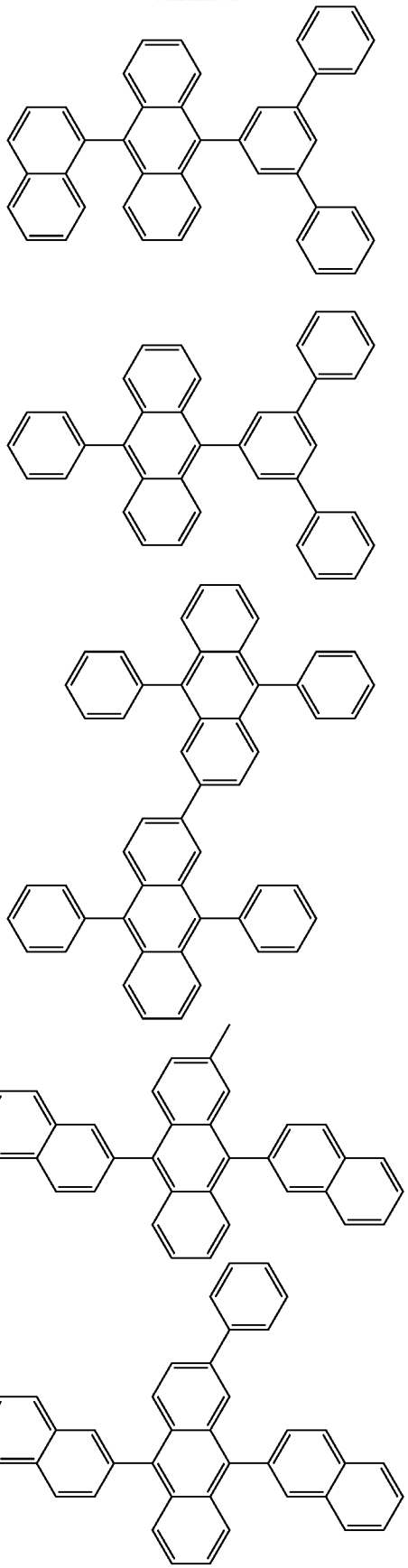

In still a further embodiment of the invention, the compounds of the formula (I) are employed as hole-transport material or as hole-injection material. The compounds are then preferably substituted by at least one group N(Ar)$_2$, in particular by a group of the formulae (XIII) and/or (XIV). The compound is preferably employed in a hole-transport or hole-injection layer. For the purposes of this invention, a hole-injection layer is a layer which is directly adjacent to the anode. For the purposes of this invention, a hole-transport layer is a layer which is located between a hole-injection layer and an emission layer. If the compounds of the formula (I) are used as hole-transport or hole-injection material, it may be preferred for them to be doped with electron-acceptor compounds, for example by F$_4$-TCNQ or by compounds as described in EP 1476881 or EP 1596445.

In still a further embodiment of the invention, the compounds of the formula (I) are employed as electron-transport material. It is preferred here for one or more substituents R$^2$ to R$^{11}$ to contain at least one unit C=O, P(=O) and/or SO$_2$, which is preferably bonded directly to the benzo[c]-phenanthrene. It is likewise preferred here for one or more substituents R$^2$ to R$^{11}$ or one or more groups Ar to contain an electron-deficient heterocycle or to stand for an electron-deficient heterocycle, such as, for example, imidazole, pyrazole, thiazole, benzimidazole, triazine, benzothiazole, triazole, oxadiazole, benzothiadiazole, phenanthroline, etc., in particular with groups of the formulae (VIII), (IX), (X), (XI) and/or (XII). It may furthermore be preferred for the compound to be doped by electron-donor compounds.

Apart from the materials according to the invention, suitable charge-trans-port materials, as can be used in the hole-injection or hole-transport layer or in the electron-transport layer of the organic electroluminescent device according to the invention, are, for example, the compounds disclosed in Y. Shirota et al., *Chem. Rev.* 2007, 107(4), 953-1010, or other materials as employed in these layers in accordance with the prior art.

Examples of preferred hole-transport materials which can be used in a hole-transport or hole-injection layer in the electroluminescent device according to the invention are indenofluorenamines and derivatives (for example in accordance with WO 06/122630 or WO 06/100896), the amine derivatives disclosed in EP 1661888, hexaazatriphenylene derivatives (for example in accordance with WO 01/049806), amine derivatives containing condensed aromatic rings (for example in accordance with U.S. Pat. No. 5,061,569), the amine derivatives disclosed in WO 95/09147, monobenzoindeno-fluorenamines (for example in accordance with WO 08/006,449) or dibenzoindenofluorenamines (for example in accordance with WO 07/140,847). Hole-transport and hole-injection materials which are furthermore suitable are derivatives of the compounds depicted above, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569.

Suitable hole-transport or hole-injection materials are furthermore, for example, the materials shown in the following table.

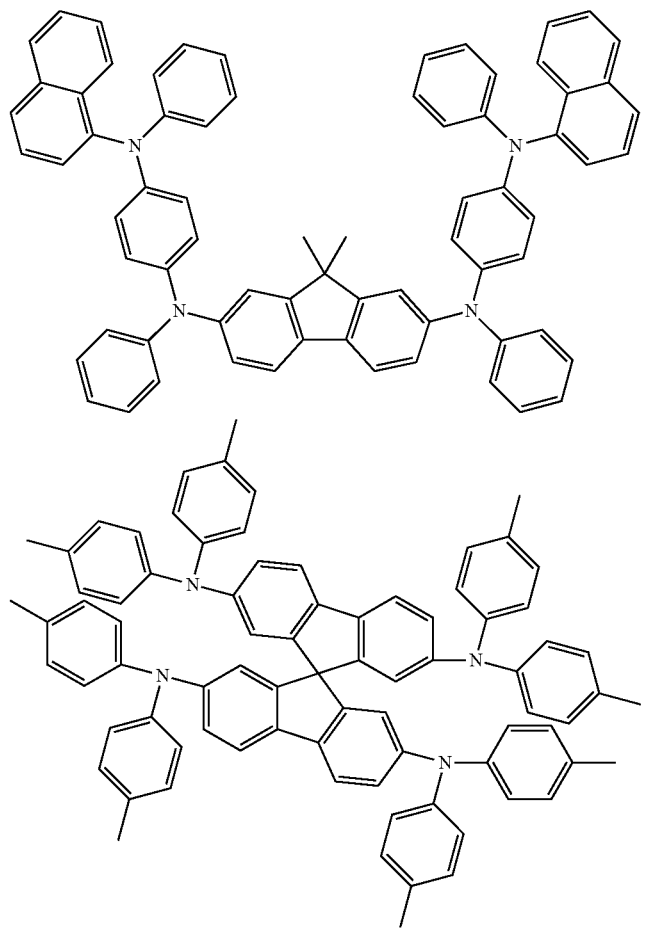

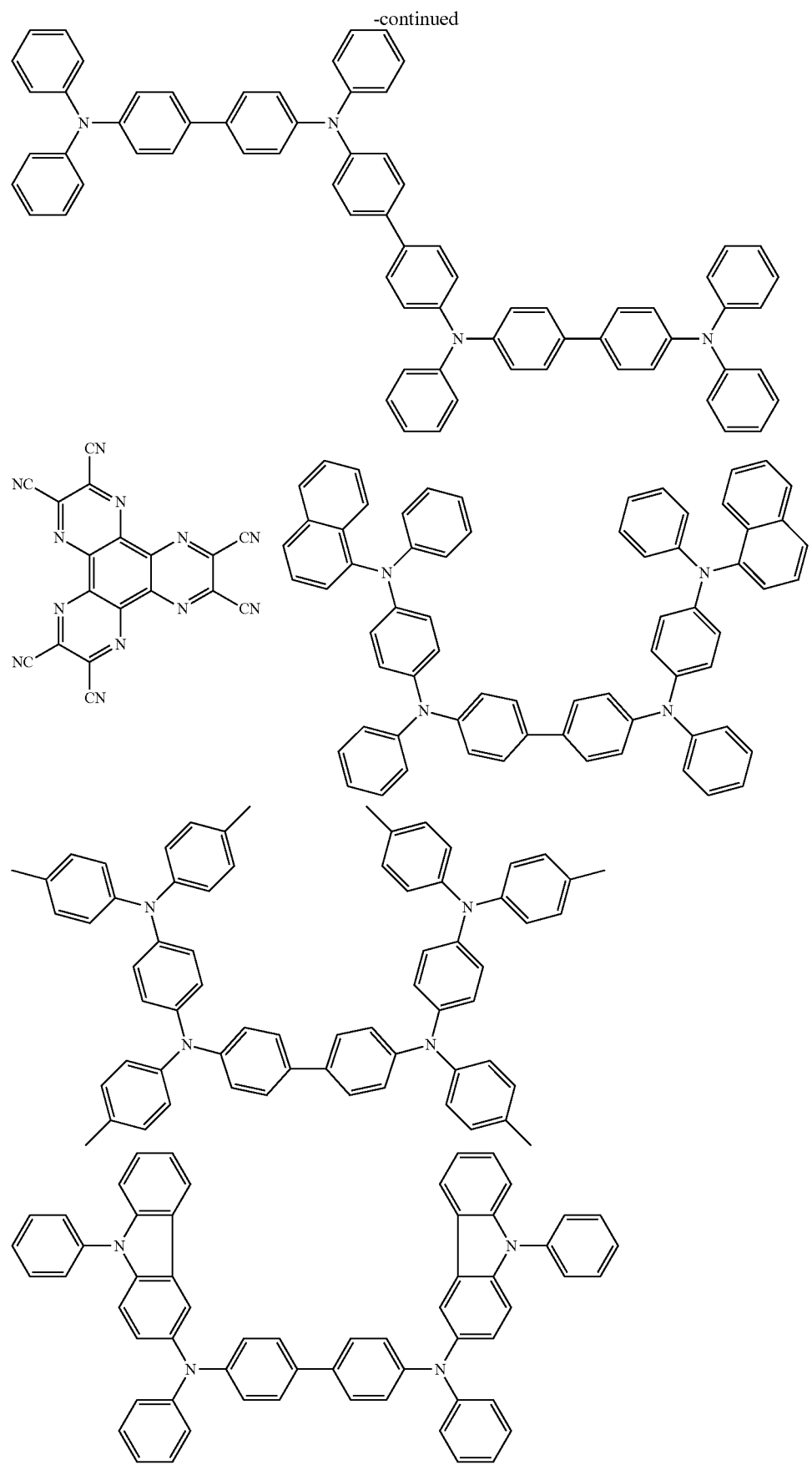

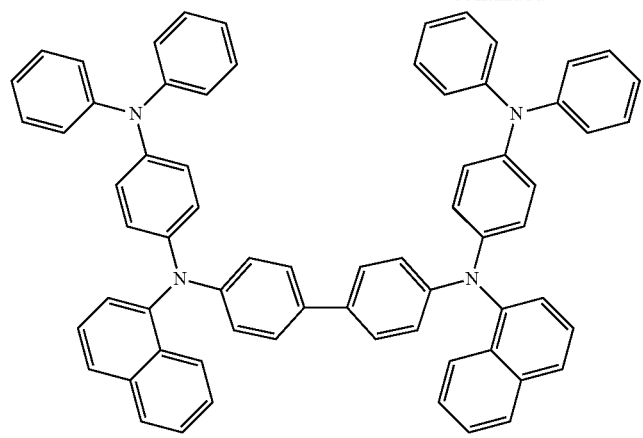
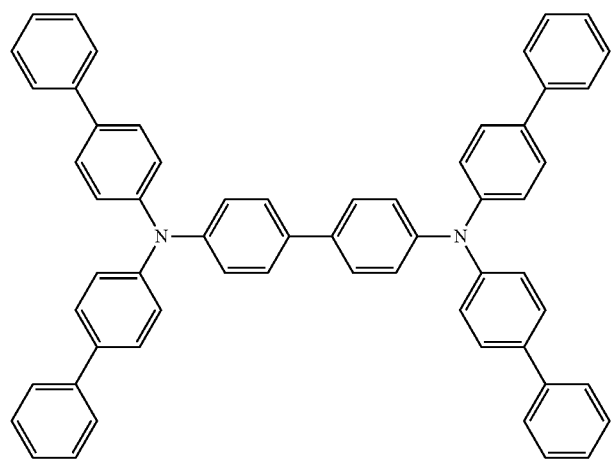
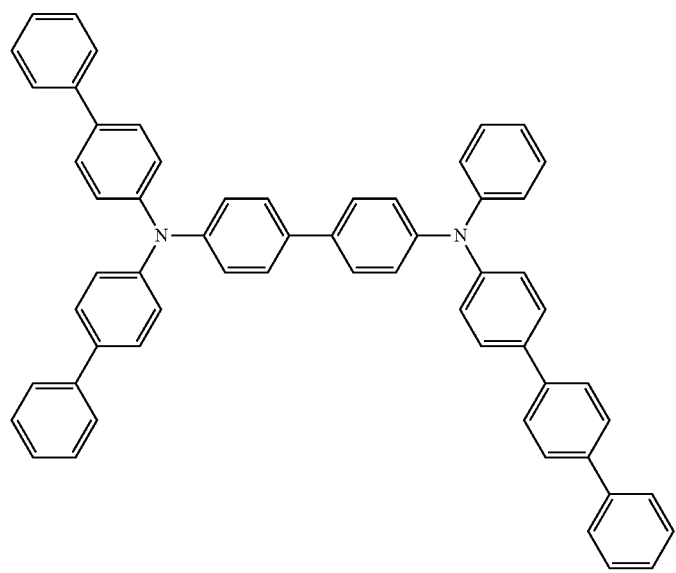

-continued
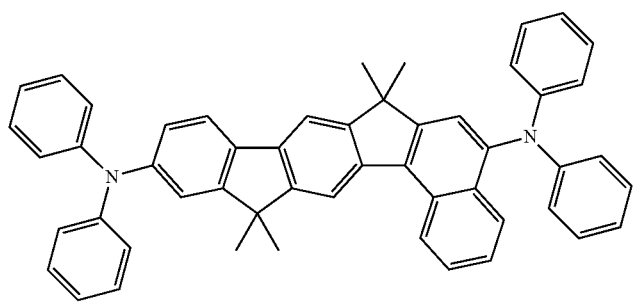
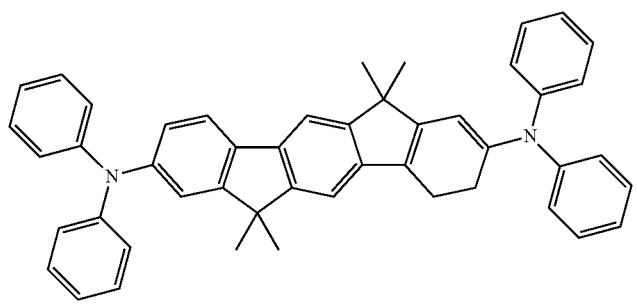
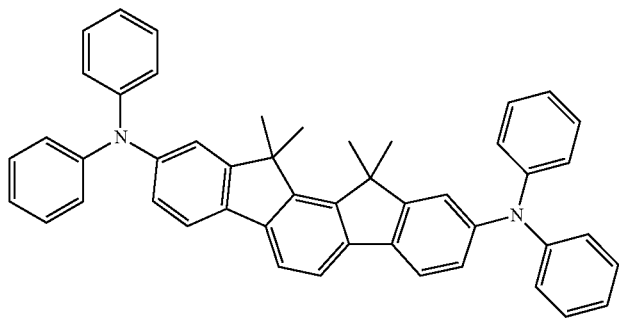
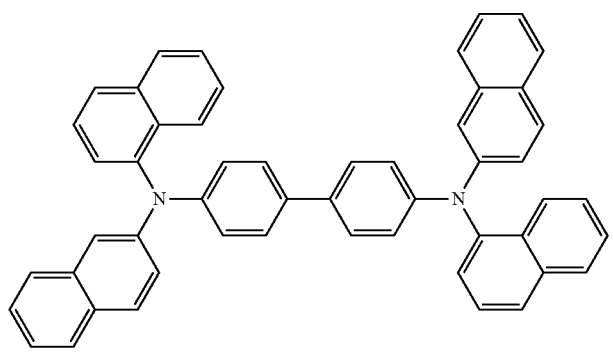
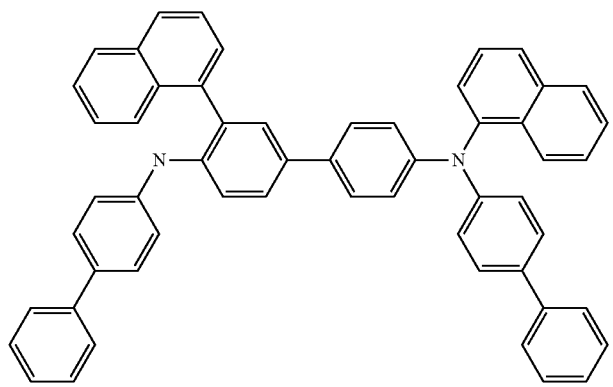

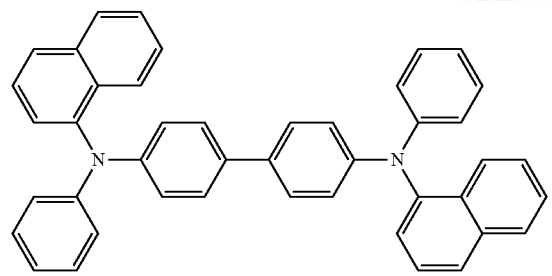
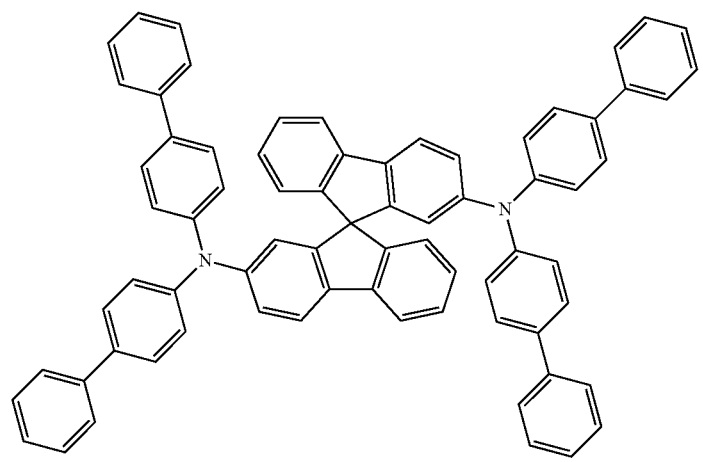
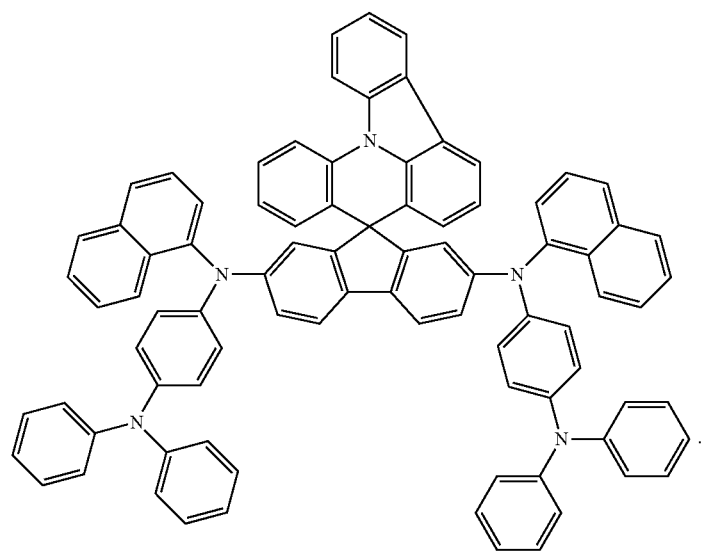

Suitable electron-transport or electron-injection materials which can be used in the electroluminescent device according to the invention are, for example, the materials shown in the following table. Electron-transport and electron-injection materials which are furthermore suitable are derivatives of the compounds depicted above, as disclosed in JP 2000/053957, WO 03/060956, WO 04/028217 and WO 04/080975.

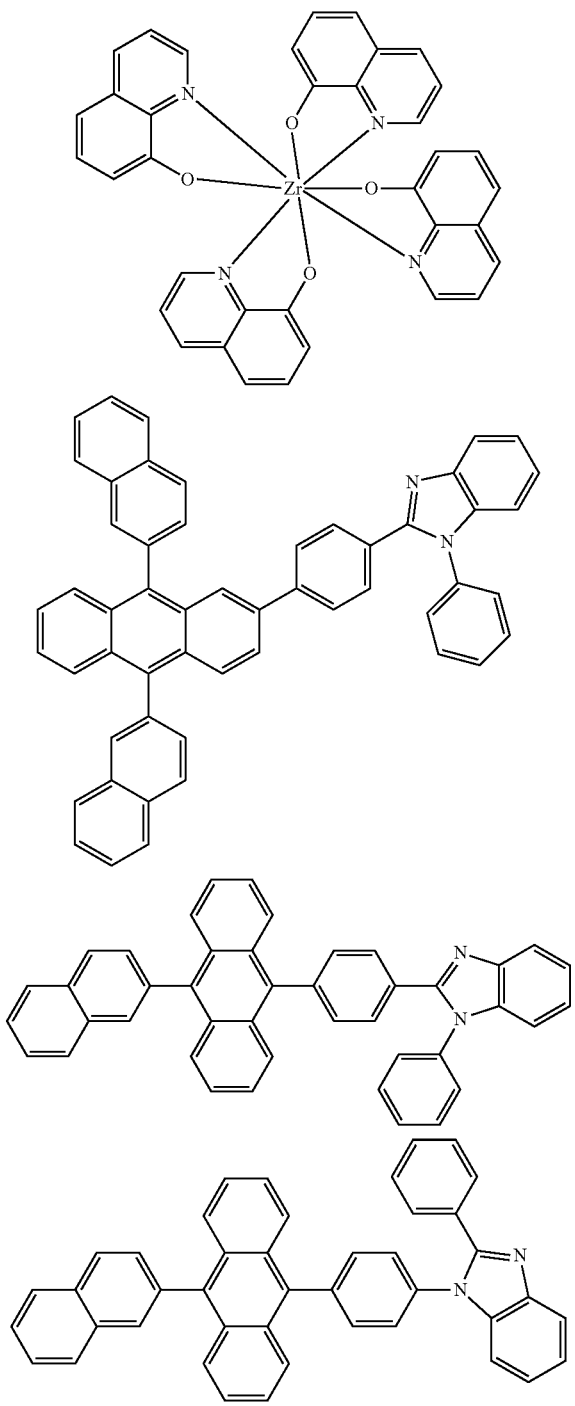

Recurring units of the formula (XVI) can also be employed in polymers, either as polymer backbone, as emitting unit, as hole-transporting unit and/or as electron-transporting unit. The preferred substitution patterns here correspond to those described above.

Preference is furthermore given to an organic electroluminescent device, characterised in that one or more layers are applied by means of a sublimation process, in which the materials are vapour-deposited in vacuum sublimation units at an initial pressure of less than $10^{-5}$ mbar, preferably less than $10^{-6}$ mbar. However, it is also possible here for the initial pressure to be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds are necessary for this purpose. High solubility can be achieved through suitable substitution of the compounds.

The compounds according to the invention preferably have high efficiency and a long lifetime on use in organic electroluminescent devices, making the organic electroluminescent devices according to the invention very suitable for use in high-quality and long-lived displays. Furthermore, the compounds according to the invention have high thermal stability and a high glass transition temperature and can be sublimed without decomposition.

The present application text is directed to the use of the compounds according to the invention in relation to OLEDs and PLEDs and the corresponding displays. In spite of this restriction of the description, it is possible for the person skilled in the art, without further inventive step, also to employ the compounds according to the invention in other electronic devices, for example in organic field-effect transistors (O-FETs), organic thin-film transistors (O-TFTs), organic light-emitting transistors (O-LETs), organic integrated circuits (O-ICs), organic solar cells (O-SCs), organic field-quench devices (O-FQDs), light-emitting electrochemical cells (LECs), organic laser diodes (O-lasers) or organic photoreceptors.

The present invention likewise relates to the use of the compounds according to the invention in the corresponding devices and to these devices themselves.

EXAMPLES

The following syntheses are carried out, unless indicated otherwise, under a protective-gas atmosphere in dried solvents. The starting compounds used can be, for example, 5-bromobenzo[c]phenanthrene (Tetrahedron Letters 1983, 45(24), 4903-4906) or 5,8-dibromobenzo[c]phenanthrene (Journal of Organic Chemistry 1989, 54(13), 3091-6).

Example 1

Synthesis of 2,11-bis(naphth-1-yl)benzo[c]phenanthrene a) Synthesis of di-p-bromobenzylidene acetone

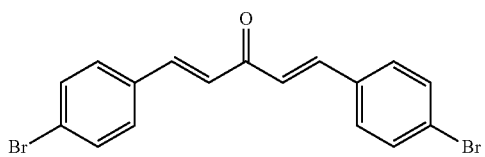 [SMILES: O=C(/C=C/c1ccc(Br)cc1)/C=C/c1ccc(Br)cc1]

296 g (1600 mmol) of p-bromobenzaldehyde is added dropwise to a solution of 52.8 g (800 mmol) of potassium hydroxide (85%) and 58.9 ml (800 mmol) of acetone in 1.6 l of water and 2 l of ethanol, and the mixture is stirred overnight at RT. The precipitated solid is filtered off with suction, washed with 3 l of water and dried in vacuo. Yield: 284 g (826 mmol), 91%.

b) Synthesis of 1,5-di-(p-bromobenzyl)pentan-3-one

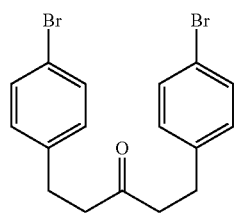 [SMILES: O=C(CCc1ccc(Br)cc1)CCc1ccc(Br)cc1]

217 g (555 mmol) of di-p-bromobenzylidene acetone are suspended in a solution of 20 ml of glacial acetic acid in 1 l of ethyl acetate, 14 g of Pd/C (5%) are added, and the mixture is stirred in a 2.8 l autoclave at an $H_2$ pressure of 4 bar. When the uptake of hydrogen is complete (about 30 min), the mixture is stirred under $H_2$ pressure for a further 2 h. The catalyst is filtered off, and the filtrate is washed with 200 ml of saturated $NaHCO_3$ solution and 200 ml of water. The solvent is removed, and the residue is dried, giving about 24% of alcohol and about 76% of the ketone.

The reaction mixture is dissolved in 400 ml of diethyl ether. A solution of 12.8 g (42.8 mmol) of sodium dichromate dihydrate and 10 ml of conc. sulfuric acid in 60 ml of water is slowly added dropwise at 0° C., and the mixture is stirred overnight at RT. The phases are separated, the aqueous phase is washed with 100 ml of ether each time, and the combined organic phases are washed with 100 ml of saturated $NaHCO_3$ solution and 100 ml of water each time and dried over sodium sulfate. Yield: 190 g (480 mmol), 87%.

c) Synthesis of 1,1-di-(p-bromophenylethyl)epoxyethane

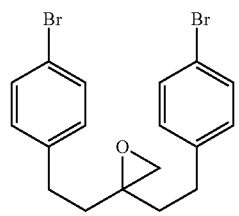 [SMILES: Brc1ccc(CCC2(CCc3ccc(Br)cc3)CO2)cc1]

21.4 g (87.3 mmol) of trimethylsulfoxonium iodide are added to 2.4 g (100 mmol) of sodium hydride under argon, and 50 ml of DMSO are added dropwise at 0° C. When the evolution of hydrogen is complete, the mixture is warmed to RT and stirred for 0.5 h. A solution of 29 g (73.9 mmol) of 1,5-di-(p-bromobenzyl)pentan-3-one in 50 ml of DMSO is added dropwise to this mixture, and the mixture is stirred for 4.5 h. The reaction mixture is poured into 125 ml of water and extracted three times with 50 ml of chloroform each time. The combined organic phases are washed four times with 50 ml of water, the solvent is removed by distillation, and the residue is dried in vacuo. Yield: 27 g (69 mmol), 92%.

d) Synthesis of 2,11-dibromo-5,6,6a,7,8,12b-hexahydrobenzo-[c]phenanthrene

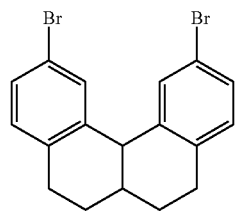 [SMILES: Brc1ccc2c(c1)C1c3cc(Br)ccc3CCC1CC2]

37 ml (337 mmol) of titanium tetrachloride are added dropwise to a solution of 48 g (118 mmol) of 1,1-di-(p-bromophenylethyl)epoxyethane in 250 ml of chlorobenzene, and the mixture is stirred at 80° C. for 18 h. The reaction mixture is carefully poured into 100 ml of ice-water, the phases are separated, and the aqueous phase is extracted three times with 70 ml of chloroform. The combined organic phases are washed with 100 ml of saturated NaCl solution and 100 ml of $NaHCO_3$ solution and dried over sodium sulfate, the solvent is stripped off, and the residue is recrystallised from ethanol. Yield: 43 g (110 mmol), 94%.

e) Synthesis of 2,11-dibromobenzo[c]phenanthrene

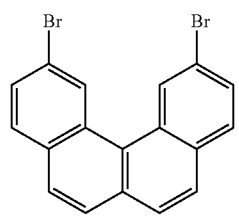 [SMILES: Brc1ccc2ccc3ccc4ccc(Br)cc4c3c2c1]

46 g (118 mmol) of 2,11-dibromo-5,6,6a,7,8,12b-hexahydrobenzo[c]phenanthrene and 80.6 g (355 mmol) of DDQ are heated under reflux for 30 h in 300 ml of toluene. After the reaction mixture has been cooled to room temperature, the precipitated hydroquinone is filtered off and washed twice with 50 ml of toluene each time. The solvent is stripped off from the combined organic phases, and the residue is dried in vacuo. The crude product is sublimed at 190° C. and 0.01 mbar, and the sublimate is recrystallised from isopropanol. Yield: 19.6 g (110 mmol), 43%.

f) Synthesis of 2,11-bis(naphth-1-yl)benzo[c]phenanthrene

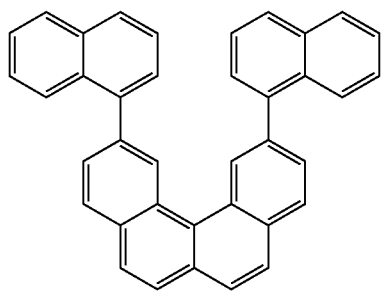 [SMILES: c1ccc2c(-c3ccc4ccc5ccc6ccc(-c7cccc8ccccc78)cc6c5c4c3)cccc2c1]

913 mg (3 mmol) of tri-o-tolylphosphine and then 112 mg (0.5 mmol) of palladium(II) acetate are added to a vigorously stirred suspension of 19.3 g (50 mmol) of 2,11-dibromobenzo[c]phenanthrene, 22.4 g (130 mmol) of 1-naphthaleneboronic acid and 25.5 g (120 mmol) of tripotassium phosphate in a mixture of 300 ml of toluene, 100 ml of dioxane and 400 ml of water, and the mixture is subsequently heated under reflux for 16 h. After the mixture has been cooled, the precipitated solid is filtered off with suction, washed three times with 50 ml of toluene, three times with 50 ml of ethanol:water (1:1, v:v) and three times with 100 ml of ethanol and recrystallised three times from DMF (about 10 ml/g). Yield: 14.4 g (30 mmol), 60.0%, purity 99.9% (HPLC).

Example 2

Synthesis of 9-(phenyl)-10-(benzo[c]phenanthren-5-yl)anthracene a) Synthesis of benzo[c]phenanthrene-5-boronic acid

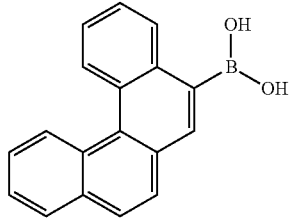 [SMILES: OB(O)c1cc2ccc3ccccc3c2c2ccccc12]

52 ml (130 mmol) of n-buthyllithium (2.5 M in n-hexane) are added dropwise to a suspension of 30.7 g (100 mmol) of 5-bromobenzo[c]phenanthrene in 1000 ml of THF at −78° C. with vigorous stirring, and the mixture is stirred for a further 2 h. 16.7 ml (150 mmol) of trimethyl borate are added to the red solution in one portion with vigorous stirring, the mixture is stirred at −78° C. for a further 30 min., then warmed to room temperature over the course of 3 h, 300 ml of water are added, and the mixture is stirred for 30 min. The organic phase is separated off and evaporated to dryness in vacuo. The solid is taken up in 100 ml of n-hexane, filtered off with suction, washed once with 100 ml of hexane and dried in vacuo. Yield: 24.8 g (91 mmol), 91%, purity about 90% (NMR) of boronic acid, with varying amounts of boronic anhydride and boronic acid. The boronic acid can be used in this form without further purification.

b) Synthesis of 9-(phenyl)-10-(benzo[c]phenanthren-5-yl)anthracene

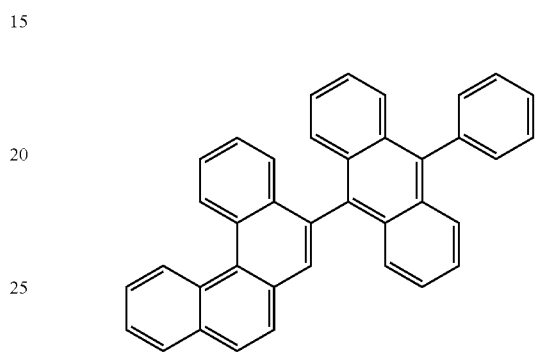

913 mg (3 mmol) of tri-o-tolylphosphine and then 112 mg (0.5 mmol) of palladium(II) acetate are added to a vigorously stirred suspension of 16.7 g (50 mmol) of 9-bromo-10-(phenyl)anthracene, 14.9 g (55 mmol) of benzo-[c]phenanthrene-5-boronic acid and 25.5 g (120 mmol) of tripotassium phosphate in a mixture of 300 ml of toluene, 100 ml of dioxane and 400 ml of water, and the mixture is subsequently heated under reflux for 16 h. After the mixture has been cooled, the precipitated solid is filtered off with suction, washed three times with 50 ml of toluene, three times with 50 ml of ethanol:water (1:1, v:v) and three times with 100 ml of ethanol and recrystallised three times from DMF (about 7 ml/g). Yield: 16.0 g (34 mmol), 67.8%, purity 99.9% (HPLC).

Example 3

Synthesis of 9-(naphth-2-yl)-10-(benzo[c]phenanthren-5-yl)anthracene

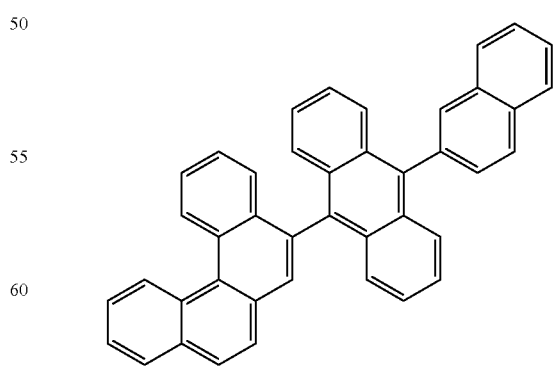

913 mg (3 mmol) of tri-o-tolylphosphine and then 112 mg (0.5 mmol) of palladium(II) acetate are added to a vigorously stirred suspension of 19.2 g (50 mmol) of 9-bromo-10-(2- naphthyl)anthracene, 14.9 g (55 mmol) of benzo[c]phenanthrene-4-boronic acid and 25.5 g (120 mmol) of tripotassium phosphate in a mixture of 300 ml of toluene, 100 ml of dioxane and 400 ml of water, and the mixture is subsequently heated under reflux for 16 h. After the mixture has been cooled, the precipitated solid is filtered off with suction, washed three times with 50 ml of toluene, three times with 50 ml of ethanol:water (1:1, v:v) and three times with 100 ml of ethanol, recrystallised three times from DMF (about 10 ml/g). Yield: 15.3 g (29 mmol), 58.8%, purity 99.9% (HPLC).

Example 4

Synthesis of 5-(diphenylamino)benzo[c]phenanthrene

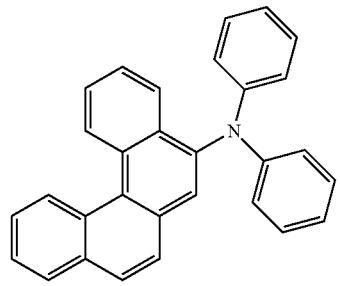 [SMILES: c1ccc(N(c2ccccc2)c2cc3ccc4ccccc4c3c3ccccc23)cc1]

190 μl (1 mmol) of chlorodi-tert-butylphosphine and then 112 mg (0.5 mmol) of palladium(II) acetate are added to a suspension of 15.3 g (50 mmol) of 5-bromobenzo[c]phenanthrene, 10.2 g (60 mmol) of diphenylamine and 7.7 g (80 mmol) of sodium tert-butoxide in 500 ml of toluene, and the mixture is subsequently heated under reflux for 5 h. After the mixture has been cooled to 60° C., 500 ml of water are added, the organic phase is separated off, filtered through silica gel, evaporated virtually to dryness at 80° C. in vacuo, and 300 ml of ethanol are then added. After cooling, the solid is filtered off with suction. The product is purified by recrystallisation from dioxane five times (about 8 ml/g). Yield: 12.6 g (32 mmol), 64.1%, purity 99.9% (HPLC).

Example 5

Synthesis of 1-phenyl-2-(5-benzo[c]phenanthren-4-ylphenyl)benzimidazole

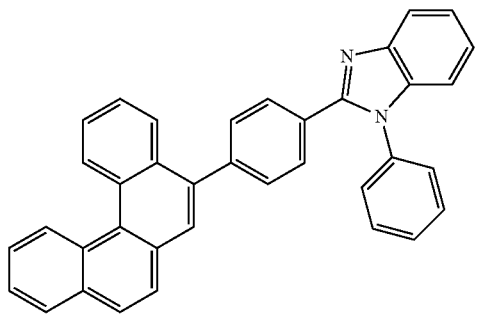 [SMILES: c1ccc(-n2c(-c3ccc(-c4cc5ccc6ccccc6c5c5ccccc45)cc3)nc3ccccc32)cc1]

913 mg (3 mmol) of tri-o-tolylphosphine and then 112 mg (0.5 mmol) of palladium(II) acetate are added to a vigorously stirred suspension of 17.5 g (50 mmol) of 1-phenyl-2-(4-bromophenyl)benzimidazole, 14.9 g (55 mmol) of benzo[c]phenanthrene-5-boronic acid and 25.5 g (120 mmol) of tripotassium phosphate in a mixture of 300 ml of toluene, 100 ml of dioxane and 400 ml of water, and the mixture is subsequently heated under reflux for 16 h. After the mixture has been cooled, the precipitated solid is filtered off with suction, washed three times with 50 ml of toluene, three times with 50 ml of ethanol:water (1:1, v:v) and three times with 100 ml of ethanol and recrystallised three times from DMF (about 7 ml/g). Yield: 16.8 g (34 mmol), 67.8%, purity 99.9% (HPLC).

Example 6

Synthesis of 5,8-bis(naphth-1-yl)benzo[c]phenanthrene

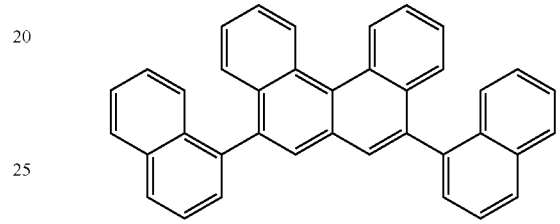

913 mg (3 mmol) of tri-o-tolylphosphine and then 112 mg (0.5 mmol) of palladium(II) acetate are added to a vigorously stirred suspension of 15.3 g (50 mmol) of 5,8-dibromobenzo[c]phenanthrene, 22.4 g (130 mmol) of 1-naphthaleneboronic acid and 25.5 g (120 mmol) of tripotassium phosphate in a mixture of 300 ml of toluene, 100 ml of dioxane and 400 ml of water, and the mixture is subsequently heated under reflux for 16 h. After the mixture has been cooled, the precipitated solid is filtered off with suction, washed three times with 50 ml of toluene, three times with 50 ml of ethanol:water (1:1, v:v) and three times with 100 ml of ethanol, recrystallised three times from DMF (about 10 ml/g). Yield: 14.8 g (31 mmol), 64.0%, purity 99.9% (HPLC).

Examples 7-12

Production of OLEDs

OLEDs according to the invention are produced by a general process in accordance with WO 04/058911, which is adapted to the circumstances described here (layer-thickness variation, materials used).

The results for various OLEDs are presented in Examples 7 to 12 below. Glass plates coated with structured ITO (indium tin oxide) form the substrates of the OLEDs. For improved processing, 20 nm of PEDOT (poly(3,4-ethylenedioxy-2,5-thiophene), spin-coated from water, purchased from H. C. Starck, Goslar, Germany) are applied to the substrate. The OLEDs consist of the following layer sequence: substrate/PEDOT 20 nm/HIL1 5 nm/hole-transport layer (HTM1) 140 nm/hole-transport layer (HTM2) 20 nm/emission layer (EML) 30 nm/electron-transport layer (ETM) 20 nm and finally a cathode.

The materials, apart from the PEDOT, are applied by thermal vapour deposition in a vacuum chamber. The emission layer here always consists of a matrix material (host=H) and a dopant (D), with which the host is admixed by co-evaporation. The cathode is formed by an LiF layer with a thickness of 1 nm and an aluminium layer with a thickness of 100 nm deposited on top. Table 1 shows the chemical structures of the materials used to build up the OLEDs. H1 and ETM1 here are materials in accordance with the prior art, H2 and ETM2 are examples of compounds according to the invention.

The OLEDs are characterised by standard methods. For this purpose, the electroluminescence spectra, the current efficiency (measured in cd/A), the power efficiency (measured in lm/W) as a function of the luminance, calculated from current-voltage-luminance characteristic lines (IUL characteristic lines), and the lifetime are determined. The lifetime is defined as the time after which the luminance has dropped to half from an initial value (6000 cd/m$^2$).

Compared with the prior art, compound H2 is distinguished over compound H1 in accordance with the prior art by an improved lifetime and by improved colour on use as matrix (see Examples 7-12 in Table 2).

Furthermore, higher current efficiencies (measured in cd/A) and lower voltages arise on use of compound ETM2 as electron-transport material, (see Examples 11 and 12 from Table 2).

TABLE 1

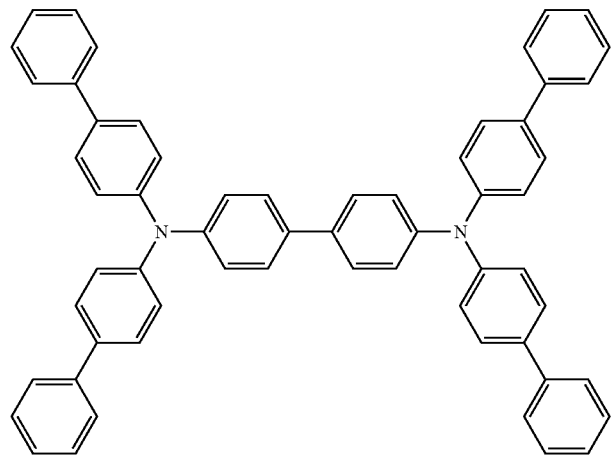 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

HTM2

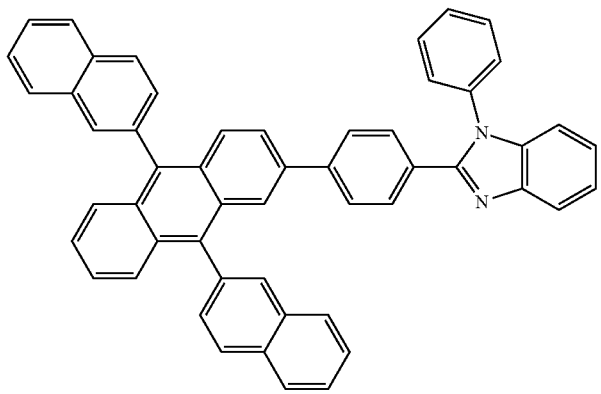 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

ETM1

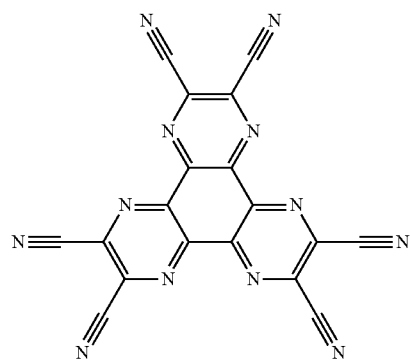 [SMILES: N#Cc1nc2c3nc(C#N)c(C#N)nc3c3nc(C#N)c(C#N)nc3c2nc1C#N]

HIL1

TABLE 1-continued
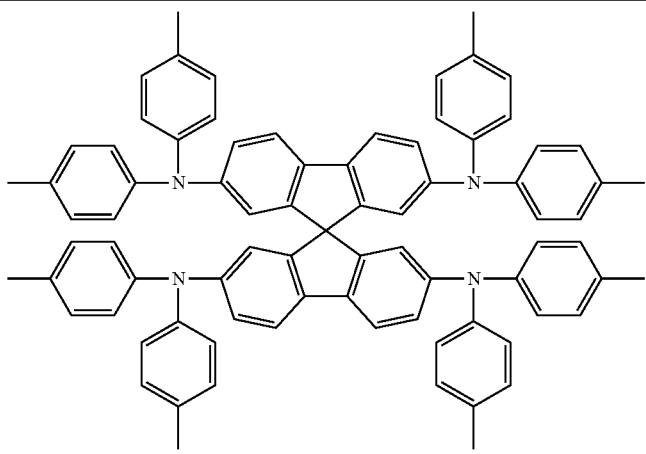
HTM1
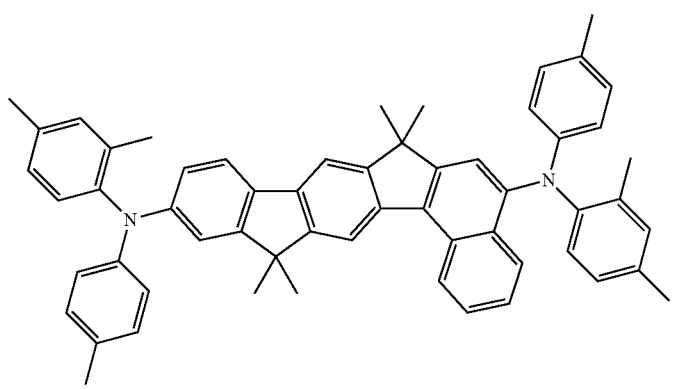
D1
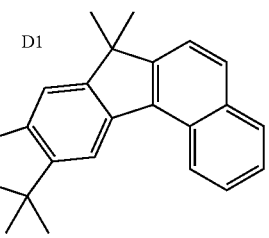
D2
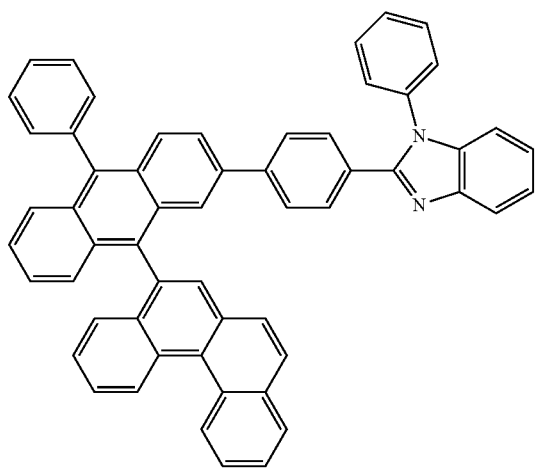 [SMILES: c1ccc(-c2c3ccccc3c(-c3cc4ccc5ccccc5c4c4ccccc34)c3cc(-c4ccc(-c5nc6ccccc6n5-c5ccccc5)cc4)ccc23)cc1]
ETM2

TABLE 1-continued

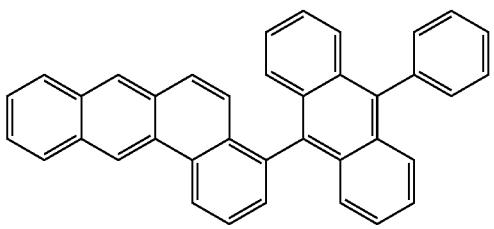 [SMILES: c1ccc(-c2c3ccccc3c(-c3cccc4c3ccc3cc5ccccc5cc34)c3ccccc23)cc1]

H1

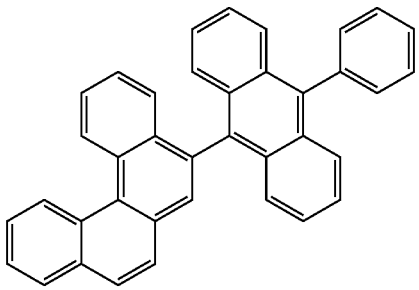 [SMILES: c1ccc(-c2c3ccccc3c(-c3cc4ccc5ccccc5c4c4ccccc34)c3ccccc23)cc1]

H2

TABLE 2

| Ex. | EML thickness | ETM thickness | Voltage for 1000 cd/m² | Efficiency at 1000 cd/m² | CIE x/y at 1000 cd/m² | Lifetime from 6000 cd/m² |
|---|---|---|---|---|---|---|
| 7 comp. | H1 + 5% of D1 30 nm | ETM 1 20 nm | 5.0 V | 8.6 cd/A | 0.14/0.19 | 400 h |
| 8 comp. | H1 + 1% of D2 30 nm | ETM 1 20 nm | 5.2 V | 6.2 cd/A | 0.15/0.11 | 110 h |
| 9 | H2 + 5% of D1 30 nm | ETM 1 110 nm | 5.1 V | 8.7 cd/A | 0.14/0.18 | 520 h |
| 10 | H2 + 1% of D2 30 nm | ETM 1 20 nm | 5.3 V | 6.1 cd/A | 0.15/0.09 | 160 h |
| 11 | H2 + 5% of D1 30 nm | ETM 2 110 nm | 4.9 V | 9.0 cd/A | 0.14/0.18 | 560 h |
| 12 | H2 + 1% of D2 30 nm | ETM 2 20 nm | 5.0 V | 6.4 cd/A | 0.15/0.09 | 190 h |

The invention claimed is:

1. A compound of formula (I)

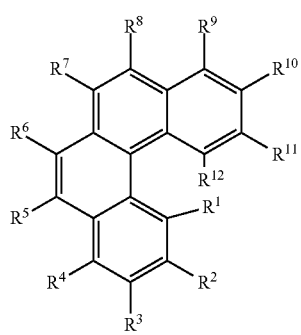

formula (I)

wherein $R^2$, $R^3$, $R^4$, $R^5$, $R^6$, $R^7$, $R^8$, $R^9$, $R^{10}$ and $R^{11}$ are selected, independently of one another, from the group consisting of Ar, $N(Ar)_2$, H, D, F, Cl, Br, CHO, $N(R^{13})_2$, $C(=O)Ar$, $P(=O)(Ar)_2$, $S(=O)Ar$, $S(=O)_2Ar$, $CR^{13}=CR^{13}Ar$, CN, $NO_2$, $Si(R^{13})_3$, $B(OR^{13})_2$, $OSO_2R^{13}$, straight-chain alkyl, alkenyl, alkoxy and thioalkoxy groups having 1 to 40 C atoms and branched, mono- or polycyclic alkyl, alkenyl, alkoxy and thioalkoxy groups having 3 to 40 C atoms, each of which are optionally substituted by one or more radicals $R^{13}$, where one or more non-adjacent $CH_2$ groups are optionally replaced by $R^{13}C=CR^{13}$, $C≡C$, $Si(R^{13})_2$, $Ge(R^{13})_2$, $Sn(R^{13})_2$, $C=O$, $C=S$, $C=Se$, $C=NR^{13}$, $P(=O)(R^{13})$, SO, $SO_2$, $NR^{13}$, O, S or $CONR^{13}$ and where one or more H atoms are optionally replaced by D, F, Cl, Br, I, CN or $NO_2$, and heteroaromatic ring systems having 5 to 40 aromatic ring atoms, which in each case are optionally substituted by one or more radicals $R^{13}$, and aryloxy or heteroaryloxy groups having 5 to 40 aromatic ring atoms, which are optionally substituted by one or more radicals $R^{13}$, and a combination of these systems;

with the proviso that at least one group of $R^2$, $R^3$, $R^4$, $R^5$, $R^6$, $R^7$, $R^8$, $R^9$, $R^{10}$ and $R^{11}$ is selected from the group consisting of Ar and $N(Ar)_2$;

Ar is on each occurrence, identically or differently, one or more unit(s) selected from the group consisting of naphthyl, anthracene, phenanthrene, 1,3,5-triazine, benzimidazole, phenothiazine, fluorene, carbazole, spirobifluorene, and combinations thereof, which are optionally substituted by one or more radicals $R^{13}$, where, in the case where two Ar are bonded to the same N or P atom, the two Ar may be linked to one another by a single covalent bond or a divalent group selected from the group consisting of $BR^{13}$, $C(R^{13})_2$, $Si(R^{13})_2$, $C=O$, $C=NR^{13}$, $C=C(R^{13})_2$, O, S, $S=O$, $SO_2$, $NR^{13}$, $PR^{13}$ and $P(=O)R^{13}$;

$R^1$ and $R^{12}$ are H or D atoms;

$R^{13}$ is identical or different on each occurrence and is selected from the group consisting of H, D, F, Cl, Br, I, CHO, $N(R^{14})_2$, CN, $NO_2$, $Si(R^{14})_3$, $B(OR^{14})2$, $OSO_2R^{14}$, straight-chain alkyl, alkenyl, alkoxy and thioalkoxy groups having 1 to 40 C atoms and branched, mono- or polycyclic alkyl, alkenyl, alkoxy and thioalkoxy groups having 3 to 40 C atoms, each of which are optionally substituted by one or more radicals $R^{14}$, where one or more non-adjacent $CH_2$ groups are optionally replaced by $R^{14}C=CR^{14}$, $C\equiv C$, $Si(R^{14})_2$, $Ge(R^{14})_2$, $Sn(R^{14})_2$, $C=O$, $C=S$, $C=Se$, $C=NR^{14}$, $P(=O)(R^{14})$, SO, $SO_2$, $NR^{14}$, O, S or $CONR^{14}$ and where one or more H atoms are optionally replaced by D, F, Cl, Br, I, CN or $NO_2$, and aromatic or heteroaromatic ring systems having 5 to 40 aromatic ring atoms, which in each case are optionally substituted by one or more radicals $R^{14}$, and aryloxy or heteroaryloxy groups having 5 to 40 aromatic ring atoms, which are optionally substituted by one or more radicals $R^{14}$, and a combination of these systems;

$R^{14}$ is identical or different on each occurrence and is selected from the group consisting of H and an aliphatic hydrocarbon radical having 1 to 20 carbon atoms, where one or more H atoms of the aliphatic hydrocarbon radical are optionally replaced by F.

2. The compound of claim 1, wherein the remaining groups of $R^2$ to $R^{11}$ are selected, independently of one another, from the group consisting of H, D, and a straight-chain $C_{1-9}$-alkyl group.

3. The compound of claim 1, wherein at least one group of $R^2$, $R^5$, $R^8$ and $R^{11}$ is selected from the group consisting of Ar and $N(Ar)_2$.

4. The compound of claim 1, wherein the compound of formula (I) is a compound of the following formula (II), formula (III), formula (IV), formula (V), or formula (VI):

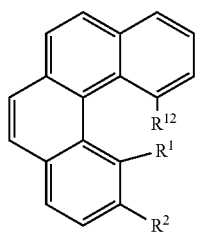

formula (II)

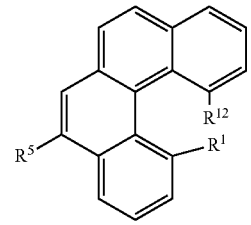

formula (III)

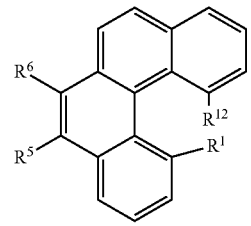

formula (IV)

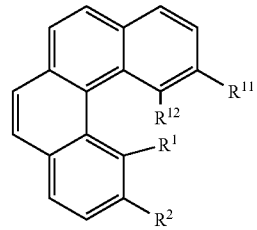

formula (V)

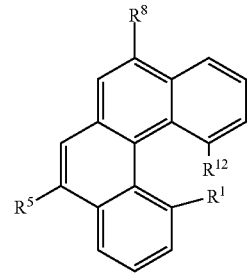

formula (VI)

wherein $R^2$, $R^5$, $R^8$ and $R^{11}$ are selected, independently of one another, from the group consisting of Ar and $N(Ar)_2$;

$R^6$ is a straight-chain alkyl group having 1 to 10 C atoms or a branched or cyclic alkyl group having 3 to 10 C atoms.

5. The compound of claim 1, wherein Ar is on each occurrence, identically or differently, one or more unit(s) selected from the group consisting of naphthyl, anthracene, phenanthrene, 1,3,5-triazine, benzimidazole, phenothiazine, fluorene, carbazole, spirobifluorene, and combinations thereof, which is optionally substituted by one or more radicals $R^{13}$; and wherein, in the case where two Ar are bonded to the same N atom, the two Ar are optionally linked to one another by a single covalent bond or a divalent group selected from the group consisting of $C(R^{13})_2$, $C=O$, O, S, $NR^{13}$ and $PR^{13}$.

6. The compound of claim 1, wherein the group Ar is selected from the groups of the formula (VII), formula (IX), formula (XI), or formula (XII), formula (VII)

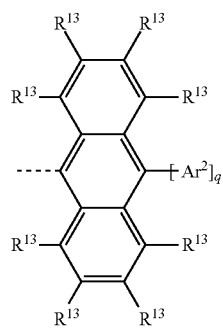

formula (IX)

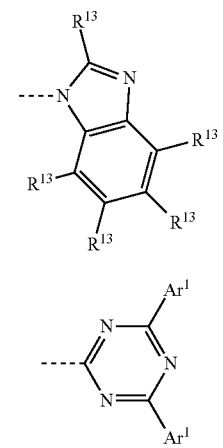

formula (XI)

formula (XII)

wherein the dashed bond denotes the link to the benzo[c]phenanthrene unit;

Ar$^1$ is an aryl or heteroaryl group having 5 to 16 aromatic ring atoms, optionally substituted by one or more radicals R$^{14}$;

Ar$^2$ is an aryl or heteroaryl group having 5 to 20 aromatic ring atoms which are optionally substituted by one or more radicals R$^{14}$;

q is 1.

7. The compound of claim 1, wherein R$^{13}$, identically or differently on each occurrence, is selected from the group consisting of H, a straight-chain alkyl or alkenyl group having 1 to 9 carbon atoms, a C$_{6-10}$-aryl group, and a 5- to 14-membered heteroaryl group, where one or more H atoms of the straight-chain alkyl or alkenyl group are optionally replaced by F.

8. The compound of claim 1, wherein R$^1$ and R$^{12}$ are H atoms.

9. A compound of formula (XV)

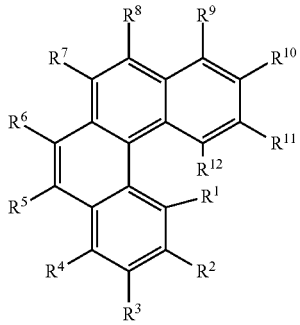

formula (XV)

wherein

R$^2$, R$^3$, R$^4$, R$^5$, R$^6$, R$^7$, R$^8$, R$^9$, R$^{10}$ and R$^{11}$
are selected, independently of one another, from the group consisting of Ar, N(Ar)$_2$, H, D, F, Cl, Br, I, CHO, N(R$^{13}$)$_2$, C(=O)Ar, P(=O)(Ar)$_2$, S(=O)Ar, S(=O)$_2$Ar, CR$^{13}$=CR$^{13}$Ar, CN, NO$_2$, Si(R$^{13}$)$_3$, B(OR$^{13}$)$_2$, OSO$_2$R$^{13}$, straight-chain alkyl, alkenyl, alkoxy and thioalkoxy groups having 1 to 40 C atoms and branched, mono- or polycyclic alkyl, alkenyl, alkoxy and thioalkoxy groups having 3 to 40 C atoms, each of which are optionally substituted by one or more radicals R$^{13}$, where one or more non-adjacent CH$_2$ groups are optionally replaced by R$^{13}$C=CR$^{13}$, C≡C, Si(R$^{13}$)$_2$, Ge(R$^{13}$)$_2$, Sn(R$^{13}$)$_2$, C=O, C=S, C=Se, C=NR$^{13}$, P(=O)(R$^{13}$), SO, SO$_2$, NR$^{13}$, O, S or CONR$^{13}$ and where one or more H atoms are optionally replaced by D, F, Cl, Br, I, CN or NO$_2$, and aromatic or heteroaromatic ring systems having 5 to 4 aromatic ring atoms, which in each case are optionally substituted by one or more radicals R$^{13}$, and aryloxy or heteroaryloxy groups having 5 to 40 aromatic ring atoms, which are optionally substituted by one or more radicals R$^{13}$, and a combination of these systems;

Ar is on each occurrence, identically or differently, an aromatic or heteroaromatic ring system having 5 to 40 aromatic ring atoms, which are optionally substituted by one or more radicals R$^{13}$, where, in the case where two Ar are bonded to the same N or P atom, the two Ar may be linked to one another by a single covalent bond or a divalent group selected from the group consisting of BR$^{13}$, C(R$^{13}$)$_2$, Si(R$^{13}$)$_2$, C=O, C=NR$^{13}$, C=C(R$^{13}$)$_2$, O, S, S=O, SO$_2$, NR$^{13}$, PR$^{13}$ and P(=O)R$^{13}$;

with the proviso that Ar, if it is bonded directly to the aromatic skeleton of the formula (I), is different from triarylamine;

R$^1$ and R$^{12}$
are H or D atoms;

R$^{13}$ is identical or different on each occurrence and is selected from the group consisting of H, D, F, Cl, Br, I, CHO, N(R$^{14}$)$_2$, CN, NO$_2$, Si(R$^{14}$)$_3$, B(OR$^{14}$)2, OSO$_2$R$^{14}$, straight-chain alkyl, alkenyl, alkoxy and thioalkoxy groups having 1 to 40 C atoms and branched, mono- or polycyclic alkyl, alkenyl, alkoxy and thioalkoxy groups having 3 to 40 C atoms, each of which are optionally substituted by one or more radicals R$^{14}$, where one or more non-adjacent CH$_2$ groups are optionally replaced by R$^{14}$C=CR$^{14}$, C≡C, Si(R$^{14}$)$_2$, Ge(R$^{14}$)$_2$, Sn(R$^{14}$)$_2$, C=O, C=S, C=Se, C=NR$^{14}$, $P(=O)(R^{14})$, SO, $SO_2$, $NR^{14}$, O, S or $CONR^{14}$ and where one or more H atoms are optionally replaced by D, F, Cl, Br, I, CN or $NO_2$, and aromatic or heteroaromatic ring systems having 5 to 40 aromatic ring atoms, which in each case are optionally substituted by one or more radicals $R^{14}$, and aryloxy or heteroaryloxy groups having 5 to 40 aromatic ring atoms, which are optionally substituted by one or more radicals $R^{14}$, and a combination of these systems; and $R^{14}$ is identical or different on each occurrence and is selected from the group consisting of H and an aliphatic hydrocarbon radical having 1 to 20 carbon atoms, where one or more H atoms of the aliphatic hydrocarbon radical are optionally replaced by F;

with the proviso that at least one of the radicals $R^2$, $R^3$, $R^4$, $R^5$, $R^6$, $R^7$, $R^8$, $R^9$, $R^{10}$ and $R^{11}$ is $B(OR^{13})_2$.

* * * * *